US011264105B2

(12) United States Patent
Yamabe et al.

(10) Patent No.: US 11,264,105 B2
(45) Date of Patent: Mar. 1, 2022

(54) SEMICONDUCTOR MEMORY DEVICE

(71) Applicant: Kioxia Corporation, Minato-ku (JP)

(72) Inventors: Kazuharu Yamabe, Yokkaichi (JP); Yoichi Minemura, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/993,509

(22) Filed: Aug. 14, 2020

(65) Prior Publication Data

US 2021/0280256 A1 Sep. 9, 2021

(30) Foreign Application Priority Data

Mar. 5, 2020 (JP) .............................. JP2020-037760

(51) Int. Cl.
*G11C 7/00* (2006.01)
*G11C 16/26* (2006.01)
*G11C 16/04* (2006.01)
*G11C 11/56* (2006.01)
*H01L 27/11582* (2017.01)

(52) U.S. Cl.
CPC .......... *G11C 16/26* (2013.01); *G11C 11/5671* (2013.01); *G11C 16/0483* (2013.01); *H01L 27/11582* (2013.01)

(58) Field of Classification Search
CPC ......... G11C 16/10; G11C 16/30; G11C 16/12; G11C 16/0483; H01L 27/115
USPC ....................................... 365/185.18, 185.24
See application file for complete search history.

(56) References Cited

U.S. PATENT DOCUMENTS

| 7,346,733 | B2 | 3/2008 | Kitamura |
| 7,372,730 | B2 | 5/2008 | Chen |
| 9,837,156 | B2* | 12/2017 | Seol ...................... G11C 16/10 |
| 10,235,294 | B1 | 3/2019 | Lu et al. |
| 2013/0117635 | A1* | 5/2013 | Ok ........................ G11C 29/021 714/773 |
| 2018/0247682 | A1* | 8/2018 | Gajapathy ................ G11C 7/12 |
| 2019/0348122 | A1* | 11/2019 | Ko ...................... G11C 16/0483 |

OTHER PUBLICATIONS

Wei Lin et al., "3X Endurance Enhancement by Advanced Signal Processor for 3D NAND Flash Memory", 2017 IEEE Information Theory Workshop—ITW 2017 Kaohsiung (3 pgs).

* cited by examiner

*Primary Examiner* — Son T Dinh
(74) *Attorney, Agent, or Firm* — Oblon, McClelland, Maier & Neustadt, L.L.P.

(57) ABSTRACT

According to one embodiment, a semiconductor memory device includes first and second memory cells, first and second word lines, and a bit line. The first and second memory cells are coupled to each other and adjacent to each other. When a state of the second memory cell is the first state or one of the states corresponding to a lower threshold voltage distribution than that of the first state, the first memory cell data is read in a first period during which a first voltage is applied to the second word line. And when the state of the second memory cell is the second state or one of the states corresponding to a higher threshold voltage distribution than the second state, the first memory cell data is read in a second period during which a second voltage higher than the first voltage is applied to the second word line.

20 Claims, 34 Drawing Sheets

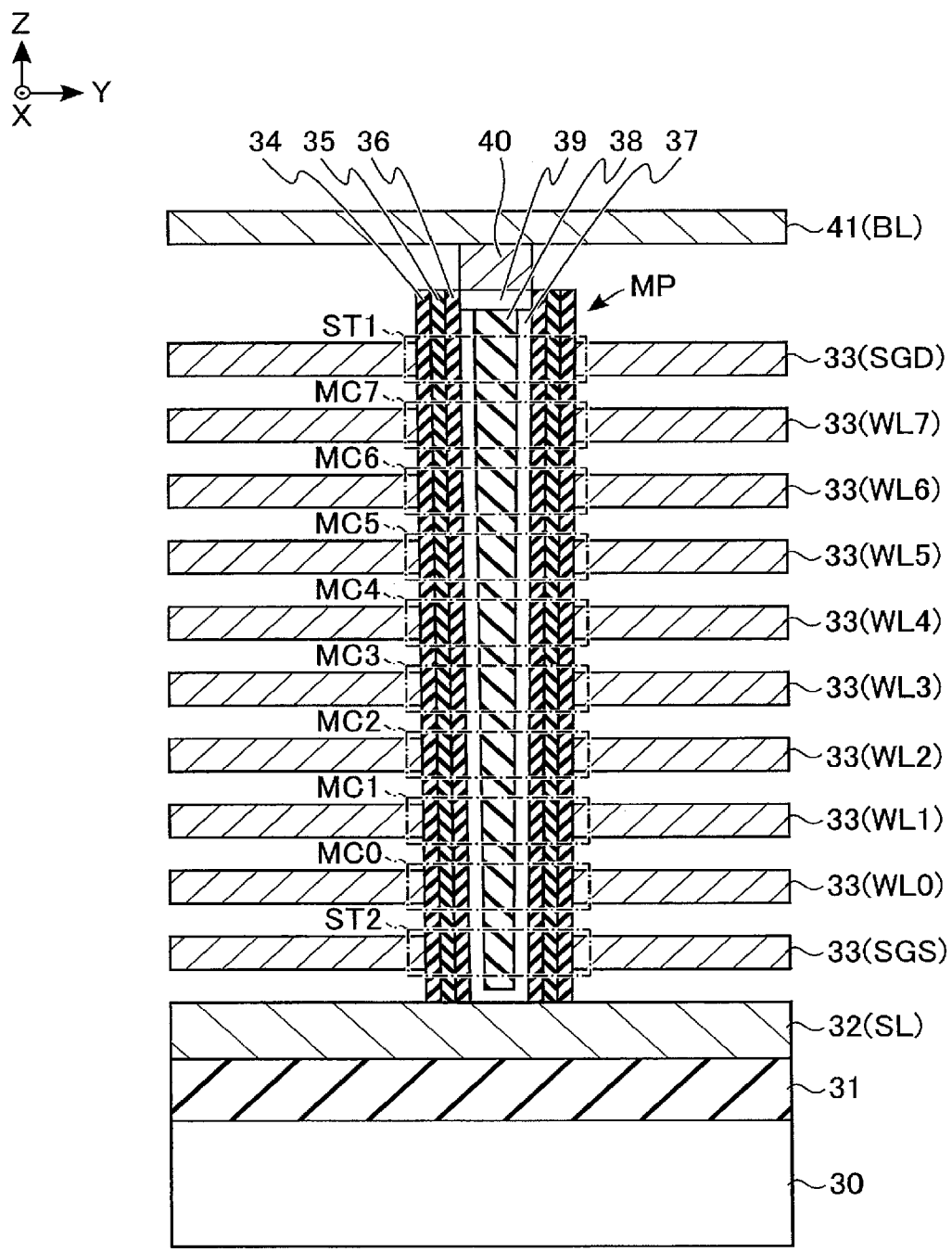
F I G. 3

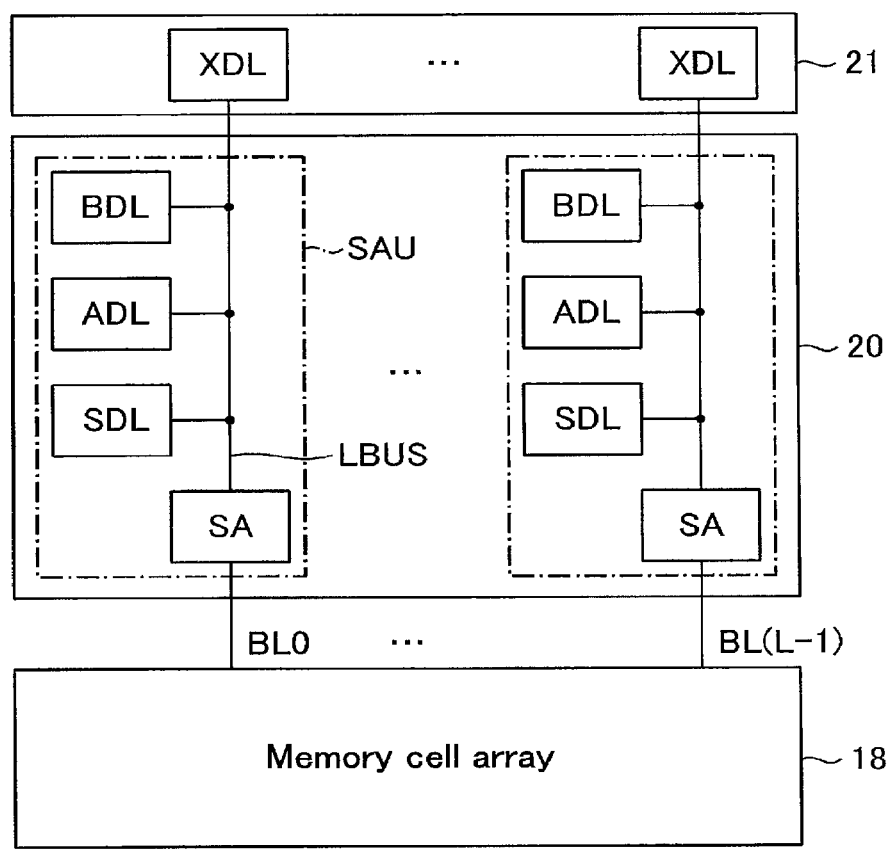
F I G. 4

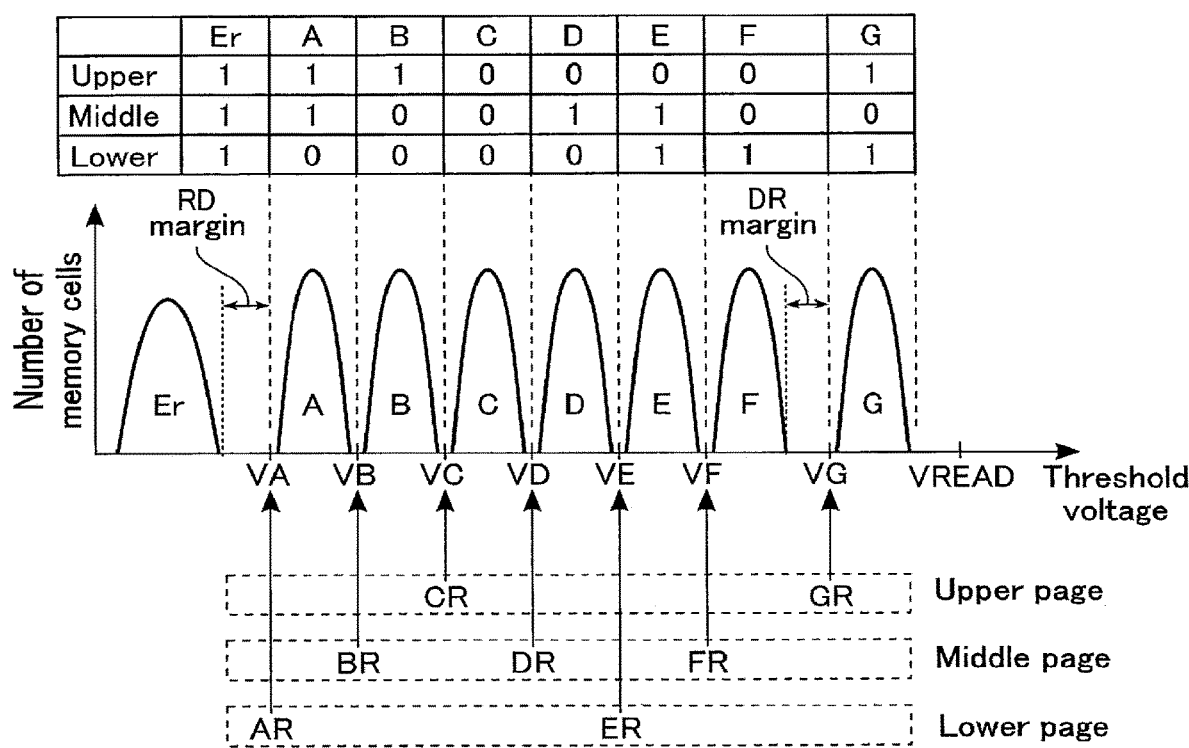
F I G. 6

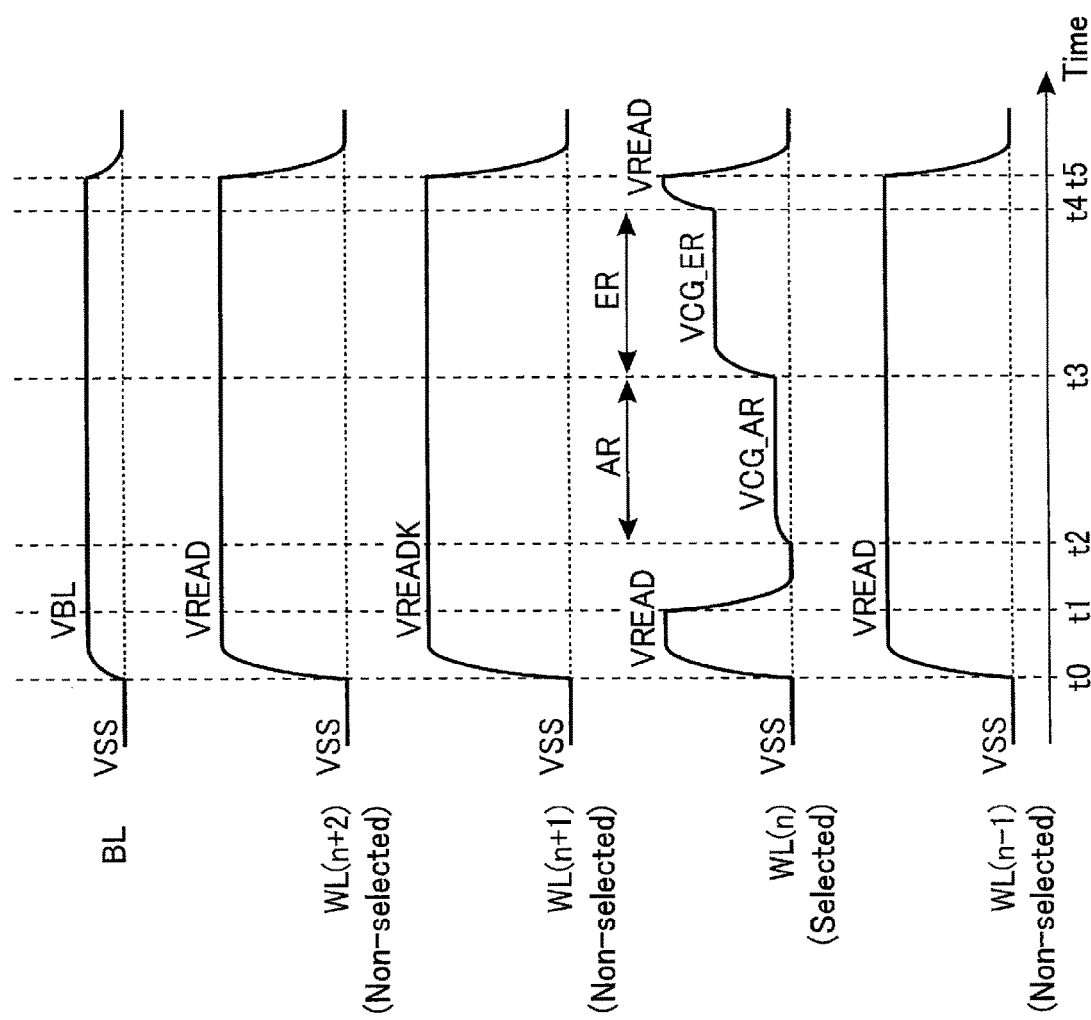
F I G. 11

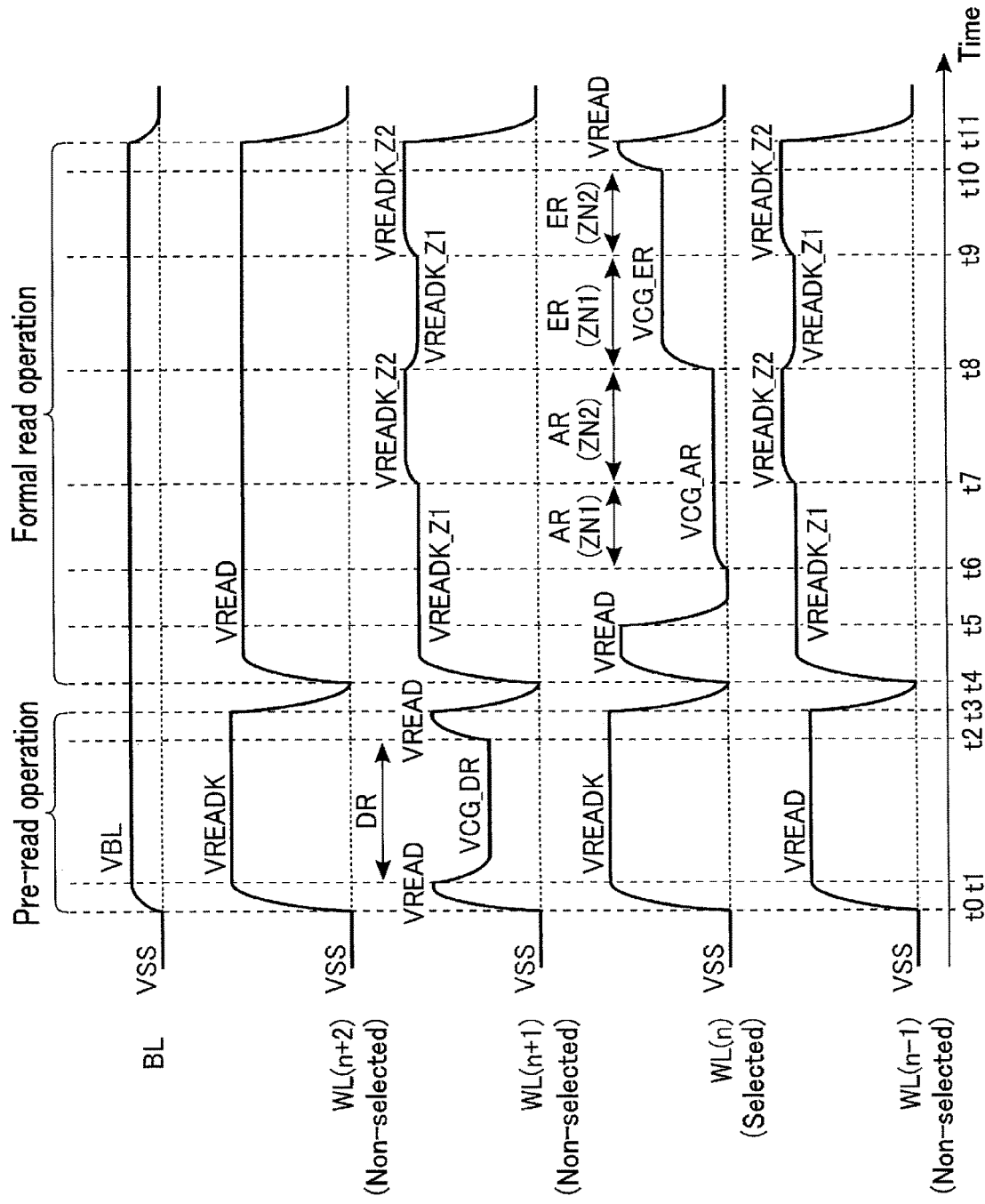
F I G. 13

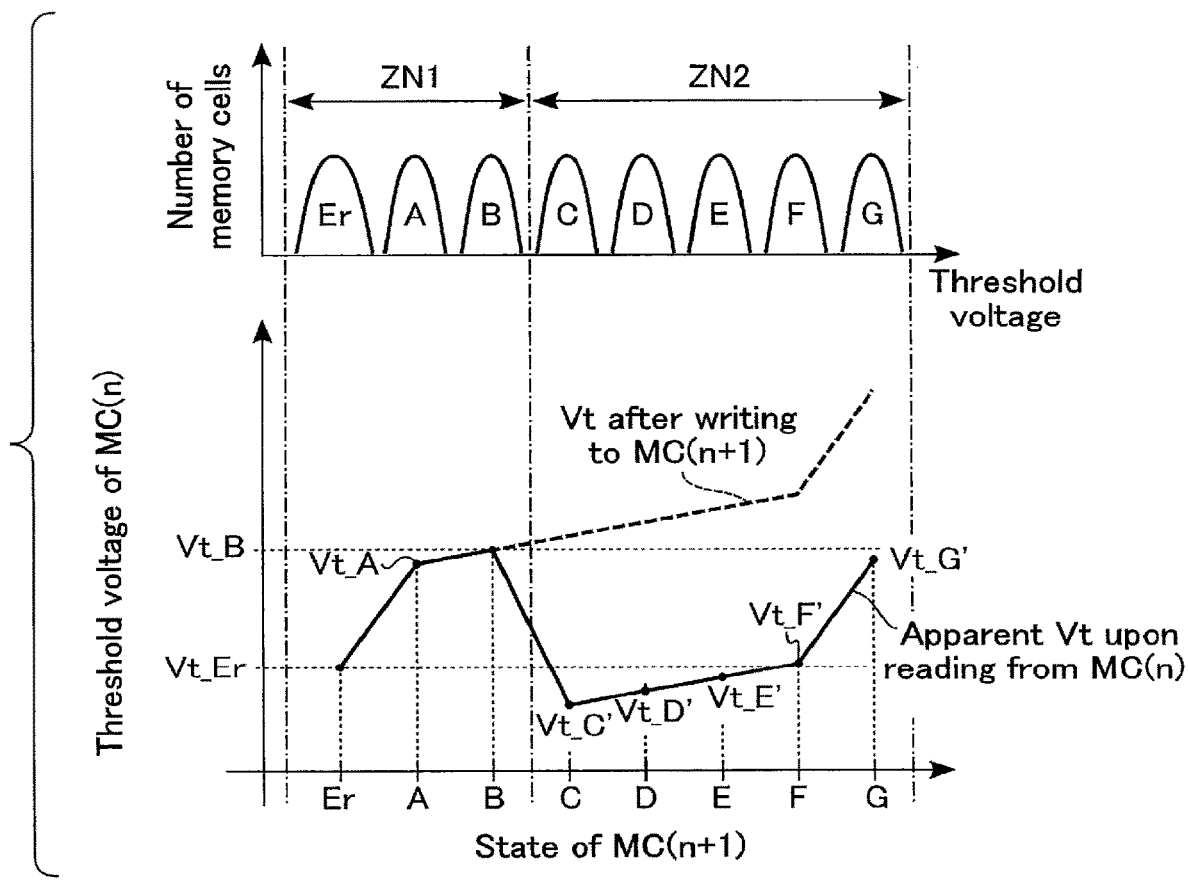
F I G. 15

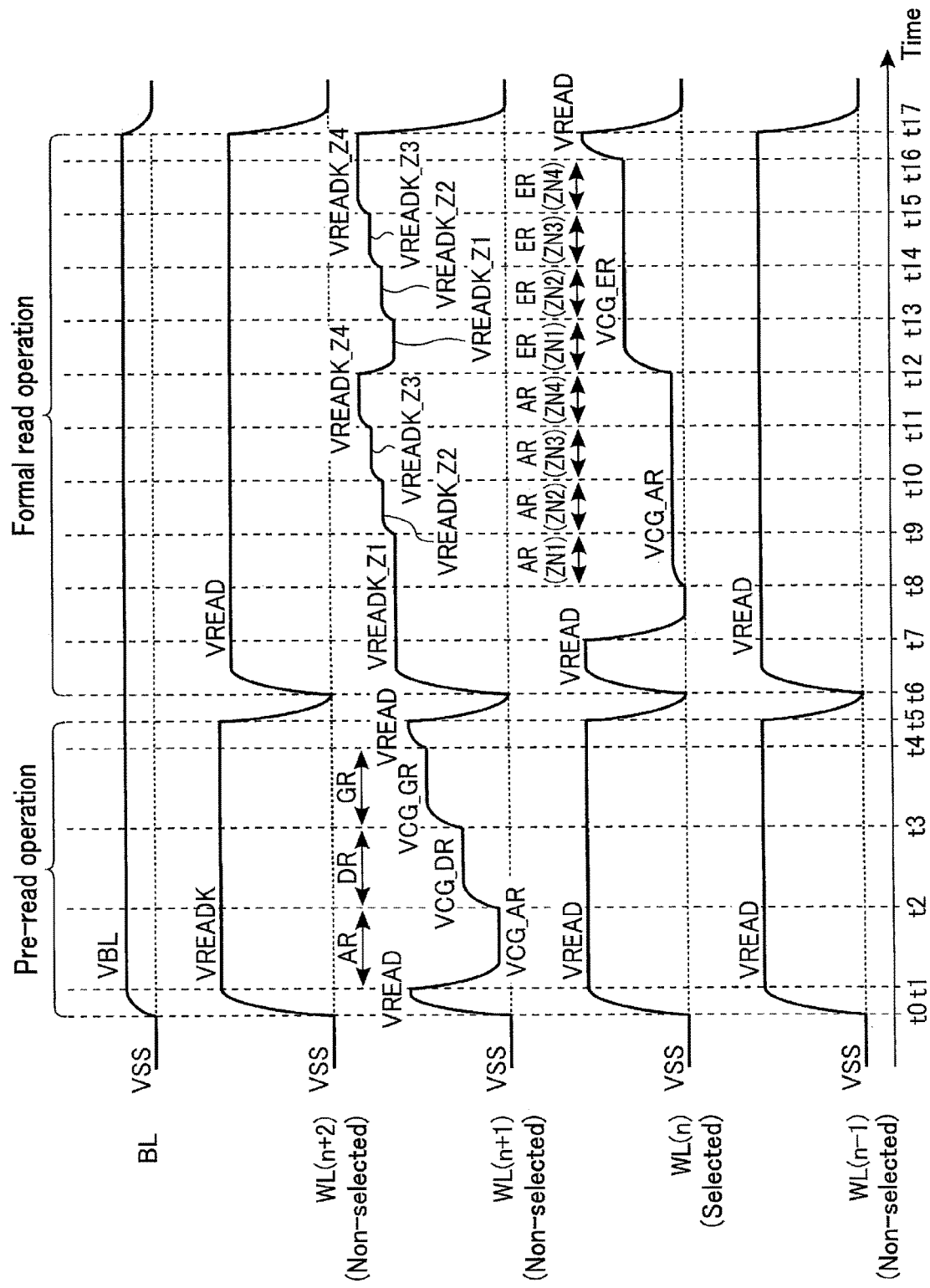
F I G. 20

SEMICONDUCTOR MEMORY DEVICE

CROSS-REFERENCE TO RELATED APPLICATIONS

This application is based upon and claims the benefit of priority from Japanese Patent Application No. 2020-037760, filed Mar. 5, 2020, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 3 is a cross-sectional view of the memory cell array included in the semiconductor memory device according to the first embodiment.

FIG. 4 is a block diagram of a data register and a sense amplifier included in the semiconductor memory device according to the first embodiment.

FIG. 6 is a threshold voltage distribution diagram of memory cell transistors included in the semiconductor memory device according to the first embodiment.

FIG. 11 is a timing chart showing voltages of interconnects during a normal read operation in the semiconductor memory device according to the first embodiment.

FIG. 13 is a timing chart showing voltages of interconnects during a DLA read operation in a semiconductor memory device according to a second embodiment.

FIG. 15 shows a relationship between a zone and an apparent threshold voltage of a memory cell transistor during a DLA read operation in a semiconductor memory device according to a first example of a fourth embodiment.

FIG. 20 is a timing chart showing voltages of interconnects during a DLA read operation in the semiconductor memory device according to the fifth embodiment.

DETAILED DESCRIPTION

In general, according to one embodiment, a semiconductor memory device includes: a first memory cell and a second memory cell capable of storing data corresponding to one of a plurality of states, and coupled to each other so as to be adjacent to each other; a first word line coupled to a gate of the first memory cell; a second word line coupled to a gate of the second memory cell; and a bit line coupled to a drain of the second memory cell. The plurality of states include: a first state; and a second state adjacent to the first state and corresponding to a higher threshold voltage distribution than that of the first state. In a read operation of the first memory cell, when a state of the second memory cell is the first state or one of the plurality of states corresponding to a lower threshold voltage distribution than that of the first state, data on the first memory cell is read in a first period during which a first voltage is applied to the second word line, and when the state of the second memory cell is the second state or one of the plurality of states corresponding to a higher threshold voltage distribution than the second state, data on the first memory cell is read in a second period during which a second voltage higher than the first voltage is applied to the second word line.

Hereinafter, embodiments will be described with reference to the accompanying drawings. In the description that follows, components having the same functions and configurations will be denoted by the same reference symbols. The embodiments to be described below are shown as an example of a device or a method for embodying the technical idea of the embodiments, and are not intended to limit the material, shape, structure, arrangement, etc. of components to those described below. The technical idea of the embodiments may be variously modified in the claims.

1. First Embodiment

A semiconductor memory device according to a first embodiment will be described. Hereinafter, a three-dimensional NAND-type flash memory in which memory cell transistors are three-dimensionally stacked on a semiconductor substrate will be described as an example of the semiconductor memory device.

1.1 Configuration 1.1.1 Overall Configuration of Semiconductor Memory Device

Figure 1:
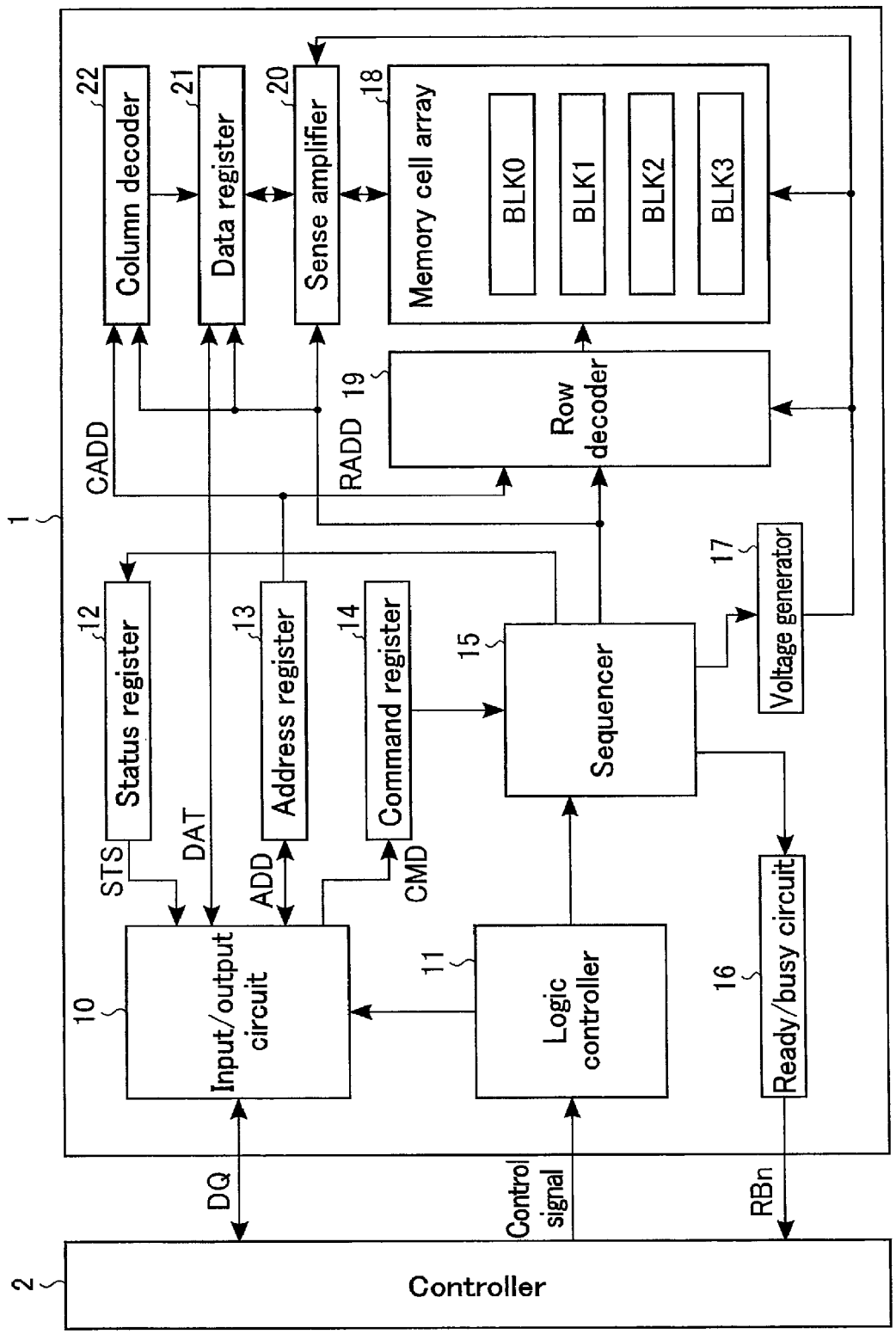
FIG. 1 is a block diagram showing an overall configuration of a semiconductor memory device according to a first embodiment.

An example of an overall configuration of a semiconductor memory device will be described with reference to FIG. 1. In FIG. 1, some of the couplings between the blocks are indicated by arrows; however, the couplings between the blocks are not limited to those shown in FIG. 1.

As illustrated in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input and output of a signal DQ to and from an external controller 2. The signal DQ includes, for example, data DAT, an address ADD, and a command CMD. More specifically, the input/output circuit 10 transmits the data DAT received from the external controller 2 to the data register 21, transmits the address ADD received from the external controller 2 to the address register 13, and transmits the command CMD received from the external controller 2 to the command register 14. The input/output circuit 10 also transmits status information STS received from the status register 12, the data DAT received from the data register 21, the address ADD received from the address register 13, etc. to the external controller 2.

The logic controller 11 receives various control signals from the external controller 2. The logic controller 11 controls the input/output circuit 10 and the sequencer 15 in accordance with the received control signal.

The status register 12 temporarily stores, for example, status information STS in a write operation, a read operation, and an erase operation, and notifies the external controller 2 as to whether or not the operation has been normally completed.

The address register 13 temporarily stores the received address ADD. The address register 13 transfers a row address RADD to the row decoder 19, and transfers a column address CADD to the column decoder 22.

The command register 14 temporarily stores the received command CMD, and transfers the command CMD to the sequencer 15.

The sequencer 15 controls the overall operation of the semiconductor memory device 1. More specifically, the sequencer 15 controls the status register 12, the ready/busy circuit 16, the voltage generator 17, the row decoder 19, the sense amplifier 20, the data register 21, the column decoder 22, etc. in accordance with the received command CMD, and performs a write operation, a read operation, an erase operation, etc.

The ready/busy circuit 16 transmits a ready/busy signal RBn to the external controller 2, in accordance with an operation status of the sequencer 15.

Under the control of the sequencer 15, the voltage generator 17 generates voltages required for the write, read and erase operations, and supplies the generated voltages to, for example, the memory cell array 18, the row decoder 19, the sense amplifier 20, etc. The row decoder 19 and the sense amplifier 20 apply voltages supplied from the voltage generator 17 to the memory cell array 18.

The memory cell array 18 includes a plurality of blocks BLK (four blocks BLK0 to BLK3 in the example of FIG. 1)

each including a plurality of nonvolatile memory cell transistors (also referred to as "memory cells" hereinafter) associated with the rows and columns. The memory cell array 18 will be described in detail later.

The row decoder 19 decodes a row address RADD. Based on the result of decoding, the row decoder 19 applies required voltages to the memory cell array 18.

In a read operation, the sense amplifier 20 senses data read from the memory cell array 18. The sense amplifier 20 transmits the read data to the data register 21. In a write operation, the sense amplifier 20 transmits write data to the memory cell array 18.

The data register 21 includes a plurality of latch circuits. The latch circuits temporarily store write data or read data.

In a write operation, a read operation, an erase operation, etc., the column decoder 22 decodes the column address CADD, and selects latch circuits in the data register 21, in accordance with the result of decoding.

1.1.2 Circuit Configuration of Memory Cell Array

Figure 2:
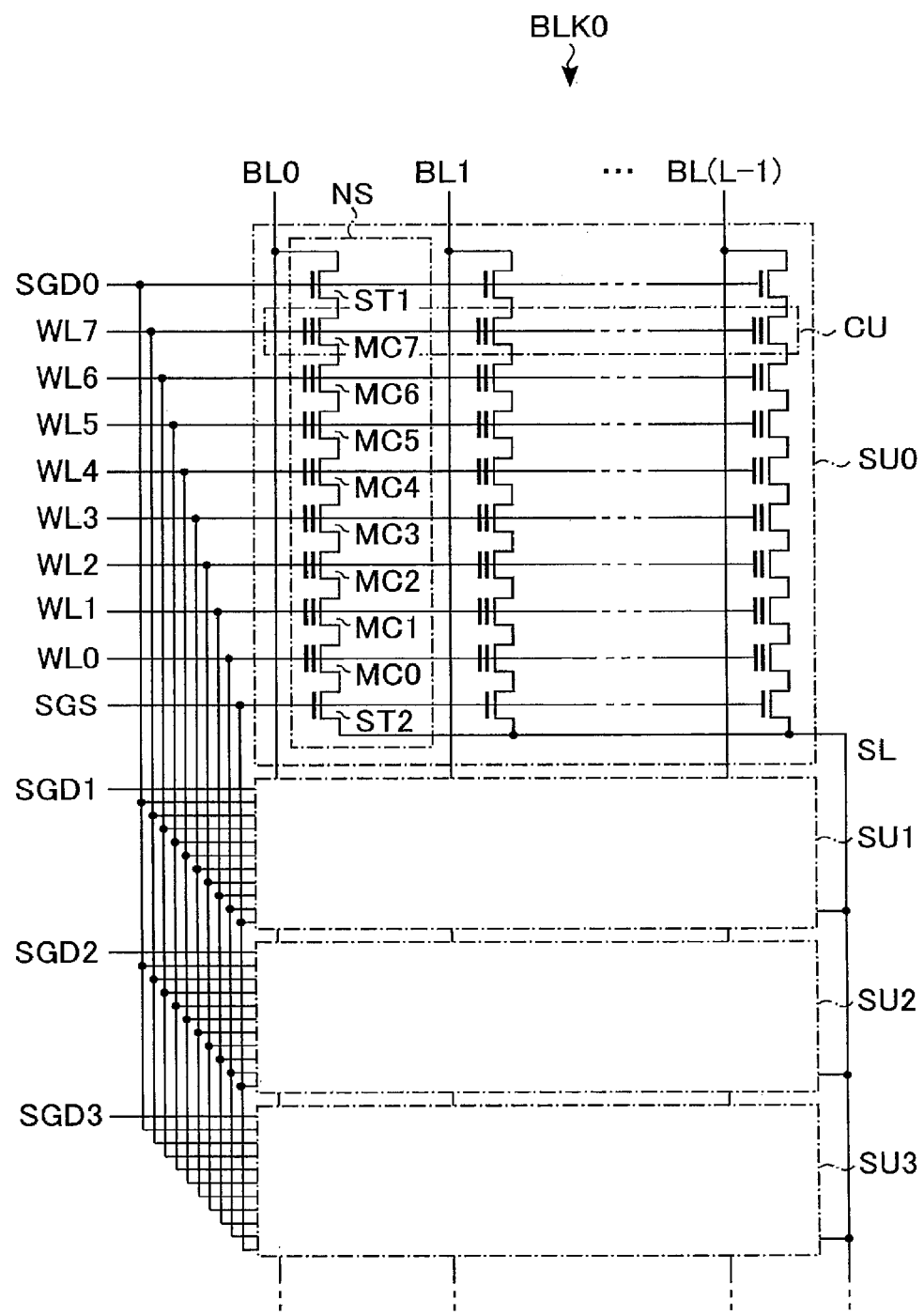
FIG. 2 is a circuit diagram of a memory cell array included in the semiconductor memory device according to the first embodiment.

Next, an example circuit configuration of the memory cell array 18 will be described with reference to FIG. 2. In the example of FIG. 2, a circuit diagram of a block BLK0 in the memory cell array 18 is shown. The other blocks BLK have the same configuration.

As shown in FIG. 2, each block BLK includes a plurality of string units SU. The number of string units SU in each block BLK may be designed to be any number. In the description that follows, a case will be described where a single block BLK includes four string units SU0 to SU3. Each of the string units SU includes a plurality of NAND strings NS.

Each NAND string NS includes a plurality of memory cell transistors MC and select transistors ST1 and ST2. In the description that follows, a case will be described where a single NAND string NS includes eight memory cell transistors MC0 to MC7.

Each memory cell transistor MC includes a control gate and a charge storage layer, and stores data in a non-volatile manner. The memory cell transistor MC may be of a MONOS type which uses an insulating layer as the charge storage layer, or of an FG type which uses a conductive layer as the charge storage layer. In the present embodiment, the MONOS type will be described as an example. The number of memory cell transistors MC included in each NAND string NS is not limited to a particular number, and may be 16, 32, 48, 64, 96, 128, etc. Furthermore, the number of select transistors ST1 and the number of select transistors ST2 included in each NAND string NS may be any number equal to or greater than one.

For example, eight memory cell transistors MC0 to MC7 are coupled in series between a source of the select transistor ST1 and a drain of the select transistor ST2. More specifically, the current paths of the memory cell transistors MC0 to MC7 are coupled in series. A drain of the memory cell transistor MC7 is coupled to a source of the select transistor ST1, and a source of the memory cell transistor MC0 is coupled to a drain of the select transistor ST2.

Gates of select transistors ST1 in each string unit SU are commonly coupled to a single select gate line SGD corresponding to the string unit SU. For example, gates of select transistors ST1 in the string unit SU0 are coupled to a single select gate line SGD0. Similarly, select transistors ST1 included in each of the string units SU1 to SU3 are respectively coupled to select gate lines SGD1 to SGD3. Gates of select transistors ST2 included in each of the string units SU0 to SU3 are commonly coupled to a select gate line SGS. Hereinafter, each of the select gate lines SGD0 to SGD3 will be referred to as a "select gate line SGD" when they are not distinguished from one another. A select gate line SGS may be provided for each string unit SU, similarly to the select gate line SGD.

Control gates of memory cell transistors MC0 to MC7 in a block BLK are commonly coupled to word lines WL0 to WL7, respectively. Hereinafter, each of the word lines WL0 to WL7 will be referred to as a "word line WL" when they are not distinguished from one another.

Drains of select transistors ST1 of NAND strings NS included in each string unit SU are respectively coupled to different bit lines BL0 to BL (L−1), where L is an integer equal to or greater than 2. Hereinafter, each of the bit lines BL0 to BL (L−1) will be referred to as a "bit line BL" when they are not distinguished from one another. Each bit line BL commonly couples NAND strings NS included in the respective string units SU of a plurality of blocks BLK. Moreover, sources of select transistors ST2 are commonly coupled to a source line SL. That is, a string unit SU is a group of NAND strings NS which are coupled to different bit lines BL and are coupled to the same select gate line SGD. A block BLK is a group of string units SU that share the same word line WL. The memory cell array 18 is a group of blocks BLK that share the same bit line BL.

A write operation and a read operation are collectively performed on memory cell transistors MC that are coupled to one of the word lines WL in a string unit SU. Hereinafter, a group of memory cell transistors MC that are collectively selected during a write operation and a read operation will be referred to as a "cell unit CU". A set of 1-bit data items written into or read from a single cell unit CU will be referred to as a "page".

1.1.3 Cross-sectional Configuration of Memory Cell Array

Next, a cross-sectional configuration of the memory cell array 18 will be described with reference to FIG. 3. The example of FIG. 3 shows a cross section of a single NAND string NS. In FIG. 3, interlayer insulating films are partly omitted.

As shown in FIG. 3, an insulating layer 31 is formed on a semiconductor substrate 30. The insulating layer 31 is formed using, for example, a silicon oxide film ($SiO_2$). In a region in which the insulating layer 31 is formed, namely, between the semiconductor substrate 30 and an interconnect layer 32, a circuit such as a row decoder 19 or a sense amplifier 20 may be provided.

On the insulating layer 31, an interconnect layer 32 which extends in an X direction that is approximately parallel to the semiconductor substrate 30 and a Y direction that intersects the X direction, and which functions as a source line SL, is formed. The interconnect layer 32 is configured of a conductive material using, for example, a semiconductor material to which an impurity is added, or a metal material.

Ten interconnect layers 33 that respectively function as a select gate line SGS, word lines WL0 to WL7, and a select gate line SGD, and that extend in the X direction are sequentially stacked above the interconnect layer 32, with an unillustrated interlayer insulating film interposed therebetween, as viewed in a Z direction that is approximately perpendicular to the semiconductor substrate 30.

The interconnect layer 33 is configured of a conductive material using, for example, a semiconductor material to which an impurity is added, or a metal material. The interconnect layer 33 is configured using, for example, a stacked structure of titanium nitride (TiN)/tungsten (W). During formation of W by, for example, chemical vapor deposition (CVD), TiN functions as a barrier layer for preventing a reaction between W and SiO$_2$, or as an adhesion layer for improving the adhesiveness of W.

A plurality of memory pillars MP that penetrate the ten interconnect layers 33 and reach, at their bottom surfaces, the interconnect layer 32 are formed. Each memory pillar MP corresponds to, for example, a NAND string NS. Each memory pillar MP includes a block insulating film 34, a charge storage layer 35, a tunnel insulating film 36, a semiconductor layer 37, a core layer 38, and a cap layer 39.

More specifically, holes corresponding to memory pillars MP are formed so as to penetrate the interconnect layers 33 and reach, at their bottom surfaces, the interconnect layer 32. A block insulating film 34, a charge storage layer 35, and a tunnel insulating film 36 are sequentially stacked on a side surface of each hole. A semiconductor layer 37 is formed in such a manner that its side surface is in contact with the tunnel insulating film 36 and its bottom surface is in contact with the interconnect layer 32. The semiconductor layer 37 is a region in which channels of the memory cell transistors MC and the select transistors ST1 and ST2 are to be formed. Accordingly, the semiconductor layer 37 functions as a signal line that couples current paths of the select transistor ST2, the memory cell transistors MC0 to MC7, and the select transistor ST1. A core layer 38 is provided in the semiconductor layer 37. A cap layer 39 is formed on the semiconductor layer 37 and the core layer 38, in such a manner that its side surface is in contact with the tunnel insulating film 36.

The block insulating film 34, the tunnel insulating film 36, and the core layer 38 are formed using, for example, SiO$_2$. The charge storage layer 35 is formed using, for example, silicon nitride (SiN). The semiconductor layer 37 and the cap layer 39 may be formed using, for example, polysilicon.

A contact plug 40 is formed on the cap layer 39. An interconnect layer 41 that functions as a bit line BL and that extends in the Y direction is formed on the contact plug 40. The contact plug 40 and the interconnect layer 41 are configured of a conductive material using, for example, a stacked structure of titanium (Ti)/TiN/W, or copper interconnects.

In the example of FIG. 3, a single interconnect layer 33 that functions as the select gate line SGD and a single interconnect layer 33 that functions as the select gate line SGS are provided; however, a plurality of them may be provided.

Each of the memory cell transistors MC0 to MC7 is configured of a memory pillar MP and eight interconnect layers 33 that respectively function as word lines WL0 to WL7. Similarly, each of the select transistors ST1 and ST2 is configured of a memory pillar MP and two interconnect layers 33 that respectively function as select gate lines SGD and SGS.

Hereinafter, memory cell transistors MC that are adjacent to each other in the Z direction in a NAND string NS will also be referred to as "neighboring memory cell transistors MC". For example, neighboring memory cell transistors MC of a memory cell transistor MC3 are memory cell transistors MC2 and MC4. Word lines WL that are adjacent to each other in the Z direction will also be referred to as "neighboring word lines WL".

1.1.4 Configuration of Data Register and Sense Amplifier

Figure 5:
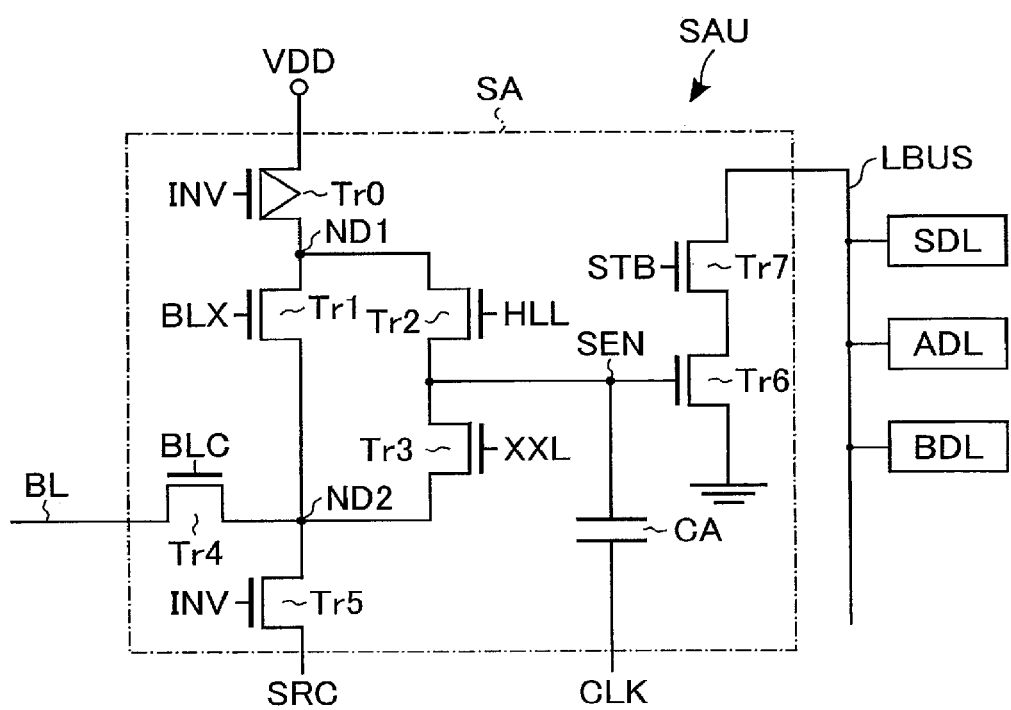
FIG. 5 is a circuit diagram of a sense amplifier circuit included in the semiconductor memory device according to the first embodiment.

Next, an example configuration of the data register 21 and the sense amplifier 20 will be described with reference to FIGS. 4 and 5. FIG. 4 is a block diagram of the data register 21 and the sense amplifier 20. FIG. 5 is a circuit diagram of a sense amplifier circuit SA.

As shown in FIG. 4, the sense amplifier 20 includes a plurality of sense amplifier units SALT provided for the respective bit lines BL. The data register 21 includes a plurality of latch circuits XDL provided for the respective sense amplifier units SALT.

The sense amplifier unit SALT includes, for example, a sense amplifier circuit SA, and latch circuits SDL, ADL, and BDL. The sense amplifier circuit SA and the latch circuits SDL, ADL, and BDL are commonly coupled to a corresponding latch circuit XDL via a bus LBUS. In other words, the latch circuit XDL, the sense amplifier circuit SA, and the latch circuits SDL, ADL, and BDL are coupled in such a manner that data can be transmitted and received therebetween via the bus LBUS.

In a read operation, the sense amplifier circuit SA senses data read from a corresponding bit line BL, and determines whether the read data is "0" or "1". In a write operation, the sense amplifier circuit SA applies a voltage to a corresponding bit line BL based on write data.

The latch circuits SDL, ADL, and BDL temporarily store the read data and the write data. The read data determined by the sense amplifier circuit SA in a read operation and the write data received from the latch circuit XDL in a write operation will be transferred to, for example, one of the latch circuits SDL, ADL, and BDL.

The latch circuit XDL is used for data input and output between the sense amplifier unit SAU and the input/output circuit 10. More specifically, write data received from the external controller 2 is transmitted to the latch circuit SDL, ADL, or BDL, or the sense amplifier circuit SA via the latch circuit XDL. Read data stored in the latch circuit SDL, ADL, or BDL or the sense amplifier circuit SA is transmitted to the external controller 2 via the latch circuit XDL.

The configuration of the sense amplifier unit SAU is not limited to the above-described one, and may be variously modified. The number of latch circuits included in each sense amplifier unit SAU may be designed based on the number of bits of data stored in a single memory cell transistor MC.

Next, a configuration of the sense amplifier circuit SA will be described. In the present embodiment, a sense amplifier circuit SA of a current-sense type which senses a current flowing through a bit line BL will be described as an example. As shown in FIG. 5, the sense amplifier circuit SA includes, for example, transistors Tr0 to Tr7 and a capacitor element CA. The transistor Tr0 is, for example, a P-type MOS transistor. Each of the transistors Tr1 to Tr7 is an N-type MOS transistor.

A source of the transistor Tr0 is coupled to a power source line. A drain of the transistor Tr0 is coupled to a node ND1. A gate of the transistor Tr0 is coupled to, for example, a node INV in the latch circuit SDL.

A drain of the transistor Tr1 is coupled to the node ND1. A source of the transistor Tr1 is coupled to a node ND2. A control signal BLX is input to a gate of the transistor Tr1.

A drain of the transistor Tr2 is coupled to the node ND1. A source of the transistor Tr2 is coupled to a node SEN. A control signal HLL is input to a gate of the transistor Tr2.

A drain of the transistor Tr3 is coupled to the node SEN. A source of the transistor Tr3 is coupled to the node ND2. A control signal XXL is input to a gate of the transistor Tr3.

A drain of the transistor Tr4 is coupled to the node ND2. A control signal BLC is input to a gate of the transistor Tr4. A source of the transistor Tr4 is coupled to a corresponding bit line BL. The transistor Tr4 functions as a clamp transistor that clamps the voltage of the bit line BL in response to the control signal BLC.

A drain of the transistor Tr5 is coupled to the node ND2. A source of the transistor Tr5 is coupled to a node SRC. A gate of the transistor Tr5 is coupled to, for example, the node INV in the latch circuit SDL.

A source of the transistor Tr6 is grounded. A gate of the transistor Tr6 is coupled to the node SEN. The transistor Tr6 functions as a sense transistor that senses the voltage of the node SEN.

A drain of the transistor Tr7 is coupled to a bus LBUS. A source of the transistor Tr7 is coupled to a drain of the transistor Tr6. A control signal STB is input to a gate of the transistor Tr7.

One of the electrodes of the capacitor element CA is coupled to anode SEN. A clock CLK is input to the other electrode of the capacitor element CA.

In the circuit configuration of the sense amplifier unit SAU described above, a power supply voltage VDD, for example, is applied to a power supply line that is coupled to a source of the transistor Tr0. A ground voltage VSS, for example, is applied to a node SRC. The control signals BLX, HLL, XXL, BLC, and STB, and the clock CLK are generated by, for example, the sequencer 15. At a timing when, for example, the control signal STB is asserted, the sense amplifier circuit SA determines data read to the bit line BL.

Next, an operation of the sense amplifier circuit SA in a read operation will be briefly described. Upon reading, the node INV is brought to a low ("L") level, and the transistor Tr0 is switched to an on state. The bit line BL is precharged via the transistors Tr1 and Tr4. The transistor Tr2 is also switched to the on state, and the node SEN is charged.

Subsequently, the transistor Tr2 is switched to an off state, and the transistor Tr3 is switched to the on state. In this case, when the corresponding memory cell transistor MC is in the on state, the potential of the node SEN decreases, and the transistor Tr6 is switched to the off state. On the other hand, when the corresponding memory cell transistor MC is in the off state, the potential of the node SEN maintains a high ("H") level, causing the transistor Tr6 to be switched to the on state.

Thereafter, the signal STB is brought to the H level and the transistor Tr7 is switched to the on state, and a potential corresponding to the on/off determination of the transistor Tr6 is read to the bus LBUS, and is stored in, for example, the latch circuit SDL.

1.2 Threshold Voltage Distributions of Memory Cell Transistors

Next, threshold voltage distributions that may be observed in memory cell transistors MC will be described with reference to FIG. 6. FIG. 6 is a diagram showing a relationship between threshold voltage distributions of memory cell transistors MC and data allocation. In the present embodiment, a case will be described where each memory cell transistor MC is a triple-level cell (TLC) capable of storing eight values (i.e., three bits) of data. However, data that can be stored in the memory cell transistor MC is not limited to eight values. In the present embodiment, it is only required that the memory cell transistor MC be capable of storing four or more values (i.e., two or more bits) of data.

As shown in FIG. 6, the threshold voltage of each memory cell transistor MC takes a value that falls within, for example, one of eight discrete distributions. The eight distributions will be respectively referred to as, in ascending order of threshold voltage, an "Er state", an "A state", a "B state", a "C state", a "D state", an "E state", an "F state", and a "G state".

The Er state corresponds to, for example, a data erase state. The A to G states correspond to states in which charge is injected into the charge storage layer and data is written. Let us assume that, in a write operation, verify voltages corresponding to the respective threshold voltage distributions are VA to VG. In this case, the values of these voltages satisfy the relation of VA<VB<VC<VD<VE<VF<VG<VREAD. The voltage VREAD is a voltage that is applied to a non-selected word line WL in a read operation. The memory cell transistor MC is switched to the on state upon application of the voltage VREAD to its gate, regardless of data stored therein.

More specifically, a threshold voltage that falls within the Er state is less than the voltage VA. A threshold voltage that falls within the A state is equal to or higher than the voltage VA, and less than the voltage VB. A threshold voltage that falls within the B state is equal to or higher than the voltage VB, and less than the voltage VC. A threshold voltage that falls within the C state is equal to or higher than the voltage VC, and less than the voltage VD. A threshold voltage that falls within the D state is equal to or higher than the voltage VD, and less than the voltage VE. A threshold voltage that falls within the E state is equal to or higher than the voltage VE, and less than the voltage VF. A threshold voltage that falls within the F state is equal to or higher than the voltage VF, and less than the voltage VG. A threshold voltage that falls within the G state is equal to or higher than the voltage VG, and less than the voltage VREAD.

Setting values for the verify voltages and setting values for the read voltages corresponding to the respective states may be either identical to or different from each other. To simplify the description, a case will be described where the setting values for the verify voltages and the setting values for the read voltages are the same.

Hereinafter, A-state to G-state read operations will be respectively referred to as read operations AR, BR, CR, DR, ER, FR, and GR. In a read operation AR, it is determined whether or not the threshold voltage of the memory cell transistor MC is less than the voltage VA. In a read operation BR, it is determined whether or not the threshold voltage of the memory cell transistor MC is less than the voltage VB. In a read operation CR, it is determined whether or not the threshold voltage of the memory cell transistor MC is less than the voltage VC. The same applies to the other read operations.

The threshold voltage of a memory cell transistor MC fluctuates according to, for example, a read disturb, data retention, or the presence or absence of the effects of a write operation to a memory cell transistor MC that is coupled to a neighboring word line WL (hereinafter referred to as "neighboring word line interference"). Read disturb is, for example, a phenomenon in which an injection of charge into the charge storage layer during a read operation causes the threshold voltage of the memory cell transistor MC to shift to the higher-voltage side. The data retention is, for example, a phenomenon in which an extraction of charge from the charge storage layer causes the threshold voltage of the memory cell transistor MC to shift to the lower-voltage side. The neighboring word line interference will be described in detail later.

In the example of FIG. 6, a margin corresponding to an increase in the Er-state threshold voltage due to a read disturb (hereinafter also referred to as an "RD margin") is provided between the Er-state threshold voltage distribution and the A-state threshold voltage distribution. Also, a margin corresponding to a decrease in the G-state threshold voltage due to data retention (hereinafter also referred to as a "DR margin") is provided between the F-state threshold voltage distribution and the G-state threshold voltage distribution. The amount of the RD margin and the DR margin (the amount of voltages) may be freely designed. For example, the RD margin and the DR margin need not be provided. In the present embodiment, an RD margin corresponding to the Er state whose threshold voltage varies widely due to a read disturb is provided between the Er state and the A state. However, when the A-state threshold voltage varies widely due to a read disturb, an RD margin may also be provided between the A state and the B state. Similarly, a DR margin may be provided between, for example, the E state distribution and the F state distribution.

As described above, each memory cell transistor MC falls within one of the eight threshold voltage distributions, thereby taking one of the eight states. By assigning these states to "000" to "111" in the binary system, each memory cell transistor MC is capable of storing three bits of data. The three bits of data will be respectively referred to as a "lower bit", a "middle bit", and an "upper bit". A set of lower bits that are collectively written into (or read from) a cell unit CU is referred to as a "lower page", a set of middle bits that are collectively written into (or read from) a cell unit CU will be referred to as a "middle page", and a set of upper bits that are collectively written into (or read from) a cell unit CU will be referred to as an "upper page".

In the example of FIG. 6, data is allocated to the upper bit, the middle bit, and the lower bit of each of the memory cell transistors MC that belong to the threshold voltage distributions.

Er state: "111" data
A state: "110" data
B state: "100" data
C state: "000" data
D state: "010" data
E state: "011" data
F state: "001" data
G state: "101" data When data allocated in the above manner is read, the lower bit is determined by read operations AR and ER. The middle bit is determined by read operations BR, DR, and FR. The upper bit is determined by read operations CR and GR. That is, the values of the lower bit, the middle bit, and the upper bit are determined by two read operations, three read operations, and two read operations, respectively. Hereinafter, such data allocation will be referred to as "2-3-2 coding". The data allocation to the Er to G states is not limited to "2-3-2 coding".

1.3 Read Operation

Next, a read operation will be described. In the description that follows, a memory cell transistor MC and a word line WL that are selected in a read operation (hereinafter also referred to as a "select memory cell transistor MC" and a "select word line WL", respectively) will be respectively referred to as a memory cell transistor MC(n) and a word line WL(n), using a variable n (where n is an integer from 0 to 7 in the example of FIG. 2). More specifically, when the memory cell transistor MC3 is a read target, for example, the variable n is 3. A neighboring memory cell transistor MC4 and a neighboring word line WL4 will also be referred to as a "memory cell transistor MC(n+1)" and a "word line WL(n+1)", respectively. Similarly, a neighboring memory cell transistor MC2 and a neighboring word line WL2 will also be referred to as a "memory cell transistor MC(n−1)" and a "word line WL(n−1)".

A read operation in the present embodiment includes a normal read operation and a Direct Look Ahead (DLA) read operation, which takes into account the neighboring word line interference.

The normal read operation is executed when the neighboring word line interference need not be taken into account. More specifically, when data is not written into a neighboring memory cell transistor MC(n+1) during a read operation of a memory cell transistor MC(n), a normal read operation is executed.

A DLA read operation of the present embodiment is executed when neighboring word line interference, data retention, read disturb, etc. is taken into account. More specifically, if data has been written into a neighboring memory cell transistor MC(n+1) before a read operation of a memory cell transistor MC(n), a DLA read operation is executed. In a DLA read operation, read conditions for a memory cell transistor MC(n) are set based on data written into a neighboring memory cell transistor MC(n+1). A DLA read operation includes a pre-read operation and a formal read operation.

A pre-read operation is executed before a formal-read operation is executed in a DLA read operation. A pre-read operation is an operation of reading data from a neighboring memory cell transistor MC(n+1) when the memory cell transistor MC(n) is a read target. In other words, a pre-read operation is an operation of reading data from a neighboring memory cell transistor MC(n+1) that is coupled to a word line WL(n) from which data is to be actually read and a word line WL(n+1) adjacent thereto on a drain side (bit line side).

The formal read operation is an operation of reading data from a memory cell transistor MC(n) that is coupled to a word line WL(n) using read conditions based on data on the neighboring memory cell transistor MC(n+1).

1.3.1 Shift of Threshold Voltage Due to Neighboring Word Line Interference

Figure 7:
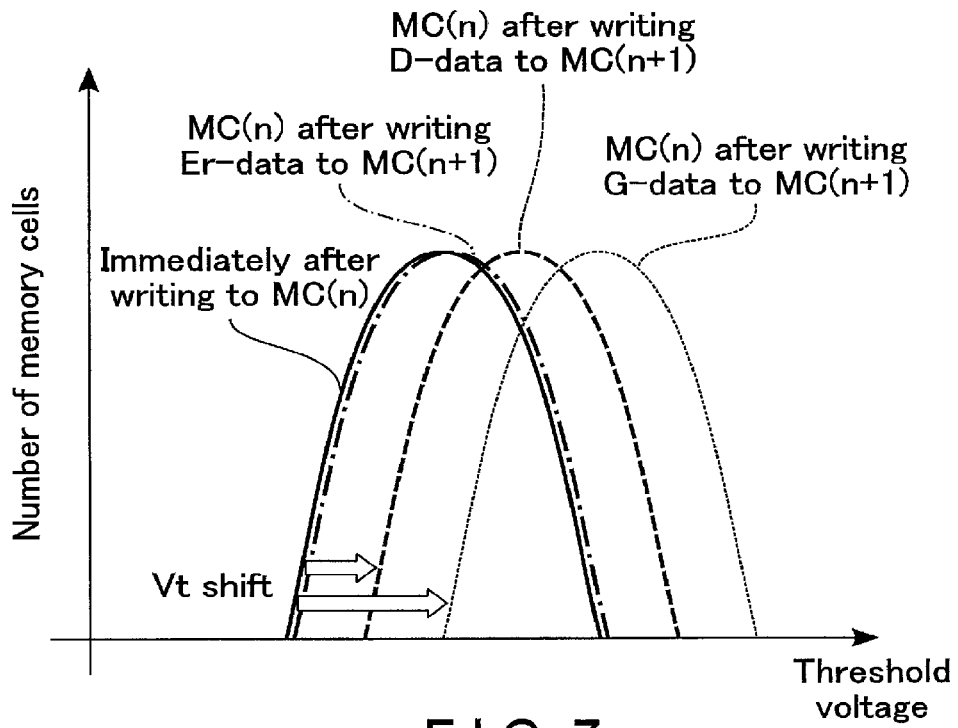
FIG. 7 illustrates effects of neighboring word line interference to a memory cell transistor included in the semiconductor memory device according to the first embodiment.
Figure 8:
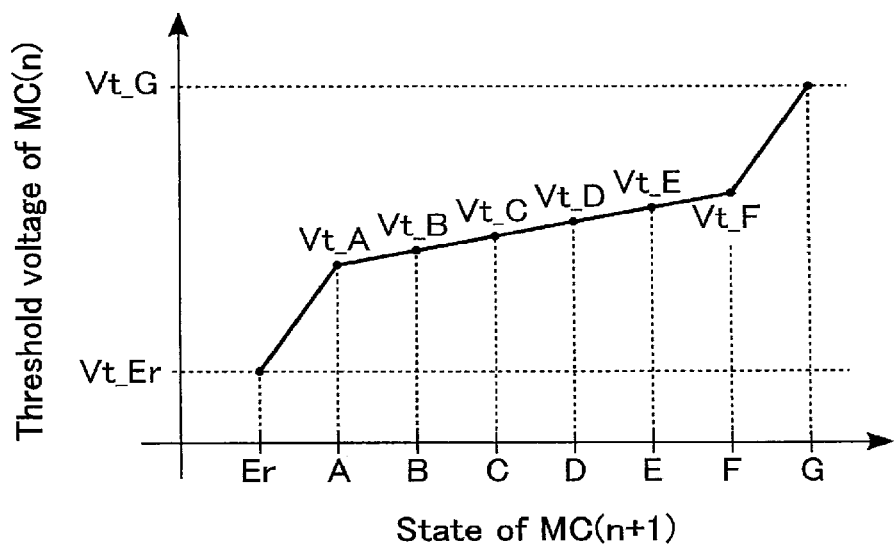
FIG. 8 is a graph illustrating a threshold voltage shift, due to neighboring word line interference, of a memory cell transistor included in the semiconductor memory device according to the first embodiment.

Next, an example of a shift of a threshold voltage due to neighboring word line interference will be described with reference to FIGS. 7 and 8. FIG. 7 shows threshold voltage distributions of a memory cell transistor MC(n) immediately after a write operation to the memory cell transistor MC(n), and threshold voltage distributions of the memory cell transistor MC(n) after a write operation to a neighboring memory cell transistor MC(n+1), when attention is focused on a single state. FIG. 7 shows a case where Er-state, D-state, and G-state data are written into the neighboring memory cell transistor MC(n+1). FIG. 8 is a graph showing a relationship between a median value of threshold voltages of a memory cell transistor MC(n) that are shifted by neighboring word line interference and a state of a neighboring memory cell transistor MC(n+1).

As shown in FIG. 7, a threshold voltage distribution of a single state of the memory cell transistor MC(n) immediately after a write operation is shown by a bold solid line. When, for example, Er-state data is written into the neighboring memory cell transistor MC(n+1) (as shown by the dashed-dotted line in FIG. 7), the memory cell transistor MC(n) is hardly affected by the neighboring word line interference. Accordingly, the threshold voltage of the memory cell transistor MC(n) hardly changes. When, for example, D-state data is written into the neighboring memory cell transistor MC(n+1) (as shown by the bold dashed line in FIG. 7), charge is also injected into the vicinity of the charge storage layer of the memory cell transistor MC(n) in a write operation in which the word line WL(n+1) is selected. Because of such effects, namely, of neighboring word line interference, the threshold voltage distribution of the memory cell transistor MC(n) is shifted to the higher-voltage side (hereinafter also referred to as a "Vt shift"). In other words, the threshold voltage of the memory cell transistor MC(n) increases. In addition, when G-state data is written into the neighboring memory cell transistor MC(n+1) (as shown by the thin dashed line in FIG. 7), since the effects of the neighboring word line interference are the strongest, the threshold voltage distribution of the memory cell transistor MC(n) is shifted to the higher-voltage side, compared to when D-state data is written into the memory cell transistor MC(n+1).

As shown in FIG. 8, because of the neighboring word line interference, the threshold voltage of the memory cell transistor MC(n) has a tendency to increase as the state of the neighboring memory cell transistor MC(n+1) comes closer to the G state, away from the Er state. In other words, the threshold voltage of the memory cell transistor MC(n) has a tendency to increase as the threshold voltage of the memory cell transistor MC(n+1) increases, because of the neighboring word line interference.

In the example of FIG. 8, a difference between the threshold voltage of the memory cell transistor MC(n) when the memory cell transistor MC(n+1) belongs to the Er state and the threshold voltage of the memory cell transistor MC(n) when the memory cell transistor MC(n+1) belongs to the A state is relatively large, because of the setting of the RD margin. Similarly, a difference between the threshold voltage of the memory cell transistor MC(n) when the memory cell transistor MC(n+1) belongs to the F state and the threshold voltage of the memory cell transistor MC(n) when the memory cell transistor MC(n+1) belongs to the G state is relatively large, because of the setting of the DR margin.

Let us assume, for example, that the threshold voltage of the memory cell transistor MC(n) when the memory cell transistor MC(n+1) belongs to the Er state will be referred to as "Vt_Er". Let us assume that the threshold voltage of the memory cell transistor MC(n) when the memory cell transistor MC(n+1) belongs to the A state is "Vt_A". Let us assume that the threshold voltage of the memory cell transistor MC(n) when the memory cell transistor MC(n+1) belongs to the B state is "Vt_B". Let us assume that the threshold voltage of the memory cell transistor MC(n) when the memory cell transistor MC(n+1) belongs to the C state will be referred to as "Vt_C". Let us assume that the threshold voltage of the memory cell transistor MC(n) when the memory cell transistor MC(n+1) belongs to the D state is Vt_D. Let us assume that the threshold voltage of the memory cell transistor MC(n) when the memory cell transistor MC(n+1) belongs to the E state is Vt_E. Let us assume that the threshold voltage of the memory cell transistor MC(n) when the memory cell transistor MC(n+1) belongs to the F state is "Vt_F". Let us assume that the threshold voltage of the memory cell transistor MC(n) when the memory cell transistor MC(n+1) belongs to the G state is Vt_G. In this case, the above-described threshold voltages satisfy the relation of Vt_Er<Vt_A<Vt_B<Vt_C<Vt_D<Vt_E<Vt_F<Vt_G. Accordingly, a variation in threshold voltage of the memory cell transistor MC(n) due to the neighboring word line interference is expressed by (Vt_G)−(Vt_Er).

1.3.2 DLA Read Operation

Figure 9:
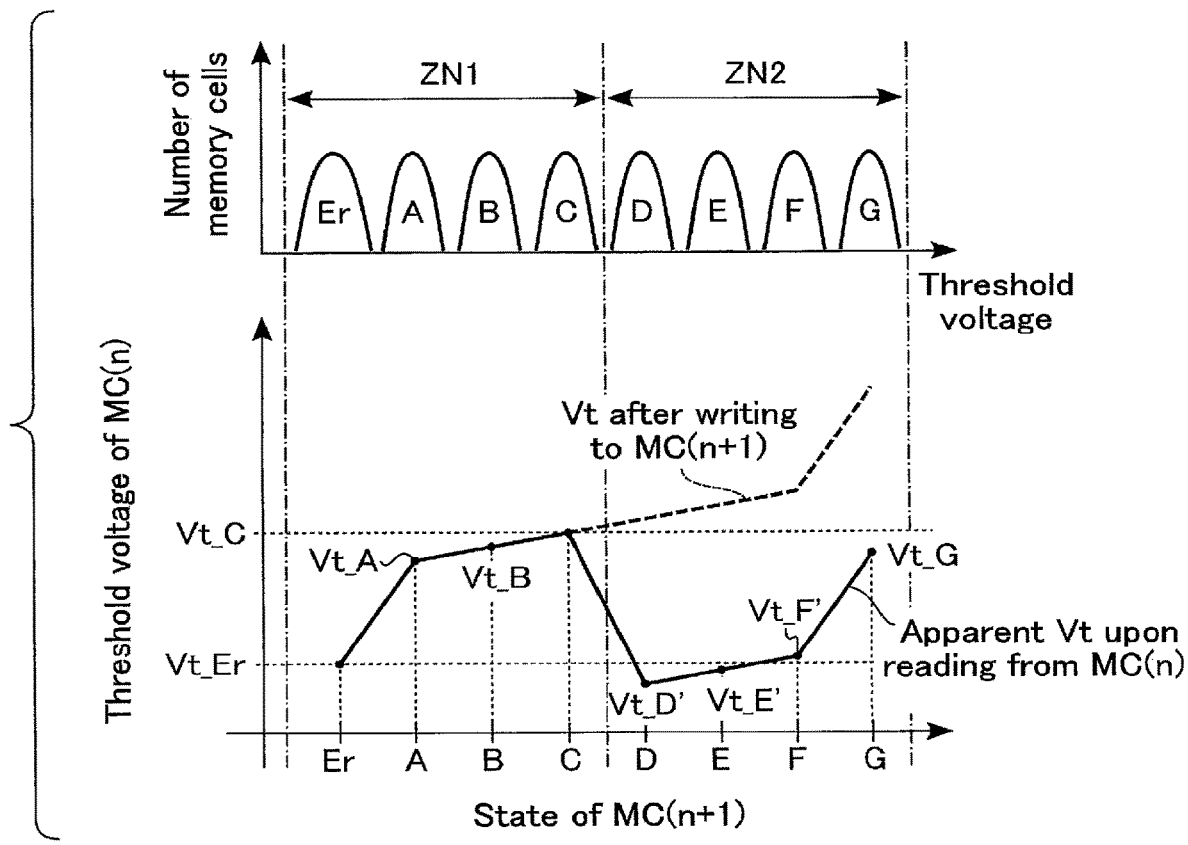
FIG. 9 shows a relationship between a zone and an apparent threshold voltage of a memory cell transistor during a DLA (Direct Look Ahead) read operation in the semiconductor memory device according to the first embodiment.

Next, a DLA read operation will be described with reference to FIG. 9. FIG. 9 shows a relationship between a zone ZN and an apparent threshold voltage of a memory cell transistor MC(n) in a DLA read operation.

If, for example, the read conditions are changed, a current (also referred to as a "cell current") that flows through a channel of the memory cell transistor MC from the node SEN via the bit line BL in the sense amplifier circuit SA changes. This results in variations in the results of sensing by the sense amplifier circuit SA, namely, the on/off determination of the memory cell transistor MC to be a read target. That is, if the read conditions are changed, the lower limit value of a read voltage at which the memory cell transistor MC is determined to be in the on state (also referred to as "determined to be on") fluctuates. Accordingly, if the read conditions are changed, the threshold voltage of the memory cell transistor MC(n) apparently fluctuates. More specifically, the rate at which the potential of the node SEN decreases increases, for example, as the cell current increases. Accordingly, the transistor Tr6 is determined to be in the on state at a lower read voltage. Consequently, the threshold voltage of the memory cell transistor MC(n) apparently decreases. The apparent threshold voltage of the memory cell transistor MC(n) corresponding to the memory cell transistor MC(n+1) in each state corresponds to a lower limit value of a read voltage at which the memory cell transistor MC(n) is determined to be on by the sense amplifier circuit SA.

Because of the effects of the neighboring word line interference, the threshold voltage of a memory cell transistor MC(n) to be a read target is shifted according to the state of the memory cell transistor MC(n+1). Accordingly, in the present embodiment, the memory cell transistor MC(n) is grouped into two zones ZN according to the state of the memory cell transistor MC(n+1). By applying read conditions that differ according to the zone, the shift amount of the apparent threshold voltage of the memory cell transistor MC(n) is decreased. That is, read conditions are changed in such a manner that the fluctuation of the lower limit value of a read voltage at which the memory cell transistor MC(n) is determined to be in the on state becomes low.

As shown in FIG. 9, in the present embodiment, a memory cell transistor MC(n) whose neighboring memory cell transistor MC(n+1) belongs to the Er state, the A state, the B state, or the C state is included in a zone ZN1. A memory cell transistor MC(n) whose neighboring memory cell transistor MC(n+1) belongs to either the D state, the E state, the F state, or the G state is included in a zone ZN2. As shown by the dashed line in FIG. 9, the memory cell transistor MC(n) in the zone ZN2 immediately after data is written into the memory cell transistor MC(n+1) has a high threshold voltage Vt, compared to that in the zone ZN1. Accordingly, in a DLA read operation, read conditions are set in such a manner that the apparent threshold voltage Vt of the memory cell transistor MC(n) is lower than the threshold voltage Vt after data is written into the memory cell transistor MC(n+1) when data of a memory cell transistor MC(n) in the zone ZN2 is read. Details of the read conditions will be described later.

Let us assume that apparent threshold voltages of memory cell transistors MC(n) in the zone ZN2 corresponding to memory cell transistors MC(n+1) that belong to the D state, the E state, the F state, and the G state are "Vt_D'", "Vt_E'", "Vt_F'", and "Vt_G'", respectively. In this case, the threshold voltages Vt_D and Vt_D' satisfy the relation of Vt_D'<Vt_D. The threshold voltages Vt_E and Vt_E' satisfy the relation of Vt_E' Vt_E. The threshold voltages Vt_F and Vt_F' satisfy the relation of Vt_F'<Vt_F. The threshold voltages Vt_G and Vt_G' satisfy the relation of Vt_G'<Vt_G. The threshold voltages Vt_D', Vt_E', Vt_F', and Vt_G' satisfy the relations of Vt_D'<Vt_E'<Vt_F'<Vt_G'. Also, in the present embodiment, read conditions for the zone ZN2 are set in such a manner that the lowest threshold voltage Vt_D' in the zone ZN2 takes a value lower than that of the lowest threshold voltage Vt_Er in the zone ZN1, and the highest threshold voltage Vt_G' in the zone ZN2 takes a value lower than that of the highest threshold voltage Vt_C in the zone ZN1, taking into account fluctuations in threshold voltage due to a read disturb and data retention.

That is, read conditions are set in such a manner that the threshold voltages Vt_Er and Vt_G do not become the lower limit and the upper limit, respectively, of threshold voltage variations of the memory cell transistors MC.

In other words, when the memory cell transistor MC(n) belongs to one of the states, the lower limit value (namely, the threshold voltage) of a read voltage at which the memory cell transistor MC(n) is determined to be on by the sense amplifier circuit SA becomes the highest in the memory cell transistor MC(n) whose neighboring memory cell transistor MC(n+1) belongs to the C state, and becomes the lowest in the memory cell transistor MC(n) whose neighboring memory cell transistor MC(n+1) belongs to the D state. The lower limit value of a read voltage at which the memory cell transistor MC(n) is determined to be on is lower in the memory cell transistor MC(n) whose neighboring memory cell transistor MC(n+1) belongs to the D state, than in the memory cell transistor MC(n) whose neighboring memory cell transistor MC(n+1) belongs to the Er state. In addition, the lower limit value of a read voltage at which the memory cell transistor MC(n) is determined to be on is lower in the memory cell transistor MC(n) whose neighboring memory cell transistor MC(n+1) belongs to the G state, than in the memory cell transistor MC(n) whose neighboring memory cell transistor MC(n+1) belongs to the C state.

That is, the lower limit value of a read voltage of a memory cell transistor MC(n) whose neighboring memory cell transistor MC(n+1) belongs to the D state is lower than a lower limit value of a read voltage of a memory cell transistor MC(n) whose neighboring memory cell transistor MC(n+1) belongs to the Er state. The lower limit value of a read voltage of a memory cell transistor MC(n) whose neighboring memory cell transistor MC(n+1) belongs to the G state is lower than a lower limit value of a read voltage of a memory cell transistor MC(n) whose neighboring memory cell transistor MC(n+1) belongs to the C state.

Hereinafter, the apparent threshold voltage of the lowest-voltage state in each zone ZN other than the zone ZN1 in a DLA read operation will also be referred to as a "reference point". The read conditions for each zone ZN may be set based on, for example, the reference point.

1.3.3 Overall Flow of Read Operation

Figure 10:
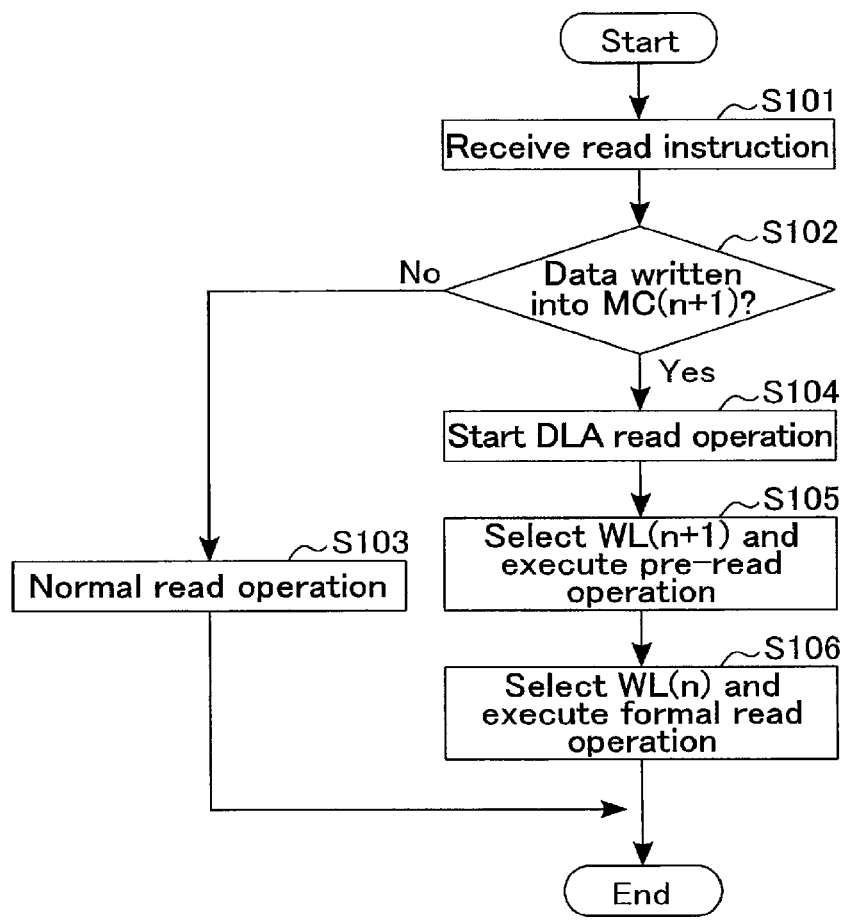
FIG. 10 is a flowchart showing a read operation of the semiconductor memory device according to the first embodiment.

Next, an overall flow of a read operation will be described with reference to FIG. 10. FIG. 10 is a flowchart of a read operation.

As shown in FIG. 10, upon receiving a read instruction from the external controller 2 (step S101), the semiconductor memory device 1 confirms whether or not data has been written into a memory cell transistor MC(n) to be a read target and its neighboring memory cell transistor MC(n+1) (step S102).

When data has not been written into the memory cell transistor MC(n+1) (step S102_No), the sequencer 15 executes a normal read operation (step S103).

When data has been written into the memory cell transistor MC(n+1) (step S102_Yes), the sequencer 15 starts a DLA read operation (step S104).

The sequencer 15 selects a word line WL(n+1) and executes a pre-read operation (step S105). The sequencer 15 saves the results of the pre-read operation in, for example, the data register 21.

Subsequently, the sequencer 15 selects a word line WL(n) and executes a formal read operation (step S106). More specifically, the sequencer 15 separates the memory cell transistors MC(n) into a plurality of zones, based on the results of the pre-read operation. Thereafter, the sequencer 15 applies read conditions that differ according to the zone, and executes a formal read operation.

1.3.4 Voltages of Bit Line and Word Lines in Normal Read Operation

Next, voltages of a bit line BL and word lines WL in a normal read operation will be described with reference to FIG. 11. FIG. 11 is a timing chart showing voltages of a bit line BL and word lines WL(n−1), WL(n), WL(n+1), and WL(n+2) in a normal read operation. In the example of FIG. 11, a case is shown where the lower page is read. In accordance with the lower page, an A-state read operation AR and an E-state read operation ER are executed.

As shown in FIG. 11, the sense amplifier 20 applies a voltage VBL to the bit line BL at time t0. The row decoder 19 applies a voltage VREAD to the selected word line WL(n) and the non-selected word lines WL(n−1) and WL(n+2). The row decoder 19 applies a voltage VREADK to a neighboring non-selected word line WL(n+1). The voltage VREADK is a voltage higher than the voltage VREAD. Similarly, the row decoder 19 applies the voltage VREAD to other unillustrated non-selected word lines WL. In the example of FIG. 11, a case is shown where the voltage VREADK is applied to the neighboring word line WL(n+1); however, the voltage VREADK may be similarly applied to another neighboring word line WL(n−1). Hereinafter, an operation of applying a voltage VREAD or a voltage VREADK to each the word line WL in the selected block BLK prior to application of a read voltage to the selected word line WL will be referred to as a "kick operation". The kick operation may be introduced as, for example, a countermeasure against the phenomenon in which the voltage of a word line WL fluctuates after a read operation, under the effects of a capacitive coupling between the word line WL and a channel of the memory cell transistor MC. The kick operation may be omitted.

At time t1, the row decoder 19 applies a ground voltage VSS to the selected word line WL(n).

At time t2, the row decoder 19 applies a read voltage VCG_AR (e.g., voltage VA) to the selected word line WL(n) in response to an A-state read operation AR. During the period from time t2 to time t3, the sense amplifier 20 executes an A-state read operation AR. More specifically, the select transistor ST1 of the selected string unit SU in the selected block BLK is in the on state. Also, the select transistor ST1 of the non-selected string unit SU is in the off state. Moreover, the select transistor ST2 is in the on state. In this state, the sense amplifier circuit SA of the sense amplifier 20 senses a current flowing from the bit line BL to the source line SL.

At time t3, the row decoder 19 applies a read voltage VCG_ER (e.g., voltage VE) to a selected word line WL(n) in response to an E-state read operation ER. During the period from time t3 to time t4, the sense amplifier 20 executes an E-state read operation ER.

At time t4, the row decoder 19 applies the voltage VREAD to the selected word line WL(n). Thereby, a channel of the memory pillar MP is discharged.

At time t5, a refresh operation is performed. The sense amplifier 20 applies the voltage VSS to the bit line BL. The row decoder 19 applies the voltage VSS to the selected word line WL(n) and the non-selected word lines WL(n−1), WL(n+1) and WL(n+2).

1.3.5 Voltages of Bit Line and Word Lines in DLA Read Operation

Figure 12:
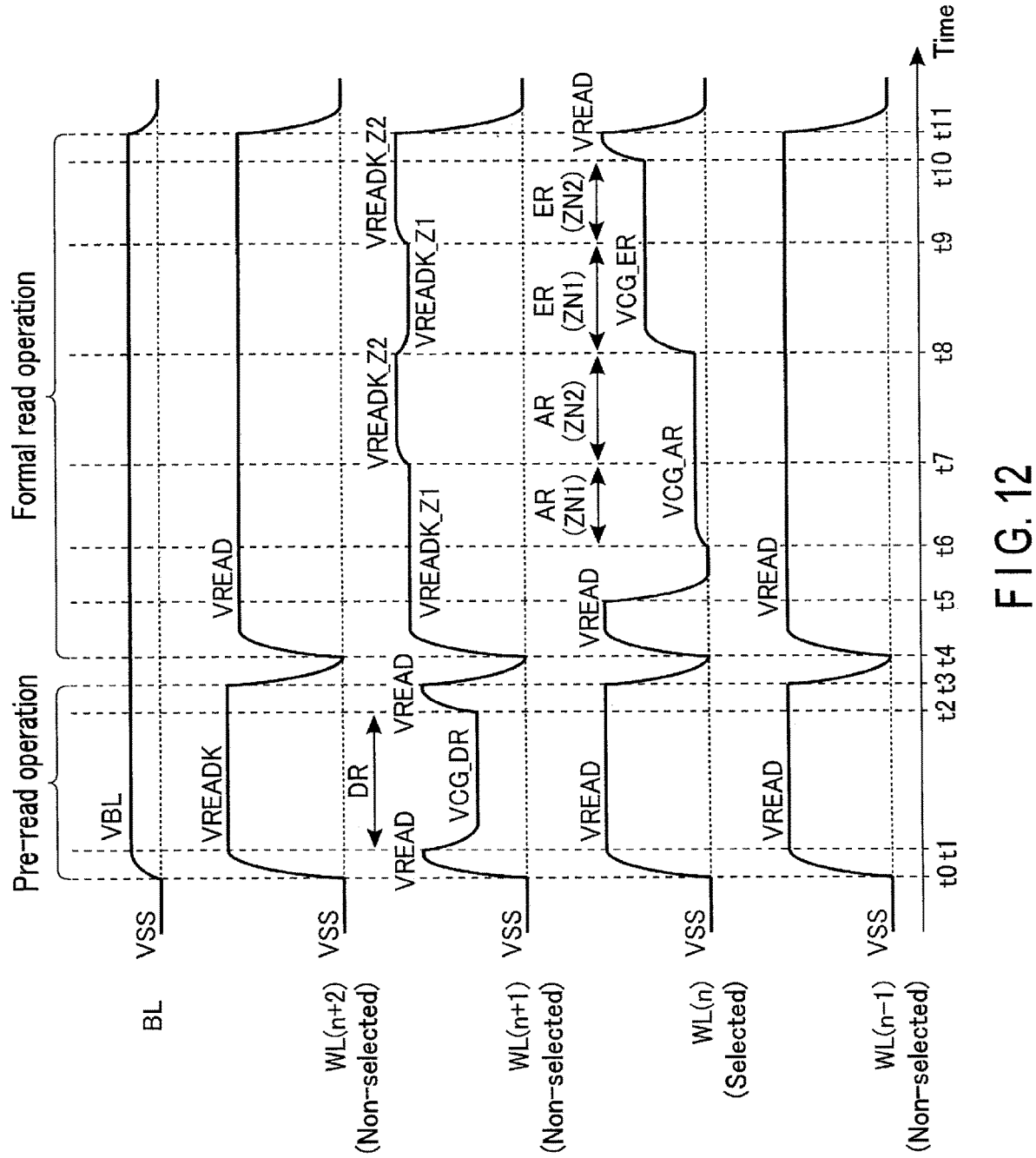
FIG. 12 is a timing chart showing voltages of interconnects during a DLA read operation in the semiconductor memory device according to the first embodiment.

Next, voltages of a bit line BL and word lines WL in a DLA read operation will be described with reference to FIG. 12. FIG. 12 is a timing chart showing voltages of a bit line BL and word lines WL(n−1), WL(n), WL(n+1), and WL(n+2) in a DLA read operation. In the example of FIG. 12, a memory cell transistor MC(n) whose neighboring memory cell transistor MC(n+1) belongs to the Er state, the A state, the B state, or the C state is included in a zone ZN1, as described with reference to FIG. 9. A memory cell transistor MC(n) whose neighboring memory cell transistor MC(n+1) belongs to either the D state, the E state, the F state, or the G state is included in a zone ZN2. Accordingly, in a pre-read operation, a D-state read operation DR is performed. In a formal read operation, a case is shown where the lower page is read.

In the formal read operation of the present embodiment, a voltage VREADK that differs according to the zone is applied to the neighboring word line WL(n+1). As the voltage VREADK increases, a parasitic resistance between the word line WL(n) and the word line WL(n+1) decreases. With the decrease in the parasitic resistance, a cell current flowing through the channel of the memory cell transistor MC(n) increases. With the increase in the cell current, the voltage of the node SEN decreases relatively rapidly in the sense amplifier circuit SA. Accordingly, the transistor Tr6 is likely to be determined to be in the off state. That is, when the voltage VREADK increases, the memory cell transistor MC(n) is likely to be determined to be on, and the threshold voltage will apparently decrease.

As shown in FIG. 12, a pre-read operation is executed during the period from time t0 to time t3, and a formal read operation is executed during the period from time t4 to time t12.

At time t0, the sense amplifier 20 applies a voltage VBL to the bit line BL. The row decoder 19 applies a voltage VREAD to the word lines WL(n−1), WL(n), and WL(n+1). The row decoder 19 applies a voltage VREADK to the word line WL(n+2).

At time t1, the row decoder 19 applies a read voltage VCG_DR (e.g., voltage VD) to the word line WL(n+1) to be a read target, in response to the D-state read operation DR in the pre-read operation. During the period from time t1 to time t2, the sense amplifier 20 executes a D-state read operation DR.

At time t2, the row decoder 19 applies the voltage VREAD to the word line WL(n+1).

At time t3, the row decoder 19 applies the voltage VSS to the word lines WL(n−1), WL(n), WL(n+1), and WL(n+2). The period from time t3 to time t4 is, for example, a reset period with which the period of a read operation for each word line WL to be a read target is delimited.

At time t4, the row decoder 19 applies the voltage VREAD to the word lines WL(n−1), WL(n), and WL(n+2). The row decoder 19 applies a voltage VREADK_Z1 to the word line WL(n+1). The voltage VREADK_Z1 is a voltage that is applied to the word line WL(n+1) in a formal read operation on a memory cell transistor MC(n) that is included in the zone ZN1. The voltages VREAD and VREADK_Z1 satisfy the relation of VREAD<VREADK_Z1.

At time t5, the row decoder 19 applies a voltage VSS to the word line WL(n). That is, the period from time t4 to time t5 corresponds to the period of a kick operation.

At time t6, the row decoder 19 applies a read voltage VCG_AR to the selected word line. WL(n) in response to an A-state read operation AR. During the period from time t6 to time t7, the sense amplifier 20 executes an A-state read operation AR on the memory cell transistor MC(n) that belongs to the zone ZN1. During this period, the sense amplifier 20 does not read data from a memory cell transistor MC(n) that belongs to the zone ZN2.

At time t7, the row decoder 19 applies a voltage VREADK_Z2 to the word line WL(n+1). The voltage VREADK_Z2 is a voltage that is applied to the word line WL(n+1) in a formal read operation of the memory cell transistor MC(n) that is included in the zone ZN2. The voltages VREADK_Z1 and VREADK_Z2 satisfy the relation of VREADK_Z1<VREADK_Z2. During the period from time t7 to time t8, the sense amplifier 20 executes an A-state read operation AR on the memory cell transistor MC(n) that belongs to the zone ZN2. During this period, the sense amplifier 20 does not read data from the memory cell transistor MC(n) that belongs to the zone ZN1.

At time t8, the row decoder 19 applies a voltage VREADK_Z1 to the word line WL(n+1). The row decoder 19 applies a read voltage VCG_ER to a selected word line WL(n) in response to an E-state read operation ER. During the period from time t8 to time t9, the sense amplifier 20 executes an E-state read operation ER on the memory cell transistor MC(n) that belongs to the zone ZN1.

At time t9, the row decoder 19 applies a voltage VREADK_Z2 to the word line WL(n+1). During the period from time t9 to time t10, the sense amplifier 20 executes an E-state read operation ER on the memory cell transistor MC(n) that belongs to the zone ZN2.

At time t10, the row decoder 19 applies a voltage VREAD to the word line WL(n). Thereby, a channel of the memory pillar MP is discharged.

At time t11, a refresh operation is performed. The sense amplifier 20 applies the voltage VSS to the bit line BL. The row decoder 19 applies a voltage VSS to the word lines WL(n−1), WL(n), WL(n+1), and WL(n+2)

1.4 Effects of Present Embodiment

According to the configuration of the present embodiment, it is possible to provide a semiconductor memory device with improved reliability. The effects will be described in detail below.

Because of the neighboring word line interference, the threshold voltage of the memory cell transistor MC(n) may shift upon writing data to a neighboring memory cell transistor MC(n+1). Accordingly, there is a case where a read operation is performed by changing the read conditions according to the state of the memory cell transistor MC(n+1) to make the shift amount of the threshold voltage of the memory cell transistor MC(n) apparently small. However, when, for example, eight different read conditions are respectively applied to the eight states of TLC, there is a tendency for the read time to increase. The threshold voltage may be shifted by effects other than the neighboring word line interference, such as read disturb and data retention.

On the other hand, according to the configuration of the present embodiment, the semiconductor memory device is capable of performing a DLA read operation corresponding to the neighboring word line interference. In a DLA read operation of the present embodiment, a plurality of states of memory cell transistors MC(n+1) can be gathered into a plurality of zones ZN. In addition, in a DLA read operation, a formal read operation to which read conditions that differ according to the zone ZN are applied can be executed. More specifically, by varying the voltage VREADK that is applied to the word line WL(n+1) according to the zone ZN, the shift amount of the apparent threshold voltage in a formal read operation can be decreased. It is thereby possible to suppress erroneous reading. This results in improvement in reliability of the semiconductor memory device.

Moreover, according to the configuration of the present embodiment, read conditions in a formal read operation can be set in such a manner that the effects of read disturb and data retention are mitigated. More specifically, when, for example, TLC is separated into two zones ZN, as described with reference to FIG. 9, read conditions for the zone ZN2 can be set in such a manner that the apparent D-state threshold voltage Vt_D', which is the lowest threshold voltage in the zone ZN2, becomes lower than the Er-state threshold voltage Vt_Er in the zone ZN1, and the G-state apparent threshold voltage Vt_G', which is the highest threshold voltage in the zone ZN2, becomes lower than the C-state threshold voltage Vt_C in the zone ZN1. That is, it is possible to set the Er-state threshold voltage Vt_Er, which is the lowest threshold voltage, and the G-state threshold voltage Vt_G', which is the highest threshold voltage, so as not to be the lower limit and the upper limit, respectively, of variations in apparent threshold voltage in a DLA read operation.

More specifically, fluctuations in the Er-state threshold voltage due to a read disturb, for example, are greater than those in the other-state threshold voltages. In addition, fluctuations in the G-state threshold voltage due to data retention are greater than those in the other-state threshold voltages. Moreover, when the state of a memory cell transistor MC(n) and the state of its neighboring memory cell transistor MC(n+1) satisfy the relation between the Er state and the G state or between the G state and the Er state, since the difference in threshold voltage between the states is large, a larger amount of charge is extracted (moved) from the G-state side to the Er-state side, compared to the other states. That is, fluctuations in the threshold voltage after writing of Er-state and G-state data are greater than those after writing of other-state data. On the other hand, according to the configuration of the present embodiment, it is possible to set conditions for a formal read operation in such a manner that the Er-state threshold voltage and the G-state apparent threshold voltage do not become the lower limit and the upper limit, respectively, of variations in apparent threshold voltage in a DLA read operation. It is thereby possible to suppress the effects of read disturb, data retention, etc. caused by variations in threshold voltage of the memory cell transistor MC(n). It is thereby possible to suppress erroneous reading.

2. Second Embodiment

Next, a second embodiment will be described. In a read operation of the second embodiment, a case will be described where the voltage VREADK is applied to the neighboring word lines WL(n−1) and WL(n+1). Hereinafter, the description will focus mainly on matters different from those of the first embodiment.

2.1 Voltages of Bit Line and Word Lines in DLA Read Operation

Voltages of a bit line BL and word lines WL in a DLA read operation will be described with reference to FIG. 13. FIG. 13 is a timing chart showing voltages of a bit line BL and word lines WL(n−1), WL(n), WL(n+1), and WL(n+2) in a DLA read operation.

As shown in FIG. 13, a pre-read operation is executed during the period from time t0 to time t3, and a formal read operation is executed during the period from time t4 to time t12.

At time to, the sense amplifier 20 applies a voltage VBL to the bit line BL. The row decoder 19 applies a voltage VREAD to word lines WL(n−1) and WL(n+1). The row decoder 19 applies a voltage VREADK to the word lines WL(n) and WL(n+2).

The operation during the period from time t1 to time t4 is similar to that in FIG. 12 of the first embodiment.

At time t4, the row decoder 19 applies a voltage VREAD to the word lines WL(n) and WL(n+2). Also, the row decoder 19 applies a voltage VREADK_Z1 to the word lines WL(n−1) and WL(n+1).

At time t5, the row decoder 19 applies a voltage VSS to the word line WL(n).

At time t6, the row decoder 19 applies a read voltage VCG_AR to the selected word line WL(n) in response to an A-state read operation AR. During the period from time t6 to time t7, the sense amplifier 20 executes an A-state read operation AR on the memory cell transistor MC(n) that belongs to the zone ZN1.

At time t7, the row decoder 19 applies a voltage VREADK_Z2 to the word lines WL(n−1) and WL(n+1). During the period from time t7 to time t8, the sense amplifier 20 executes an A-state read operation AR on the memory cell transistor MC(n) that belongs to the zone ZN2.

At time t8, the row decoder 19 applies a voltage VREADK_Z1 to the word lines WL(n−1) and WL(n+1). The row decoder 19 applies a read voltage VCG_ER to a selected word line WL(n) in response to an E-state read operation ER. During the period from time t8 to time t9, the sense amplifier 20 executes an E-state read operation ER on the memory cell transistor MC(n) that belongs to the zone ZN1.

At time t9, the row decoder 19 applies a voltage VREADK_Z2 to the word lines WL(n−1) and WL(n+1) During the period from time t9 to time t10, the sense amplifier 20 executes an E-state read operation ER on the memory cell transistor MC(n) that belongs to the zone ZN2.

The operation during the period from time t10 to time t11 is similar to that in FIG. 12 of the first embodiment.

2.2 Effects of Present Embodiment

According to the configuration of the present embodiment, effects similar to those of the first embodiment are achieved.

3. Third Embodiment

Next, a third embodiment will be described. In the third embodiment, a formal read operation different from those of the first and second embodiments will be described. Hereinafter, the description will focus mainly on matters different from those of the first and second embodiments.

3.1 Voltages of Bit Line and Word Lines in DLA Read Operation

Figure 14:
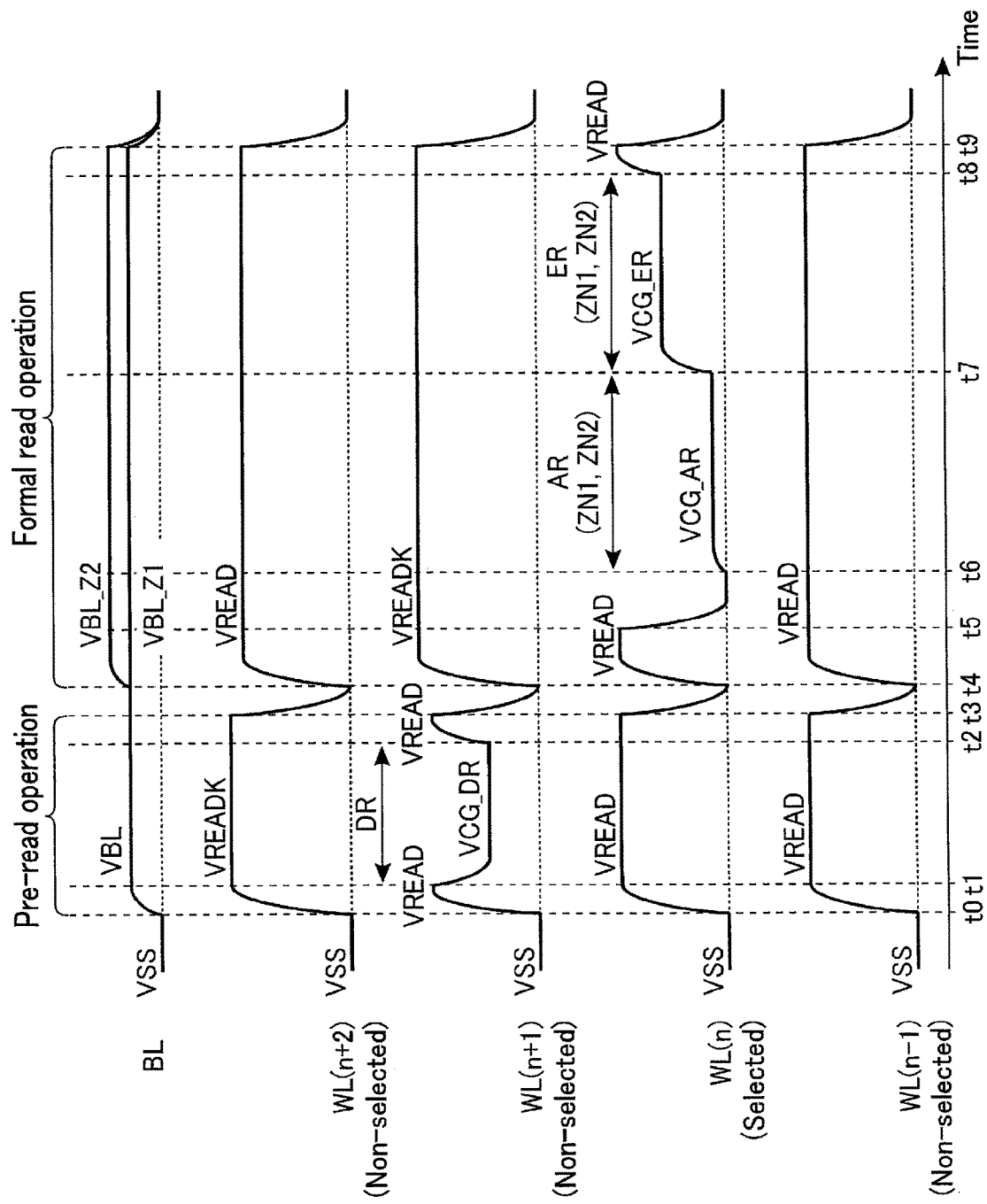
FIG. 14 is a timing chart showing voltages of interconnects during a DLA read operation in a semiconductor memory device according to a third embodiment.

Voltages of a bit line BL and word lines WL in a DLA read operation will be described with reference to FIG. 14. FIG. 14 is a timing chart showing voltages of a bit line BL and word lines WL(n−1), WL(n), WL(n+1), and WL(n+2) in a DLA read operation.

In the formal read operation of the present embodiment, a voltage VBL that differs according to the zone ZN is applied to the bit line BL. As the voltage VBL increases, the cell current increases. Accordingly, the threshold voltage of the memory cell transistor MC apparently decreases.

As shown in FIG. 14, a pre-read operation is executed during the period from time t0 to time t3, and a formal read operation is executed during the period from time t4 to time t9.

The operation during the period from time t0 to time t4 is similar to that in FIG. 12 of the first embodiment.

At time t4, the sense amplifier 20 applies a voltage VBL_Z1 to a bit line BL corresponding to the zone ZN1, and applies a voltage VBL_Z2 to a bit line BL corresponding to the zone ZN2 The voltages VBL_Z1 and VBL_Z2 satisfy the relation of VBL_Z1<VBL_Z2. More specifically, the sequencer 15 transmits different signals BLC to different sense amplifier circuits SA. The sequencer 15 transmits, for example, a signal BCL that clamps the voltage of the bit line BL at VBL_Z1 to the sense amplifier circuit. SA that is coupled to the bit line BL corresponding to the zone ZN1. On the other hand, the sequencer 15 transmits, for example, a signal BCL that clamps the voltage of the bit line BL at VBL_Z2 to the sense amplifier circuit SA that is coupled to the bit line BL corresponding to the zone ZN2. Consequently, the sense amplifier 20 applies a voltage VBL_Z1 to a bit line BL corresponding to the zone ZN1, and applies a voltage VBL_Z2 to a bit line BL corresponding to the zone ZN2.

The row decoder 19 applies a voltage VREAD to the word lines WL(n−1), WL(n), and WL(n+2). The row decoder 19 applies a voltage VREADK to the word line WL(n+1).

At time t5, the row decoder 19 applies a voltage VSS to the word line WL(n).

At time t6, the row decoder 19 applies a read voltage VCG_AR to the selected word line WL(n) in response to an A-state read operation AR. During the period from time t6 to time t7, the sense amplifier 20 executes an A-state read operation AR on the memory cell transistor MC(n) that belongs to the zones ZN1 and ZN2.

At time t7, the row decoder 19 applies a read voltage VCG_ER to a selected word line WL(n) in response to an E-state read operation ER. During the period from time t8 to time t9, the sense amplifier 20 executes an E-state read operation ER on the memory cell transistor MC(n) that belongs to the zones ZN1 and ZN2.

At time t8, the row decoder 19 applies a voltage VREAD to a word line WL(n). Thereby, a channel of the memory pillar MP is discharged.

At time t9, a refresh operation is performed. The sense amplifier 20 applies the voltage VSS to the bit line BL.

The row decoder 19 applies a voltage VSS to the word lines WL(n−1), WL(n) WL(n+1), and WL(n+2).

In the example of FIG. 14, a case is shown where the voltage VREAD is applied to the word line WL(n) in a pre-read operation, and the voltage VREAD is applied to the word line WL(n−1) in a formal read operation; however, the configuration is not limited thereto. It is also possible, for example, to apply the voltage VREADK to the word line WL(n) in a pre-read operation, and to apply the voltage VREADK to the word line WL(n−1) in a formal read operation, similarly to the second embodiment.

3.2 Effects of Present Embodiment

According to the configuration of the present embodiment, it is possible to obtain effects similar to those of the first and second embodiments.

Moreover, according to the configuration of the present embodiment, a read operation can be performed by applying different voltages to bit lines BL corresponding to the respective zones ZN. It is thereby possible to collectively perform read operations of the respective zones ZN on a state-by-state basis. It is thereby possible suppress a decrease in processing capabilities during a read operation.

4. Fourth Embodiment

Next, a fourth embodiment will be described. In the fourth embodiment, four examples of zone separation will be described. Hereinafter, the description will focus mainly on matters different from those of the first to third embodiments.

4.1 First Example

Zone separation according to a first example will be described with reference to FIG. 15. FIG. 15 shows a relationship between a zone ZN and an apparent threshold voltage of a memory cell transistor MC(n) in a DLA read operation.

As shown in FIG. 15, in the present example, a memory cell transistor MC(n) whose neighboring memory cell transistor MC(n+1) belongs to the Er state, the A state, or the B state is included in a zone ZN1. A memory cell transistor MC(n) whose neighboring memory cell transistor MC(n+1) belongs to the C state, the D state, the E state, the F state, or the G state is included in a zone. ZN2.

Let us assume that an apparent threshold voltage of a memory cell transistor MC(n) in the zone ZN2 corresponding to the memory cell transistor MC(n+1) that belongs to the C state is Vt_C'. In this case, the threshold voltages Vt_C and Vt_C' satisfy the relation of Vt_C'<Vt_C. The threshold voltages Vt_C', Vt_D', Vt_E', Vt_F', and Vt_G' satisfy the relations of Vt_Cr<Vt_D'<Vt_Er<Vt_F'<Vt_G'. Also, in the present example, read conditions for the zone ZN2 are set in such a manner that the lowest threshold voltage Vt_C' (reference point) in the zone ZN2 takes a value lower than the lowest threshold voltage Vt_Er in the zone ZN1, and the highest threshold voltage Vt_G' in the zone ZN2 takes a value lower than the highest threshold voltage Vt_B in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the C state is lower than a lower limit value of a read voltage of a memory cell transistor MC(n) whose neighboring memory cell transistor MC(n+1) belongs to the Er state. The lower limit value of a read voltage of a memory cell transistor MC(n) whose neighboring memory cell transistor MC(n+1) belongs to the G state is lower than a lower limit value of a read voltage of a memory cell transistor MC(n) whose neighboring memory cell transistor MC(n+1) belongs to the B state.

4.2 Second Example

Figure 16:
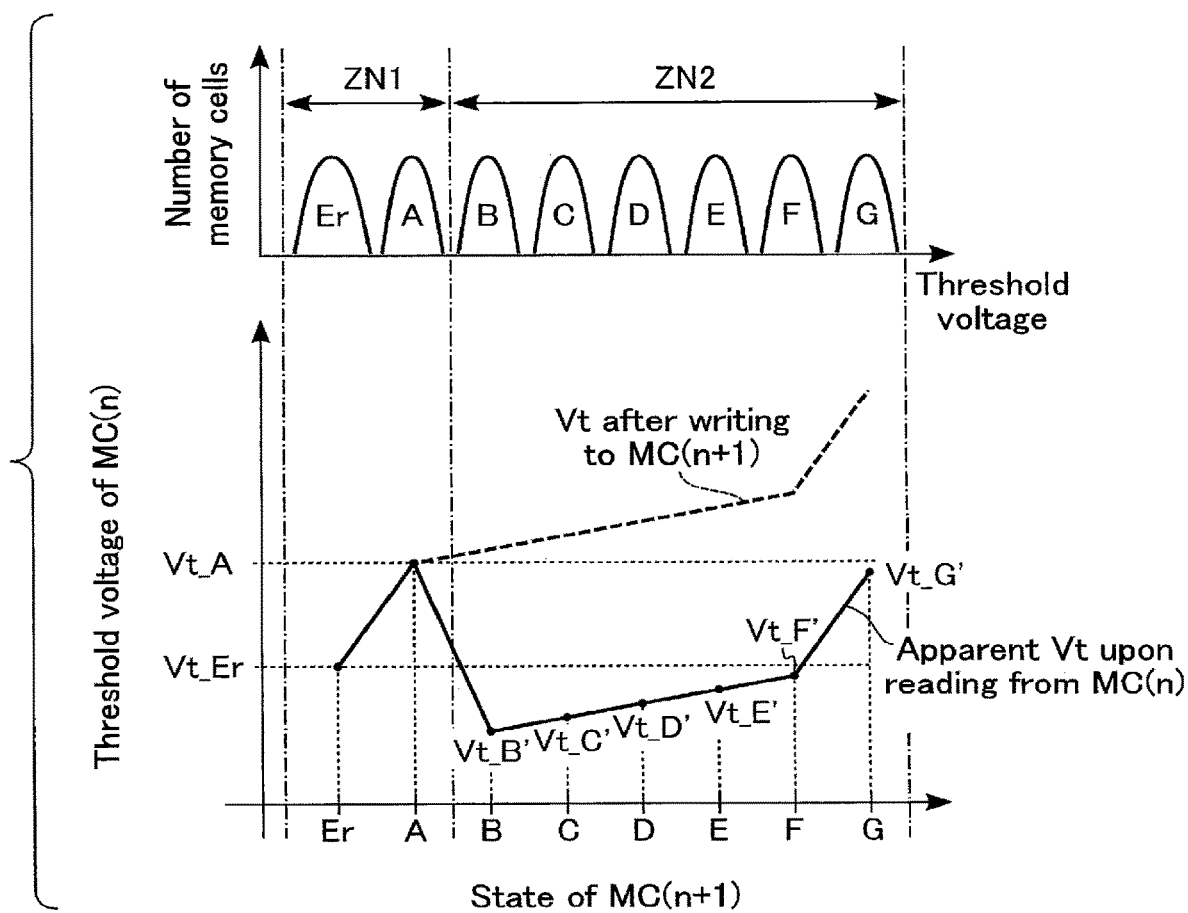
FIG. 16 shows a relationship between a zone and an apparent threshold voltage of a memory cell transistor during a DLA read operation in a semiconductor memory device according to a second example of the fourth embodiment.

Next, zone separation according to a second example will be described with reference to FIG. 16. FIG. 16 shows a relationship between a zone ZN and an apparent threshold voltage of a memory cell transistor MC(n) in a DLA read operation.

As shown in FIG. 16, in the present example, a memory cell transistor MC(n) whose neighboring memory cell transistor MC(n+1) belongs to the Er state or the A state is included in a zone ZN1. A memory cell transistor MC(n) whose neighboring memory cell transistor MC(n+1) belongs to the B state, the C state, the D state, the E state, the F state, or the G state is included in a zone ZN2.

Let us assume that an apparent threshold voltage of a memory cell transistor MC(n) in the zone ZN2 corresponding to a memory cell transistor MC(n+1) that belongs to the B state is Vt_B' In this case, the threshold voltages Vt_B and Vt_B' satisfy the relation of Vt_B'<Vt_B. The threshold voltages Vt_B', Vt_C', Vt_D', Vt_E', Vt_F', and Vt_G' satisfy the relations of Vt_B'<Vt_C'<Vt_D'<Vt_E'<Vt_F'<Vt_G'. Also, in the present example, read conditions for the zone ZN2 are set in such a manner that the lowest threshold voltage Vt_B' (reference point) in the zone ZN2 takes a value lower than the lowest threshold voltage Vt_Er in the zone ZN1, and the highest threshold voltage Vt_G' in the zone ZN2 takes a value lower than the highest threshold voltage Vt_A in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the B state is lower than a lower limit value of a read voltage of a memory cell transistor MC(n) whose neighboring memory cell transistor MC(n+1) belongs to the Er state. The lower limit value of a read voltage of a memory cell transistor MC(n) whose neighboring memory cell transistor MC(n+1) belongs to the G state is lower than a lower limit value of a read voltage of a memory cell transistor MC(n) whose neighboring memory cell transistor MC(n+1) belongs to the A state.

4.3 Third Example

Figure 17:
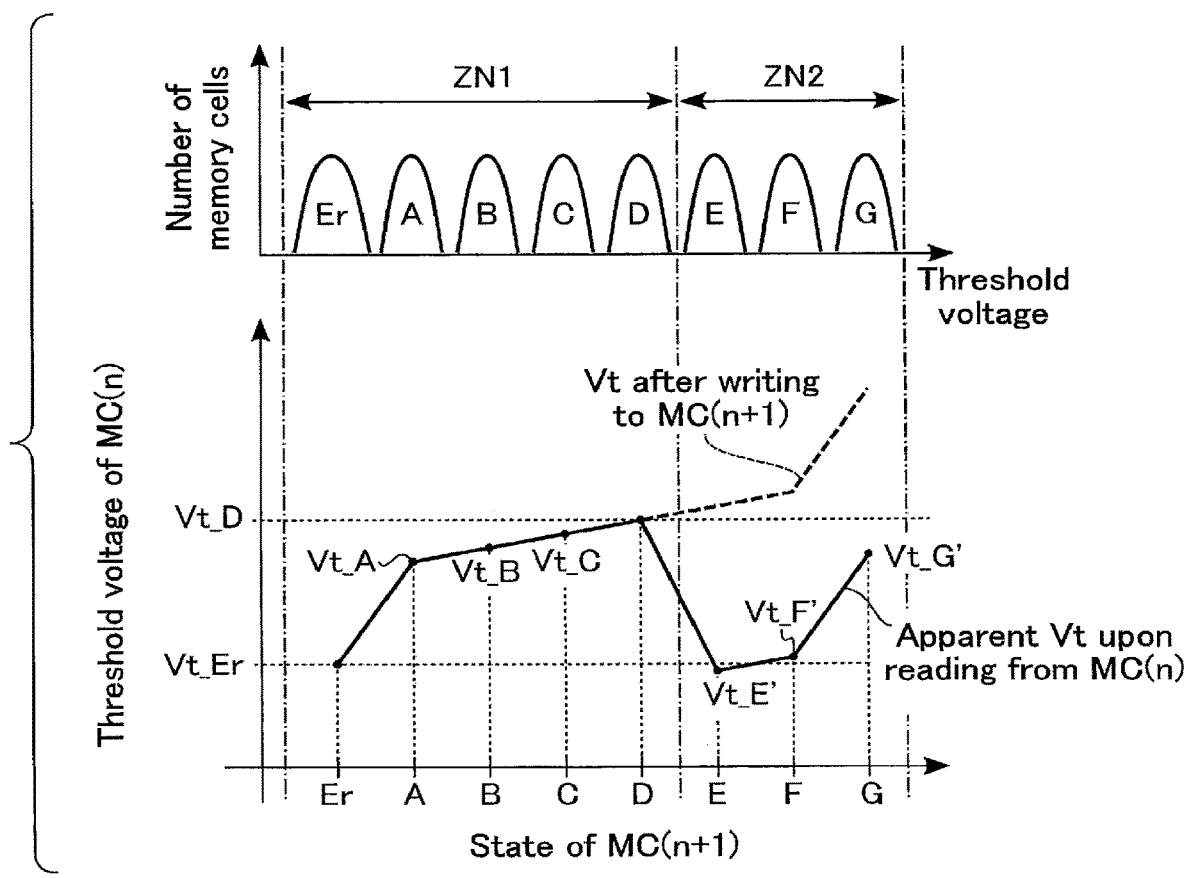
FIG. 17 shows a relationship between a zone and an apparent threshold voltage of a memory cell transistor during a DLA read operation in a semiconductor memory device according to a third example of the fourth embodiment.

Next, zone separation according to a third example will be described with reference to FIG. 17. FIG. 17 shows a relationship between a zone ZN and an apparent threshold voltage of a memory cell transistor MC(n) in a DLA read operation.

As shown in FIG. 17, in the present example, a memory cell transistor MC(n) whose neighboring memory cell transistor MC(n+1) belongs to the Er state, the A state, the B state, the C state, or the D state is included in a zone ZN1. Also, a memory cell transistor MC(n) whose neighboring memory cell transistor MC(n+1) belongs to the E state, the F state, or the G state is included in a zone ZN2.

The threshold voltages Vt_E', Vt_F', and Vt_G' satisfy the relations of Vt_E'<Vt_F'<Vt_G'. Also, in the present example, read conditions for the zone ZN2 are set in such a manner that the lowest threshold voltage Vt_E' (reference point) in the zone ZN2 takes a value lower than the lowest threshold voltage Vt_Er in the zone ZN1, and the highest threshold voltage VtG' in the zone ZN2 takes a value lower than the highest threshold voltage Vt_D in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the E state is lower than a lower limit value of a read voltage of a memory cell transistor MC(n) whose neighboring memory cell transistor MC(n+1) belongs to the Er state. The lower limit value of a read voltage of a memory cell transistor MC(n) whose neighboring memory cell transistor MC(n+1) belongs to the G state is lower than a lower limit value of a read voltage of a memory cell transistor MC(n) whose neighboring memory cell transistor MC(n+1) belongs to the D state.

4.4 Fourth Example

Figure 18:
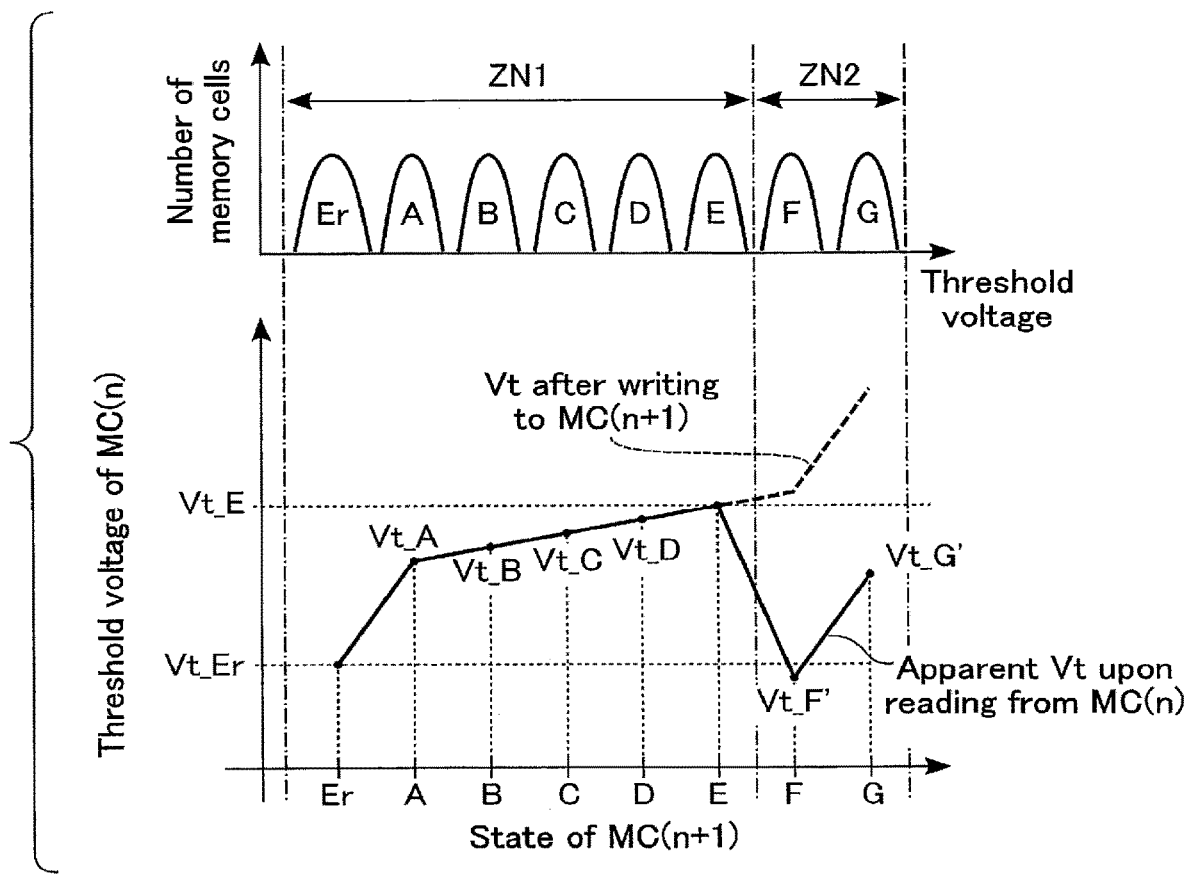
FIG. 18 shows a relationship between a zone and an apparent threshold voltage of a memory cell transistor during a DLA read operation in a semiconductor memory device according to a fourth example of the fourth embodiment.

Next, zone separation according to a fourth example will be described with reference to FIG. 18. FIG. 18 shows a relationship between a zone ZN and an apparent threshold voltage of a memory cell transistor MC(n) in a DLA read operation.

As shown in FIG. 18, in the present example, a memory cell transistor MC(n) whose neighboring memory cell transistor MC(n+1) belongs to the Er state, the A state, the B state, the C state, the D state, or the E state is included in a zone ZN1. Also, a memory cell transistor MC(n) whose neighboring memory cell transistor MC(n+1) belongs to the F state or the G state is included in a zone ZN2.

In the present example, read conditions for the zone ZN2 are set in such a manner that the lowest threshold voltage Vt_F' (reference point) in the zone ZN2 takes a value lower than the lowest threshold voltage Vt_Er in the zone ZN1, and the highest threshold voltage Vt_G' in the zone ZN2 takes a value lower than the highest threshold voltage Vt_E in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the F state is lower than a lower limit value of a read voltage of a memory cell transistor MC(n) whose neighboring memory cell transistor MC(n+1) belongs to the Er state. The lower limit value of a read voltage of a memory cell transistor MC(n) whose neighboring memory cell transistor MC(n+1) belongs to the G state is lower than a lower limit value of a read voltage of a memory cell transistor MC(n) whose neighboring memory cell transistor MC(n+1) belongs to the E state.

4.5 Effects of Present Embodiment

According to the configuration of the present embodiment, it is possible to obtain effects similar to those of the first to third embodiments.

Zone separation is not limited to those described in the first embodiment and the first to fourth examples of the fourth embodiment. For example, a memory cell transistor MC(n) whose neighboring memory cell transistor MC(n+1) belongs to the Er state may be included in a zone ZN1. In this case, the memory cell transistor MC(n) whose neighboring memory cell transistor MC(n+1) belongs to the A state, the B state, the C state, the D state, the E state, the F state, or the G state is included in a zone ZN2.

The zone separation described in the present embodiment may be applicable to the second and third embodiments.

5. Fifth Embodiment

Figure 19:
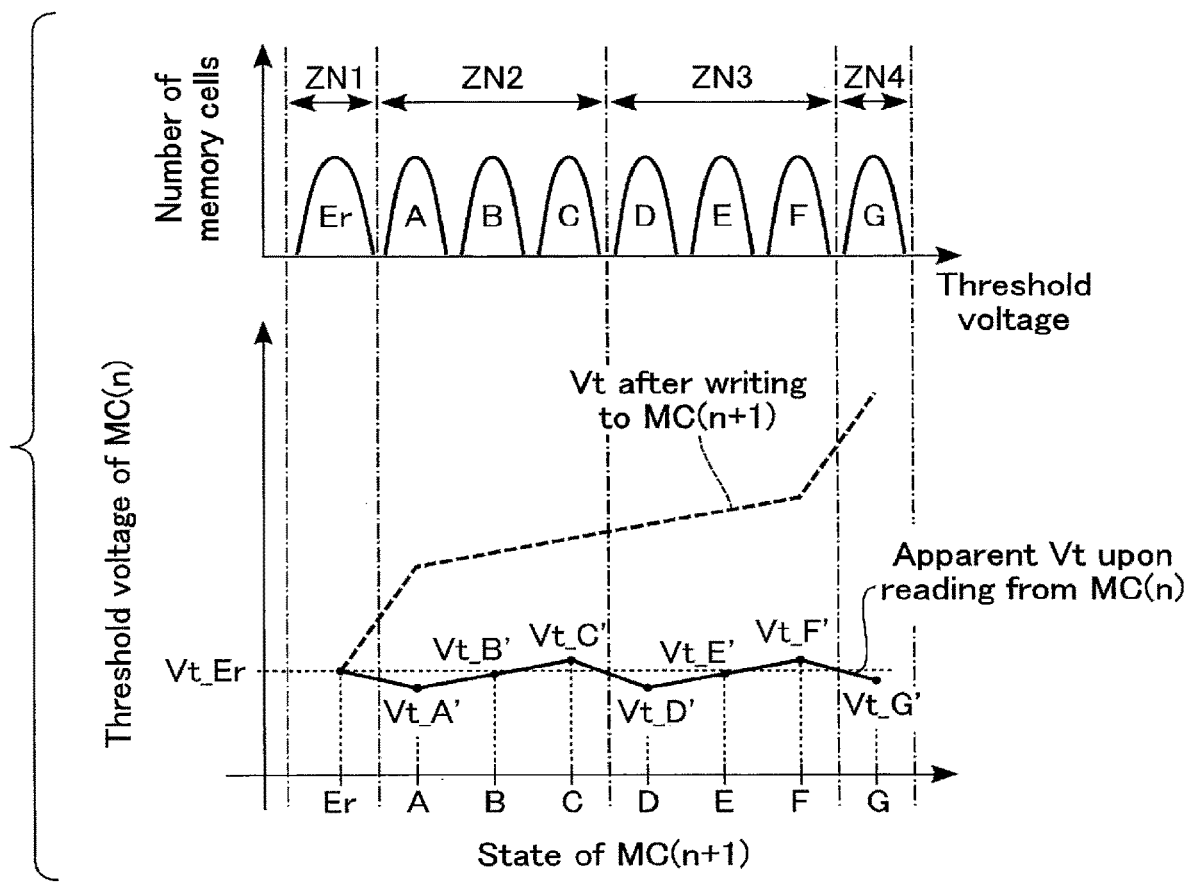
FIG. 19 shows a relationship between a zone and an apparent threshold voltage of a memory cell transistor during a DLA read operation in a semiconductor memory device according to a fifth embodiment.

Next, a fifth embodiment will be described. In the fifth embodiment, a case will be described where memory cell transistors MC(n) are separated into four zones ZN. Hereinafter, the description will focus mainly on matters different from those of the first to fourth embodiments 5.1 Zone Separation Zone separation according to an example will be described with reference to FIG. 19. FIG. 19 shows a relationship between a zone ZN and an apparent threshold voltage of a memory cell transistor MC(n) in a DLA read operation.

As shown in FIG. 19, in the present embodiment, memory cell transistors MC(n) to be read targets are separated into four zones ZN according to the state of their neighboring memory cell transistors MC(n+1). More specifically, the memory cell transistor MC(n) whose neighboring memory cell transistor MC(n+1) belongs to the Er state is included in a zone ZN1. A memory cell transistor MC(n) whose neighboring memory cell transistor MC(n+1) belongs to the A state, the B state, or the C state is included in a zone ZN2. A memory cell transistor MC(n) whose neighboring memory cell transistor MC(n+1) belongs to the D state, the E state, or the F state is included in a zone ZN3. A memory cell transistor MC(n) whose neighboring memory cell transistor MC(n+1) belongs to the G state is included in a zone ZN4.

Let us assume that an apparent threshold voltage of the memory cell transistor MC(n) in the zone ZN2 corresponding to a memory cell transistor MC(n+1) that belongs to the A state is Vt_A'. In this case, the threshold voltages Vt_A and Vt_A' satisfy the relation of Vt_A'<Vt_A. In the zone ZN2, the threshold voltages Vt_A', Vt_B', and Vt_C' satisfy the relation of Vt_A'<Vt_B'<Vt_C'. Moreover, read conditions for the zone ZN2 are set in such a manner that the lowest threshold voltage Vt_A' (reference point) in the zone ZN2 becomes lower than the threshold voltage Vt_Er in the zone ZN1, and the highest threshold voltage Vt_C' in the zone ZN2 becomes higher than the threshold voltage Vt_Er in the zone ZN1.

That is, the lower limit value of a read voltage of a memory cell transistor MC(n) whose neighboring memory cell transistor MC(n+1) belongs to the A state is lower than a lower limit value of a read voltage of a memory cell transistor MC(n) whose neighboring memory cell transistor MC(n+1) belongs to the Er state. Also, the lower limit value of a read voltage of a memory cell transistor MC(n) whose neighboring memory cell transistor MC(n+1) belongs to the C state is higher than a lower limit value of a read voltage of a memory cell transistor MC(n) whose neighboring memory cell transistor MC(n+1) belongs to the Er state.

In the zone ZN3, the threshold voltages Vt_D', Vt_E', and Vt_F' satisfy the relation of Vt_D'<Vt_E'<Vt_F'. Moreover, read conditions for the zone ZN3 are set in such a manner that, in the zone ZN3, the lowest threshold voltage Vt_D' (reference point) becomes lower than the threshold voltage Vt_Er in the zone ZN1, and the highest threshold voltage Vt_F' becomes higher than the threshold voltage Vt_Er in the zone ZN1.

That is, the lower limit value of a read voltage of a memory cell transistor MC(n) whose neighboring memory cell transistor MC(n+1) belongs to the D state is lower than a lower limit value of a read voltage of a memory cell transistor MC(n) whose neighboring memory cell transistor MC(n+1) belongs to the Er state. Also, the lower limit value of a read voltage of a memory cell transistor MC(n) whose neighboring memory cell transistor MC(n+1) belongs to the F state is higher than a lower limit value of a read voltage of a memory cell transistor MC(n) whose neighboring memory cell transistor MC(n+1) belongs to the Er state.

Read conditions for the zone ZN4 are set in such a manner that the threshold voltage Vt_G' (reference point) in the zone ZN4 becomes higher than the threshold voltage Vt_A' or Vt_D' and lower than the threshold voltage Vt_C' or Vt_F'.

That is, the lower limit value of a read voltage of a memory cell transistor MC(n) whose neighboring memory cell transistor MC(n+1) belongs to the G state is higher than a lower limit value of a read voltage of a memory cell transistor MC(n) whose neighboring memory cell transistor MC(n+1) belongs to the A state or the D state, and lower than a lower limit value of a read voltage of a memory cell transistor MC(n) whose neighboring memory cell transistor MC(n+1) belongs to the C state or the F state.

Zone separation can be freely set as in, for example, the fourth embodiment.

5.2 Voltages of Bit Line and Word Lines in DLA Read Operation

Next, voltages of a bit line BL and word lines WL in a DLA read operation will be described with reference to FIG. 20. FIG. 20 is a timing chart showing voltages of a bit line BL and word lines WL(n-1), WL(n) WL(n+1), and WL(n+2) in a DLA read operation. In the example of FIG. 20, read operations AR, DR, and GR are executed in a pre-read operation. In a formal read operation, a case is shown where the lower page is read.

As shown in FIG. 20, a pre-read operation is executed during the period from time t0 to time t5, and a formal read operation is executed during the period from time t6 to time t17.

At time t0, the sense amplifier 20 applies a voltage VBL to the bit line BL. The row decoder 19 applies a voltage VREAD to the word lines WL(n-1), WL(n), and WL(n+1). The row decoder 19 applies a voltage VREADK to the word line WL(n+2).

At time t1, the row decoder 19 applies a read voltage VCG_AR (e.g., voltage VA) to a word line WL(n+1) to be a read target, in response to an A-state read operation AR in a pre-read operation. During the period from time t1 to time t2, the sense amplifier 20 executes an A-state read operation AR.

At time t2, the row decoder 19 applies a read voltage VCG_DR (e.g., voltage VD) to a word line WL(n+1) to be a read target, in response to a D-state read operation DR in the pre-read operation. During the period from time t2 to time t3, the sense amplifier 20 executes a D-state read operation AR.

At time t3, the row decoder 19 applies a read voltage VCG_GR (e.g., voltage VG) to a word line WL(n+1) to be a read target, in response to a G-state read operation GR in the pre-read operation. During the period from time t2 to time t3, the sense amplifier 20 executes a G-state read operation GR.

At time t4, the row decoder 19 applies a voltage VREAD to the word line WL(n+1).

At time t5, the row decoder 19 applies a voltage VSS to the word lines WL(n-1), WL(n), WL(n+1), and WL(n+2). The period from time t5 to time t6 is a reset period.

At time t6, the row decoder 19 applies a voltage VREAD to the word lines WL(n-1), WL(n), and WL(n+2) The row decoder 19 applies a voltage VREADK_Z1 to the word line WL(n+1).

At time t7, the row decoder 19 applies a voltage VSS to the word line WL(n) That is, the period from time t6 to time t7 corresponds to a kick operation.

At time t8, the row decoder 19 applies a read voltage VCG_AR to a selected word line WL(n) in response to an A-state read operation AR. During the period from time t8 to time t9, the sense amplifier 20 executes an A-state read operation AR on the memory cell transistor MC(n) that belongs to the zone ZN1.

At time t9, the row decoder 19 applies a voltage VREADK_Z2 to the word line WL(n+1). During the period from time t9 to time t10, the sense amplifier 20 executes an A-state read operation AR on the memory cell transistor MC(n) that belongs to the zone ZN2.

At time t10, the row decoder 19 applies a voltage VREADK_Z3 to a word line WL(n+1). The voltage VREADK_Z3 is a voltage that is applied to the word line WL(n+1) in a formal read operation on the memory cell transistor MC(n) that is included in the zone ZN3. During the period from time t10 to time t11, the sense amplifier 20 executes an A-state read operation AR on the memory cell transistor MC(n) that belongs to the zone ZN3.

At time t11, the row decoder 19 applies a voltage VREADK_Z4 to a word line WL(n+1) The voltage VREADK_Z4 is a voltage that is applied to the word line WL(n+1) in a formal read operation on the memory cell transistor MC(n) that is included in the zone ZN4. The voltages VREADK_Z1, VREADK_Z2, and VREADK_Z3, and the voltage VREADK_Z4 satisfy the relation of VREADK_Z1<VREADK_Z2<VREADK_Z3<VREADK_Z4. During the period from time t11 to time t12, the sense amplifier 20 executes an A-state read operation AR on the memory cell transistor MC(n) that belongs to the zone ZN4.

At time t12, the row decoder 19 applies a voltage VREADK_Z1 to a word line WL(n+1). The row decoder 19 applies a read voltage VCG_ER to a selected word line WL(n) in response to an E-state read operation ER. During the period from time t12 to time t13, the sense amplifier 20 executes an E-state read operation ER on the memory cell transistor MC(n) that belongs to the zone ZN1.

At time t13, the row decoder 19 applies a voltage VREADK_Z2 to the word line WL(n+1). During the period from time t13 to time t14, the sense amplifier 20 executes an E-state read operation ER on the memory cell transistor MC(n) that belongs to the zone ZN2.

At time t14, the row decoder 19 applies a voltage VREADK_Z3 to the word line WL(n+1). During the period from time t14 to time t15, the sense amplifier 20 executes an E-state read operation ER on the memory cell transistor MC(n) that belongs to the zone ZN3.

At time t15, the row decoder 19 applies a voltage VREADK_Z4 to the word line WL(n+1). During the period from time t15 to time t16, the sense amplifier 20 executes an E-state read operation ER on the memory cell transistor MC(n) that belongs to the zone ZN4.

At time t16, the row decoder 19 applies a voltage VREAD to the word line WL(n).

At time t17, a refresh operation is performed. The sense amplifier 20 applies the voltage VSS to the bit line BL. The row decoder 19 applies a voltage VSS to the word lines WL(n−1), WL(n), WL(n+1), and WL(n+2).

5.3 Effects of Present Embodiment

According to the configuration of the present embodiment, it is possible to obtain effects similar to those of the first to fourth embodiments.

Moreover, according to the configuration of the present embodiment, by separating the memory cell transistors MC(n) into four zones ZN, it is possible to further reduce a variation in threshold voltage due to neighboring word line interference in a DLA read operation.

The second embodiment and the fifth embodiment may be combined.

6. Sixth Embodiment

Next, a sixth embodiment will be described. In the sixth embodiment, a case will be described where the voltage of the bit line BL is varied according to the zone ZN in a formal read operation of four zones ZN1 to ZN4, as described in the third embodiment. Hereinafter, the description will focus mainly on matters different from those of the fifth embodiment.

6.1 Voltages of Bit Line and Word Lines in DLA Read Operation

Figure 21:
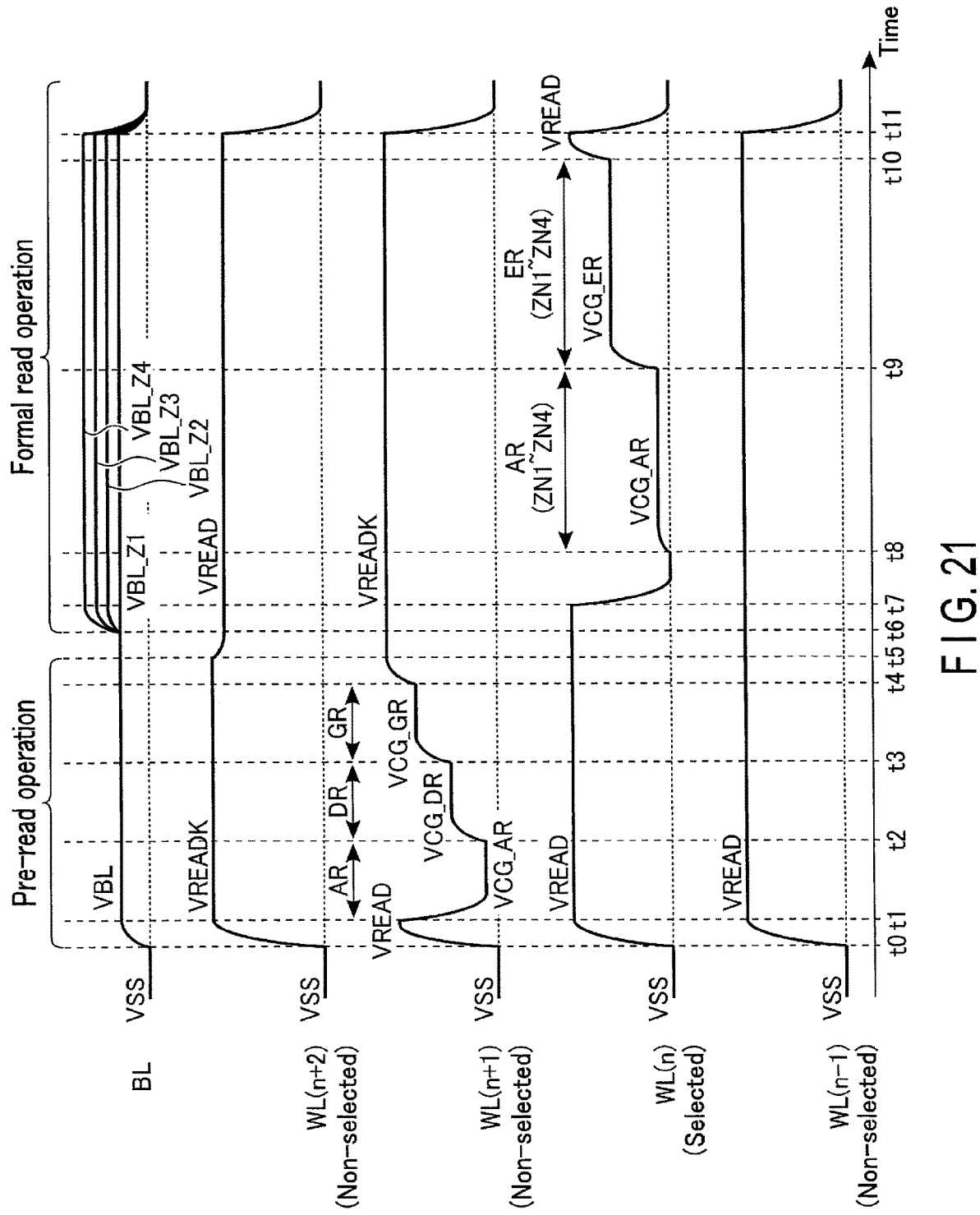
FIG. 21 is a timing chart showing voltages of interconnects during a DLA read operation in a semiconductor memory device according to a sixth embodiment.

Voltages of a bit line BL and word lines WL in a DLA read operation will be described with reference to FIG. 21. FIG. 21 is a timing chart showing voltages of a bit line BL and word lines WL(n−1), WL(n) WL(n+1), and WL(n+2) in a DLA read operation.

As shown in FIG. 21, a pre-read operation is executed during the period from time t0 to time t5, and a formal read operation is executed during the period from time t6 to time t11.

The operation during the period from time t0 to time t4 is similar to that in FIG. 20 of the fifth embodiment.

At time t4, the row decoder 19 applies a voltage VREADK to the word line WL(n+1).

At time t5, the row decoder 19 applies a voltage VREAD to the word line WL(n+2). In the present embodiment, the row decoder 19 keeps applying the voltage VREAD or the voltage VREADK during the reset period from time t5 to time t6, without applying the voltage VSS to each word line WL.

At time t6, the sense amplifier 20 applies a voltage VBL_Z1 to a bit line BL corresponding to the zone ZN1, applies a voltage VBL_Z2 to a bit line BL corresponding to the zone ZN2, applies a voltage VBL_Z3 to a bit line BL corresponding to the zone ZN3, and applies a voltage VBL_Z4 to a bit line BL corresponding to the zone ZN4. The voltages VBL_Z1, VBL_Z2, VBL_Z3, and VBL_Z4 satisfy the relation of VBL_Z1<VBL_Z2<VBL_Z3<VBL_Z4.

At time t7, the row decoder 19 applies a voltage VSS to the word line WL(n). In the present embodiment, a kick operation is omitted by applying a voltage VREAD to the word line WL(n) until time t7.

At time t8, the row decoder 19 applies a read voltage VCG_AR to a selected word line WL(n) in response to an A-state read operation AR. During the period from time t8 to time t9, the sense amplifier 20 executes an A-state read operation AR on the memory cell transistor MC(n) that belongs to the zones ZN1 to ZN4.

At time t9, the row decoder 19 applies a read voltage VCG_ER to a selected word line WL(n) in response to an E-state read operation ER. During the period from time t9 to time t10, the sense amplifier 20 executes an E-state read operation ER on the memory cell transistor MC(n) that belongs to the zones ZN1 to ZN4.

At time t10, the row decoder 19 applies a voltage VREAD to the word line WL(n).

At time t11, a refresh operation is performed. The sense amplifier 20 applies the voltage VSS to the bit line BL. The row decoder 19 applies a voltage VSS to the word lines WL(n−1), WL(n), WL(n+1), and WL(n+2).

6.2 Effects of Present Embodiment

According to the configuration of the present embodiment, it is possible to obtain effects similar to those of the first to fifth embodiments.

7. Seventh Embodiment

Next, a seventh embodiment will be described. In the seventh embodiment, a case will be described where a plurality of pages of the same cell unit CU are continuously read. Hereinafter, the description will focus mainly on matters different from those of the first to sixth embodiments.

7.1 Overall Flow of Read Operation

Figure 22:
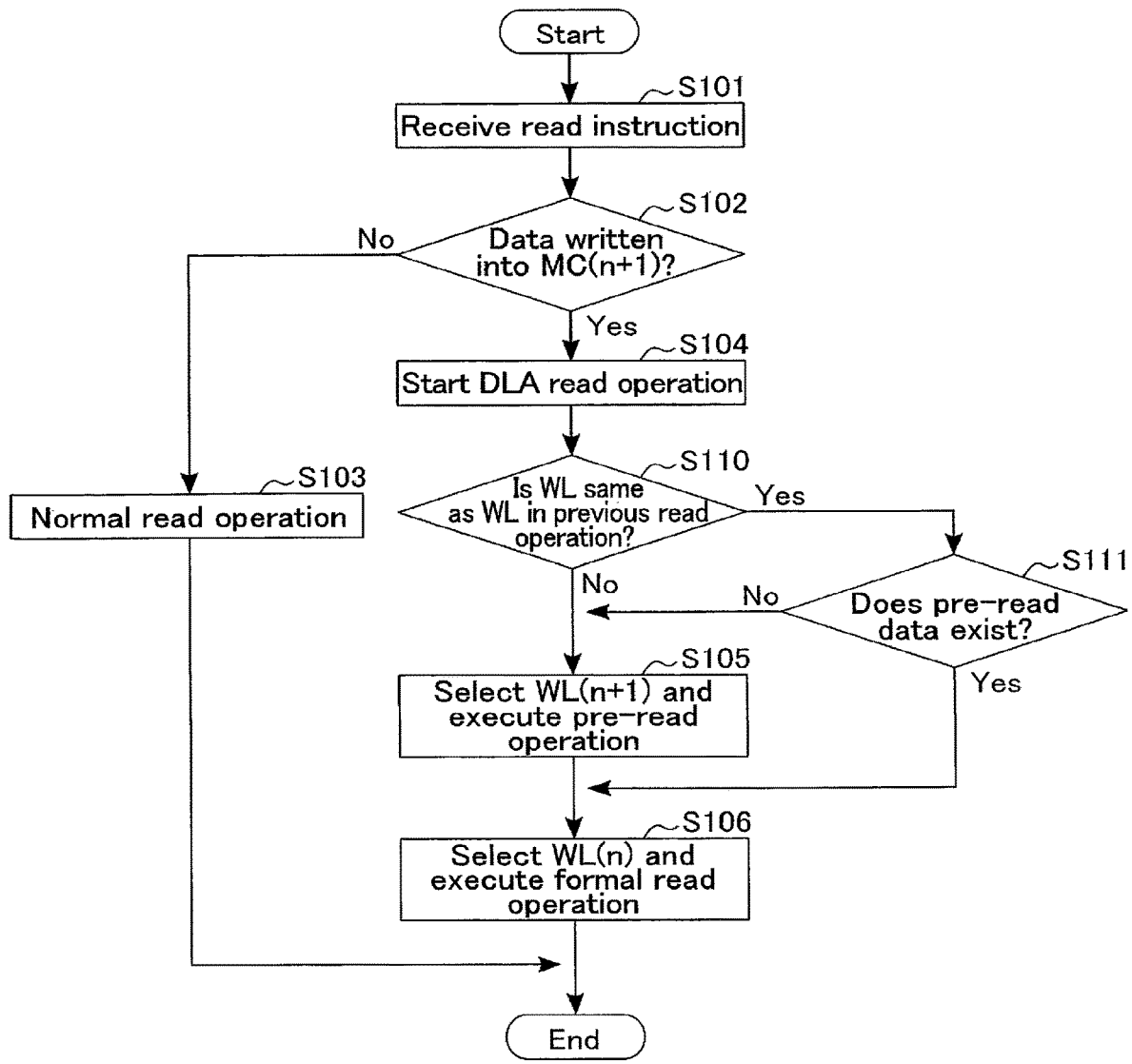
FIG. 22 is a flowchart showing a read operation of a semiconductor memory device according to a seventh embodiment.

Next, an overall flow of a read operation will be described with reference to FIG. 22. FIG. 22 is a flowchart of a read operation. In the example of FIG. 22, a case is shown where, when a read operation is performed by selecting the same word line WL, a pre-read operation can be omitted in a DLA read operation if a result of the previous pre-read operation remains.

As shown in FIG. 22, upon receiving a read instruction from an external controller 2 (step S101), the semiconductor memory device 1 checks whether or not data has been written into a memory cell transistor MC(n) to be a read target and its neighboring memory cell transistor MC(n+1) (step S102).

When data has not been written into the memory cell transistor MC(n+1) (step S102_No), the sequencer 15 executes a normal read operation (step S103).

When data has been written into the memory cell transistor MC(n+1) (step S102_Yes), the sequencer 15 starts a DLA read operation (step S104).

The sequencer 15 confirms whether or not the select word line WL of the previous read operation is the same as the select word line WL(n) of the current read operation (step S110).

If the select word line WL of the previous read operation is the same as the select word line WL(n) of the current read operation (step S110_Yes), the sequencer 15 confirms whether or not, for example, data on the previous pre-read operation is stored in the data register 21 (step S111).

If the select word line WL of the previous read operation is not the same as the select word line WL(n) of the current read operation (step S110_No), or if the data on the previous pre-read operation is not stored (step S111_No), the sequencer 15 selects a word line WL(n+1) and performs a pre-read operation (step S105).

After the pre-read operation at step S105 is ended, or when the data on the previous pre-read operation is stored (step S111_Yes), the sequencer 15 selects a word line WL(n) and executes a formal read operation (step S106).

7.2 Voltages of Bit Line and Word Lines in DLA Read Operation

Figure 23:
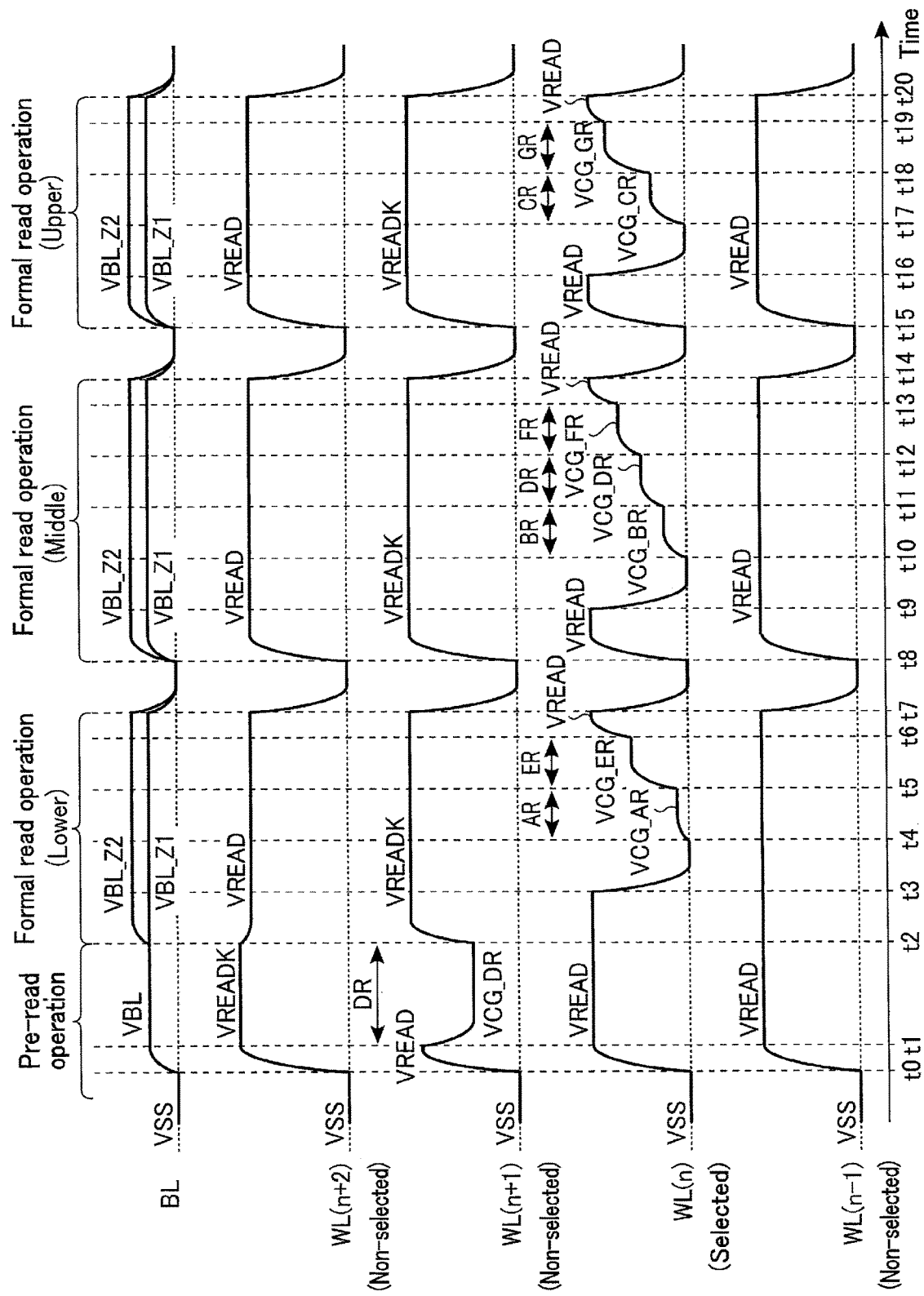
FIG. 23 is a timing chart showing voltages of interconnects during a DLA read operation in the semiconductor memory device according to the seventh embodiment.

Voltages of a bit line BL and word lines WL in a DLA read operation will be described with reference to FIG. 23. FIG. 23 is a timing chart showing voltages of a bit line BL and word lines WL(n−1), WL(n), WL(n+1), and WL(n+2) in a DLA read operation. In the example of FIG. 23, a case is shown where a DLA read operation is performed on a single cell unit CU that is separated into two zones ZN1 and ZN2 in order of the lower page, the middle page, and the upper page. In the present embodiment, a case is shown where, in a formal read operation, the voltage of the bit line BL differs according to the zone ZN; however, the configuration is not limited thereto. For example, the voltage of the word line WL(n+1) may differ according to the zone ZN, as in the first embodiment.

As shown in FIG. 23, a pre-read operation is executed during the period from time t0 to time t2. A formal read operation of the lower page is executed during the period from time t2 to time t7. A formal read operation of the middle page is executed during the period from time t8 to time t14. A formal read operation of the upper page is executed during the period from time t15 to time t20.

The sequencer 15 executes a DLA read operation of the lower page.

The operation during the period from time t0 to time t2 is similar to that in FIG. 14 of the third embodiment.

At time t2, the sense amplifier 20 applies a voltage VBL_Z1 to a bit line BL corresponding to the zone ZN1, and applies a voltage VBL_Z2 to a bit line BL corresponding to the zone ZN2. The row decoder 19 applies a voltage VREAD to the word line WL(n+2), and applies a voltage VREADK to the word line WL(n+1).

At time t3, the row decoder 19 applies a voltage VSS to the word line WL(n). In the present embodiment, a kick operation is omitted by applying a voltage VREAD to the word line WL(n) until time t3.

At time t4, the row decoder 19 applies a read voltage VCG_AR to a selected word line WL(n) in response to an A-state read operation AR. During the period from time t4 to time t5, the sense amplifier 20 executes an A-state read operation AR on the memory cell transistor MC(n) that belongs to the zones ZN1 and ZN2.

At time t5, the row decoder 19 applies a read voltage VCG_ER to a selected word line WL(n) in response to an E-state read operation ER. During the period from time t5 to time t6, the sense amplifier 20 executes an E-state read operation ER on the memory cell transistor MC(n) that belongs to the zones ZN1 and ZN2.

At time t6, the row decoder 19 applies a voltage VREAD to the word line WL(n).

At time t7, a refresh operation is performed. Thereby, a read operation of the lower page ends.

Subsequently, the sequencer 15 executes a DLA read operation of the middle page. In a DLA read operation of the middle page, since zone separation is performed based on the result of a pre-read operation of the lower page, a pre-read operation is omitted.

At time t8, the sense amplifier 20 applies a voltage VBL_Z1 to a bit line BL corresponding to the zone ZN1, and applies a voltage VBL_Z2 to a bit line BL corresponding to the zone ZN2. The row decoder 19 applies a voltage VREAD to the word lines WL(n−1), WL(n), and WL(n+2), and applies a voltage VREADK to the word line WL(n+1).

At time t9, the row decoder 19 applies a voltage VSS to the word line WL(n).

At time t10, the row decoder 19 applies a read voltage VCG_BR (e.g., voltage VB) to a selected word line WL(n) in response to a B-state read operation BR. During the period from time t10 to time t11, the sense amplifier 20 executes a B-state read operation BR on the memory cell transistor MC(n) that belongs to the zones ZN1 and ZN2.

At time t11, the row decoder 19 applies a read voltage VCG_DR to a selected word line WL(n) in response to a D-state read operation DR. During the period from time t11 to time t12, the sense amplifier 20 executes a D-state read operation DR on the memory cell transistor MC(n) that belongs to the zones ZN1 and ZN2.

At time t12, the row decoder 19 applies a read voltage VCG_FR (e.g., voltage VF) to a selected word line WL(n) in response to an F-state read operation FR. During the period from time t12 to time t13, the sense amplifier 20 executes an F-state read operation FR on the memory cell transistor MC(n) that belongs to the zones ZN1 and ZN2.

At time t13, the row decoder 19 applies a voltage VREAD to the word line WL(n).

At time t14, a refresh operation is performed. Thereby, a read operation of the middle page ends.

Thereafter, the sequencer 15 executes a DLA read operation of the upper page. In a DLA read operation of the upper page, since zone separation is performed based on the result of a pre-read operation of the lower page, a pre-read operation is omitted.

At time t15, the sense amplifier 20 applies a voltage VBL_Z1 to a bit line BL corresponding to the zone ZN1, and applies a voltage VBL_Z2 to a bit line BL corresponding to the zone ZN2. The row decoder 19 applies a voltage VREAD to the word lines WL(n−1), WL(n), and WL(n+2), and applies a voltage VREADK to the word line WL(n+1).

At time t16, the row decoder 19 applies a voltage VSS to the word line WL(n).

At time t17, the row decoder 19 applies a read voltage VCG_CR (e.g., voltage VC) to a selected word line WL(n) in response to a C-state read operation CR. During the period from time t17 to time t18, the sense amplifier 20 executes a C-state read operation CR on the memory cell transistor MC(n) that belongs to the zones ZN1 and ZN2.

At time t18, the row decoder 19 applies a read voltage VCG_GR to a selected word line WL(n) in response to a G-state read operation GR. During the period from time t18 to time t19, the sense amplifier 20 executes a G-state read operation GR on the memory cell transistor MC(n) that belongs to the zones ZN1 and ZN2.

At time t19, the row decoder 19 applies a voltage VREAD to the word line WL(n).

At time t20, a refresh operation is performed. Thereby, a read operation of the upper page ends.

7.3 Effects of Present Embodiment

According to the configuration of the present embodiment, it is possible to obtain effects similar to those of the first to sixth embodiments.

8. Eighth Embodiment

Next, an eighth embodiment will be described. In the eighth embodiment, a case will be described where each memory cell transistor MC is a quad-level cell (QLC) capable of storing 16-value (i.e., 4-bit) data. Hereinafter, the description will focus mainly on matters different from those of the first to seventh embodiments.

8.1 Threshold Voltage Distributions of Memory Cell Transistors

Figure 24:
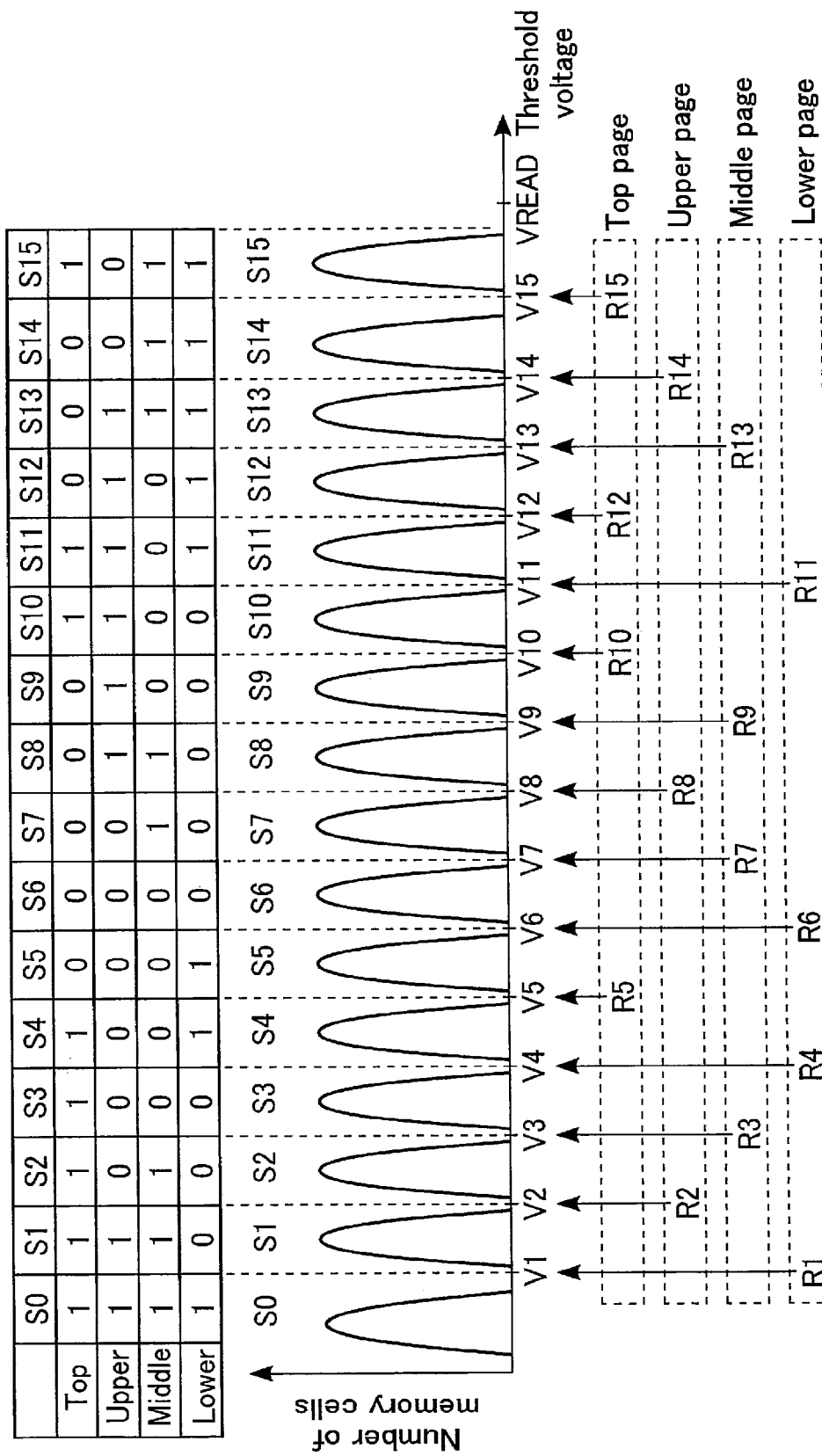
FIG. 24 is a threshold voltage distribution diagram of memory cell transistors included in a semiconductor memory device according to an eighth embodiment.

Threshold voltage distributions that may be observed in memory cell transistors MC will be described with reference to FIG. 24. FIG. 24 is a diagram showing a relationship between threshold voltage distributions of memory cell transistors MC and data allocation.

As shown in FIG. 24, in the case of QLC, there are 16 threshold voltage distributions. The 16 threshold voltage distributions are referred to as, in order from the lower threshold voltage, "S0 state" to "S15 state".

The S0 state corresponds to, for example, an erase state of the memory cell transistor MC. The S1 to S15 states correspond to states in which a charge is injected into the charge storage layer and data is written. Let us assume that, in a write operation, verify voltages corresponding to the respective threshold voltage distributions are V1 to V15. In this case, the values of these voltages satisfy the relation of $V1<V2<V3<V4<V5<V6<V7<V8<V9<V10<V11<V12<V13<V14<V15<VREAD$.

More specifically, a threshold voltage that falls within the S0 state is less than the voltage V1. A threshold voltage that falls within the S1 state is equal to or higher than the voltage V1, and less than the voltage V2. A threshold voltage that falls within the S2 state is equal to or higher than the voltage V2, and less than the voltage V3. A threshold voltage that falls within the S3 state is equal to or higher than the voltage V3, and less than the voltage V4. The threshold voltage that falls within the S4 state is equal to or higher than the voltage V4, and less than the voltage V5. A threshold voltage that falls within the S5 state is equal to or higher than the voltage V5, and less than the voltage V6. A threshold voltage that falls within the S6 state is equal to or higher than the voltage V6, and less than the voltage V7. A threshold voltage that falls within the S7 state is equal to or higher than the voltage V7, and less than the voltage V8. The threshold voltage that falls within the S8 state is equal to or higher than the voltage V8, and less than the voltage V9. The threshold voltage that falls within the S9 state is equal to or higher than the voltage V9, and less than the voltage V10. The threshold voltage that falls within the S10 state is equal to or higher than the voltage V10, and less than the voltage V11. The threshold voltage that falls within the S11 state is equal to or higher than the voltage V11, and less than the voltage V12. The threshold voltage that falls within the S12 state is equal to or higher than the voltage V12, and less than the voltage V13. The threshold voltage that falls within the S13 state is equal to or higher than the voltage V13, and less than the voltage V14. The threshold voltage that falls within the S14 state is equal to or higher than the voltage V14, and less than the voltage V15. A threshold voltage that falls within the S15 state is equal to or higher than the voltage V15, and less than the voltage VREAD.

Setting values for the verify voltages and setting values for the read voltages corresponding to the respective states may be either identical to or different from each other. To simplify the description, a case will be described where the setting values for the verify voltages and the setting values for the read voltages are the same.

Read operations that use the voltages V1 to V15 will be respectively referred to as read operations R1 to R15. In a read operation R1, it is determined whether or not the threshold voltage of the memory cell transistor MC is less than the voltage V1. In a read operation R2, it is determined whether or not the threshold voltage of the memory cell transistor MC is less than the voltage V2. In a read operation R3, it is determined whether or not the threshold voltage of the memory cell transistor MC is less than the voltage V3. The same applies to the other read operations.

In the example of FIG. 24, an unillustrated RD margin is provided between the S0-state threshold voltage distribution and the S1-state threshold voltage distribution. Also, an unillustrated DR margin is provided between the S14-state threshold voltage distribution and the S15-state threshold voltage distribution.

As described above, each memory cell transistor MC belongs to one of the sixteen threshold voltage distributions, thereby taking one of the sixteen states. By assigning these states to "0000" to "1111" in the binary system, each memory cell transistor MC is capable of storing four bits of data. The four bits of data will be respectively referred to as a "lower bit", a "middle bit", an "upper bit", and a "top bit". A set of lower bits that are collectively written into (or read from) a cell unit CU is referred to as a "lower page", a set of middle bits that are collectively written into (or read from) a cell unit CU will be referred to as a "middle page", a set of upper bits that are collectively written into (or read from) a cell unit CU will be referred to as an "upper page", and a set of top bits that are collectively written into (or read from) a cell unit CU will be referred to as a "top page".

In the example of FIG. 24, data is allocated to the top bit, the upper bit, the middle bit, and the lower bit of each of the memory cell transistors MC that belong to one of the states, as shown below.

"S0" state: "1111" data
"S1" state: "1110" data
"S2" state: "1010" data
"S3" state: "1000" data
"S4" state: "1001" data
"S5" state: "0001" data
"S6" state: "0000" data
"S7" state: "0010" data
"S8" state: "0110" data
"S9" state: "0100" data
"S10" state: "1100" data
"S11" state: "1101" data
"S12" state: "0101" data
"S13" state: "0111" data
"S14" state: "0011" data
"S15" state: "1011" data Data allocated to the respective states is not limited thereto.

When data allocated in the above manner is read, the lower bit is determined by read operations of the states including "S1", "S4", "S6", and "S11", namely, read operations R1, R4, R6, and R11. The middle bit is determined by read operations of states including "S3", "S7", "S9", and "S13", namely, read operations R3, R7, R9, and R13. The upper bit is determined by read operations of states including "S2", "S8", and "S14", namely, read operations R2, R8, and R14. The top bit is determined by read operations of states including "S5", "S10", "S12", and "S15", namely, read operations R5, R10, R12, and R15. That is, the values of the lower bit, the middle bit, the upper bit, and the top bit are determined by four read operations, four read operations, three read operations, and four read operations, respectively. Hereinafter, such data allocation will be referred to as "4-4-3-4 coding".

8.2 Shift of Threshold Voltage Due to Neighboring Word Line Interference

Next, a shift of a threshold voltage due to neighboring word line interference will be described with reference to FIG. 25.

Figure 25:
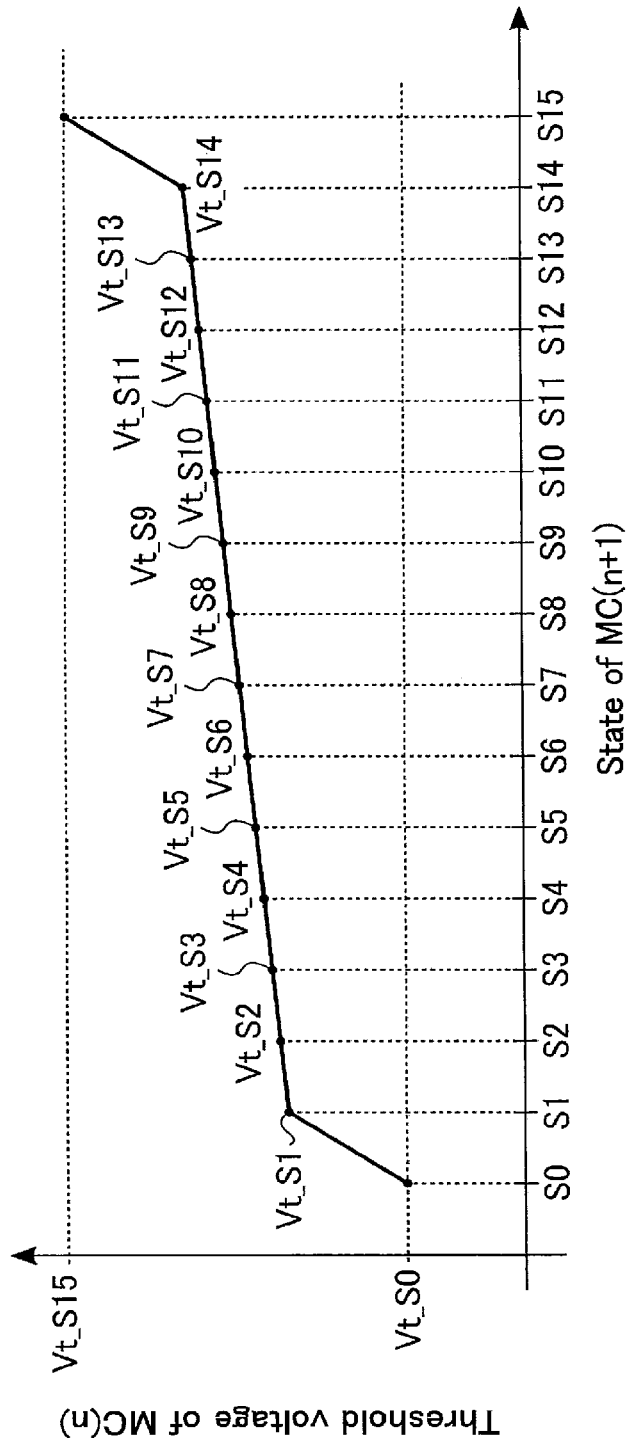
FIG. 25 is a graph illustrating a threshold voltage shift, due to neighboring word line interference, of a memory cell transistor included in the semiconductor memory device according to the eighth embodiment.

FIG. 25 is a graph showing a relationship between a median value of a threshold voltage of a memory cell transistor MC(n) that is shifted by neighboring word line interference and a state of its neighboring memory cell transistor MC(n+1).

As shown in FIG. 25, the threshold voltage of the memory cell transistor MC(n) has a tendency to increase as the threshold voltage (namely, the state) of the memory cell transistor MC(n+1) increases, because of the neighboring word line interference.

Let us assume, for example, that the threshold voltage of the memory cell transistor MC(n) when the memory cell transistor MC(n+1) belongs to the S0 to S15 states will be respectively referred to as "Vt_S0" to "Vt_S15". In this case, these threshold voltages satisfy the relation of Vt_S0<Vt_S1<<Vt_S3<Vt_S4<Vt_S5<Vt_S6<Vt_S7< Vt_S8<Vt_S9<Vt_S10<Vt_S11<Vt_S12<Vt_S13<Vt_S14<Vt_S15. Accordingly, a variation in threshold voltage of the memory cell transistor MC(n) due to the neighboring word line interference is expressed by (Vt_S15)−(Vt_S0).

8.3 Zone Separation

Figure 26:
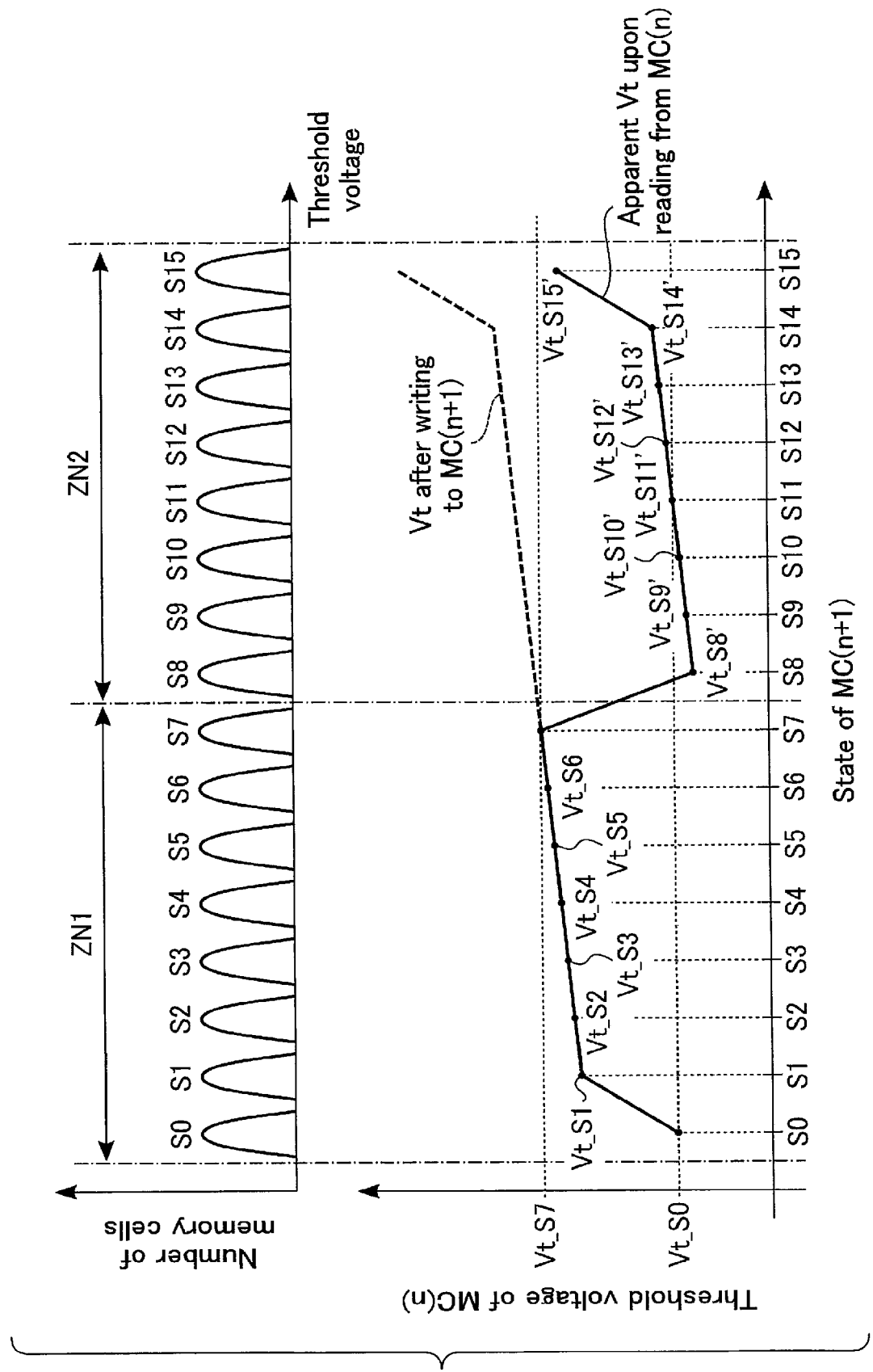
FIG. 26 shows a relationship between a zone and an apparent threshold voltage of a memory cell transistor during a DLA read operation in the semiconductor memory device according to the eighth embodiment.

Next, an example of zone separation will be described with reference to FIG. 26. FIG. 26 shows a relationship between a zone ZN and an apparent threshold voltage of a memory cell transistor MC(n) in a DLA read operation.

As shown in FIG. 26, in the present embodiment, memory cell transistors MC(n) to be read targets are separated into two zones ZN according to the state of their neighboring memory cell transistors MC(n+1). More specifically, the memory cell transistor MC(n) whose neighboring memory cell transistor MC(n+1) belongs to one of the S0 to S7 states is included in the zone ZN1. A memory cell transistor MC(n) whose neighboring memory cell transistor MC(n+1) belongs to one of the S8 to S15 states is included in a zone ZN2.

Let us assume that apparent threshold voltages of memory cell transistors MC(n) in the zone ZN2 corresponding to memory cell transistors MC(n+1) that belong to the S8 to S15 states are Vt_S8' to Vt_S15', respectively. In this case, the threshold voltages Vt_S8 and Vt_S8' satisfy the relation of Vt_S8'<Vt_S8. The threshold voltages Vt_S9 and Vt_S9' satisfy the relation of Vt_S9'<Vt_S9. The threshold voltages Vt_S10 and Vt_S10' satisfy the relation of Vt_S10'<Vt_S10. The threshold voltages Vt_S11 and Vt_S11' satisfy the relation of Vt_S11'<Vt_S11 The threshold voltages Vt_S12 and Vt_S12' satisfy the relation of Vt_S12'<Vt_S12. The threshold voltages Vt_S13 and Vt_S13' satisfy the relation of Vt_S13'<Vt_S13. The threshold voltages Vt_S14 and Vt_S14' satisfy the relation of Vt_S14'<Vt_S14. The threshold voltages Vt_S15 and Vt_S15' satisfy the relation of Vt_S15'<Vt_S15. Also, the threshold voltages Vt_S8' to Vt_S15' satisfy the relation of Vt_S8'<Vt_S9'<Vt_S10'<Vt_S11'<Vt_S12'<Vt_S13'<Vt_S14'<Vt_S15'.

Read conditions for the zone ZN2 are set in such a manner that the lowest threshold voltage Vt_S8' (reference point) in the zone ZN2 becomes lower than the threshold voltage Vt_S0 in the zone ZN1, and the highest threshold voltage Vt_S15' in the zone ZN2 becomes lower than the highest threshold voltage Vt_S7 in the zone ZN1, taking into account fluctuations in threshold voltage due to a read disturb and data retention. That is, the lower limit value of a read voltage of a memory cell transistor MC(n) whose neighboring memory cell transistor MC(n+1) belongs to the S8 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S7 state.

8.4 Effects of Present Embodiment

According to the configuration of the present embodiment, it is possible to obtain effects similar to those of the first to seventh embodiments.

9. Ninth Embodiment

Next, a ninth embodiment will be described. In the ninth embodiment, six examples of zone separation will be described. Hereinafter, the description will focus mainly on matters different from those of the eighth embodiment.

9.1 First Example

Figure 27:
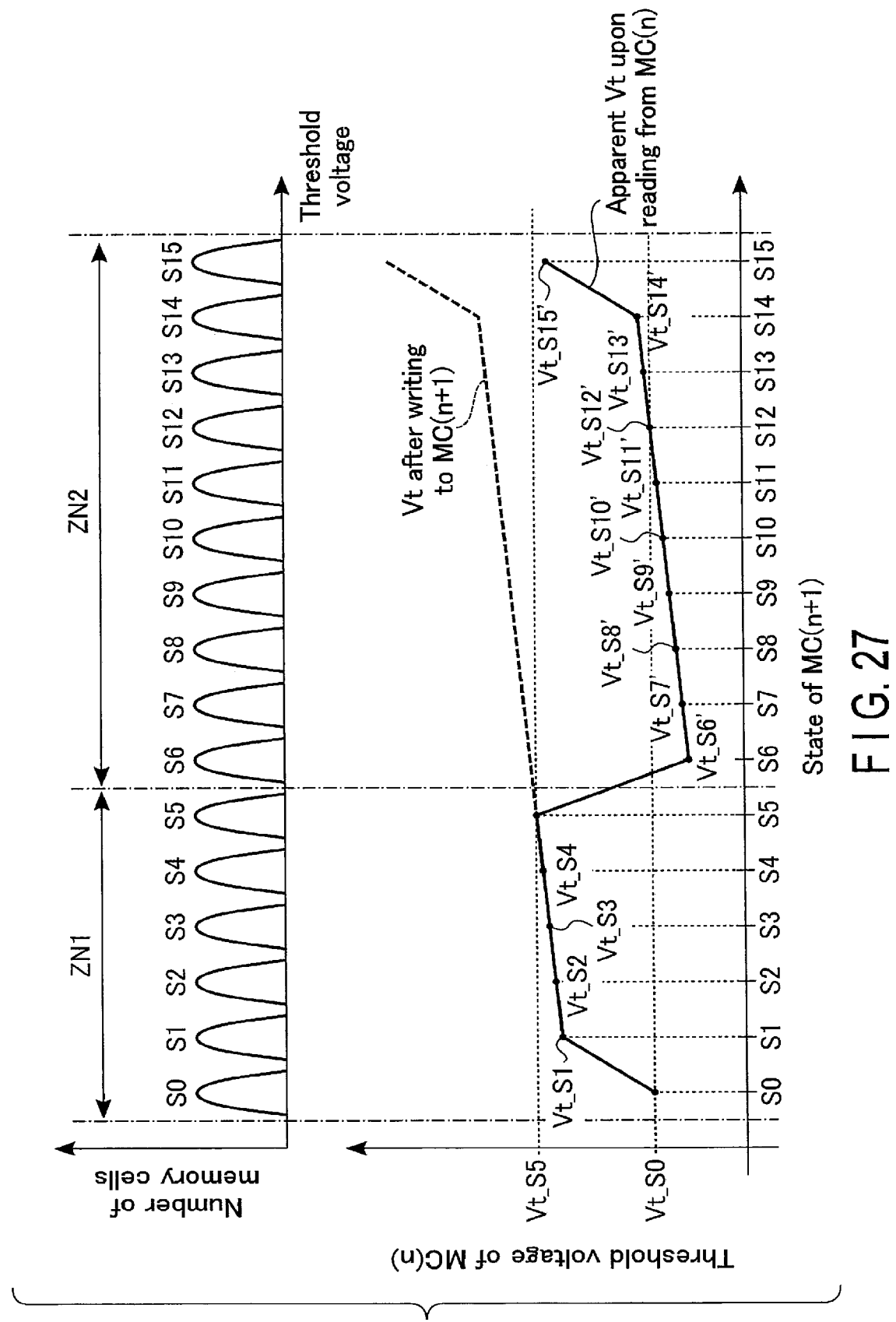
FIG. 27 shows a relationship between a zone and an apparent threshold voltage of a memory cell transistor during a DLA read operation in a semiconductor memory device according to a first example of the ninth embodiment.

Zone separation according to a first example will be described with reference to FIG. 27. FIG. 27 shows a relationship between a zone ZN and an apparent threshold voltage of a memory cell transistor MC(n) in a DLA read operation.

As shown in FIG. 27, in the present example, a memory cell transistor MC(n) whose neighboring memory cell transistor MC(n+1) belongs to one of the S0 to S5 states is included in a zone ZN1. A memory cell transistor MC(n) whose neighboring memory cell transistor MC(n+1) belongs to one of the S6 to S15 states is included in a zone ZN2.

Let us assume that apparent threshold voltages of memory cell transistors MC(n) in the zone ZN2 corresponding to memory cell transistors MC(n+1) that belong to the S6 and S7 states are Vt_S6' and Vt_S7', respectively. In this case, the threshold voltages Vt_S6 and Vt_S6' satisfy the relation of Vt_S6'<Vt_S6. The threshold voltages Vt_S7 and Vt_S7' satisfy the relation of Vt_S7'<Vt_S7. The threshold voltages Vt_S6' to Vt_S15' satisfy the relation of Vt_S6'<Vt_S7'<Vt_S8'<Vt_S15'. Also, in the present example, read conditions for the zone ZN2 are set in such a manner that the lowest threshold voltage Vt_S6' (reference point) in the zone ZN2 takes a value lower than the lowest threshold voltage Vt_S0 in the zone ZN1, and the highest threshold voltage Vt_S15' in the zone ZN2 takes a value lower than the highest threshold voltage Vt_S5 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S6 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S5 state.

9.2 Second Example

Figure 28:
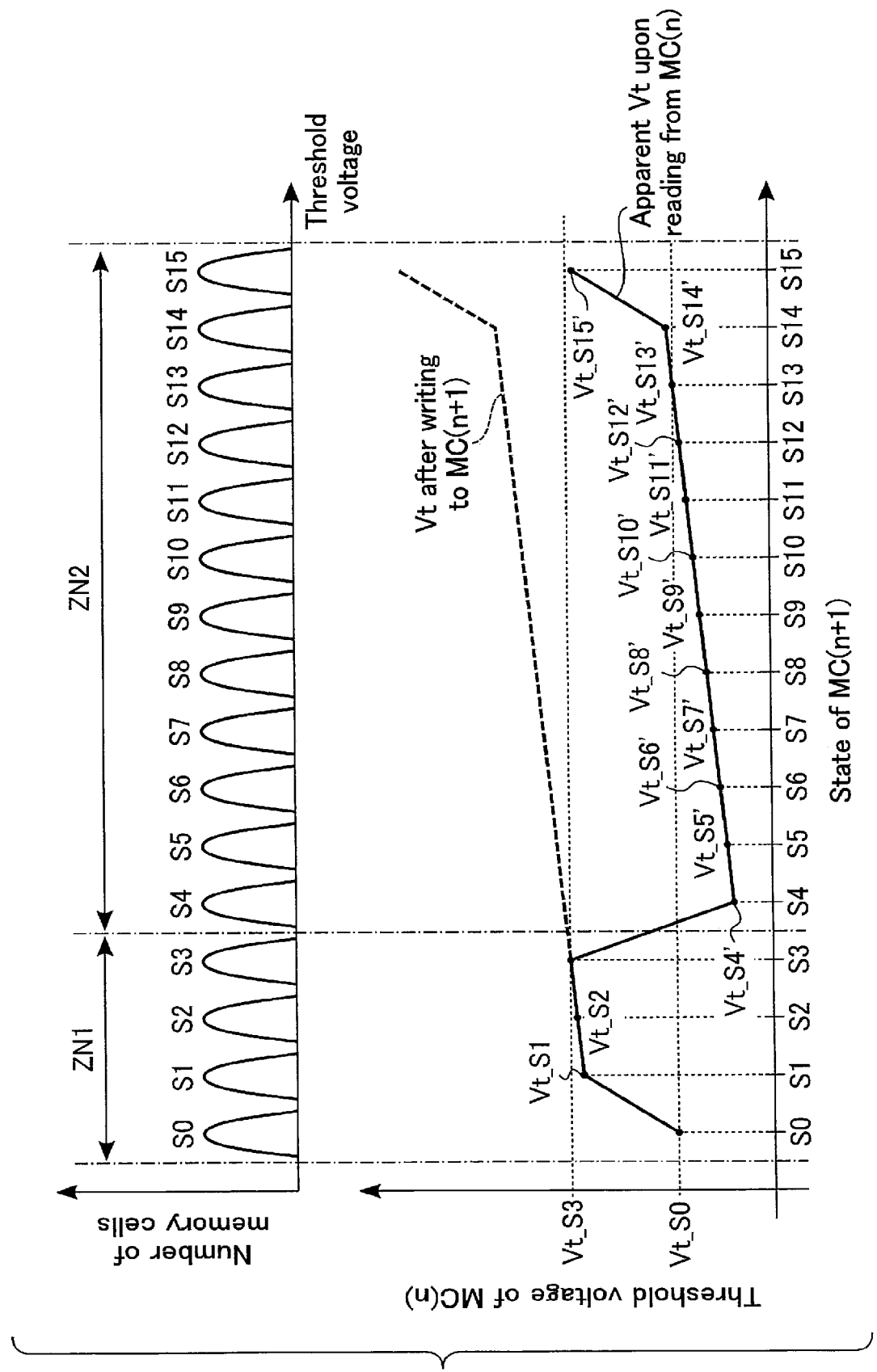
FIG. 28 shows a relationship between a zone and an apparent threshold voltage of a memory cell transistor during a DLA read operation in a semiconductor memory device according to a second example of the ninth embodiment.

Next, zone separation according to a second example will be described with reference to FIG. 28. FIG. 28 shows a relationship between a zone ZN and an apparent threshold voltage of a memory cell transistor MC(n) in a DLA read operation.

As shown in FIG. 28, in the present example, a memory cell transistor MC(n) whose neighboring memory cell transistor MC(n+1) belongs to one of the S0 to S3 states is included in a zone ZN1. A memory cell transistor MC(n) whose neighboring memory cell transistor MC(n+1) belongs to one of the S4 to S15 states is included in a zone ZN2.

Let us assume that apparent threshold voltages of memory cell transistors MC(n) in the zone ZN2 corresponding to memory cell transistors MC(n+1) that belong to the S4 to S5 states are Vt_S4' to Vt_S5', respectively. In this case, the threshold voltages Vt_S4 and Vt_S4' satisfy the relation of Vt_S4'<Vt_S4. The threshold voltages Vt_S5 and Vt_S5' satisfy the relation of Vt_S5'<Vt_S5. The threshold voltages Vt_S4' to Vt_S15' satisfy the relation of Vt_S4'<Vt_S5'<Vt_S6'<<Vt_S15' Also, in the present example, read conditions for the zone ZN2 are set in such a manner that the lowest threshold voltage Vt_S4' (reference point) in the zone ZN2 takes a value lower than the lowest threshold voltage Vt_S0 in the zone ZN1, and the highest threshold voltage Vt_S15' in the zone ZN2 takes a value lower than the highest threshold voltage Vt_S3 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S4 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S3 state.

9.3 Third Example

Figure 29:
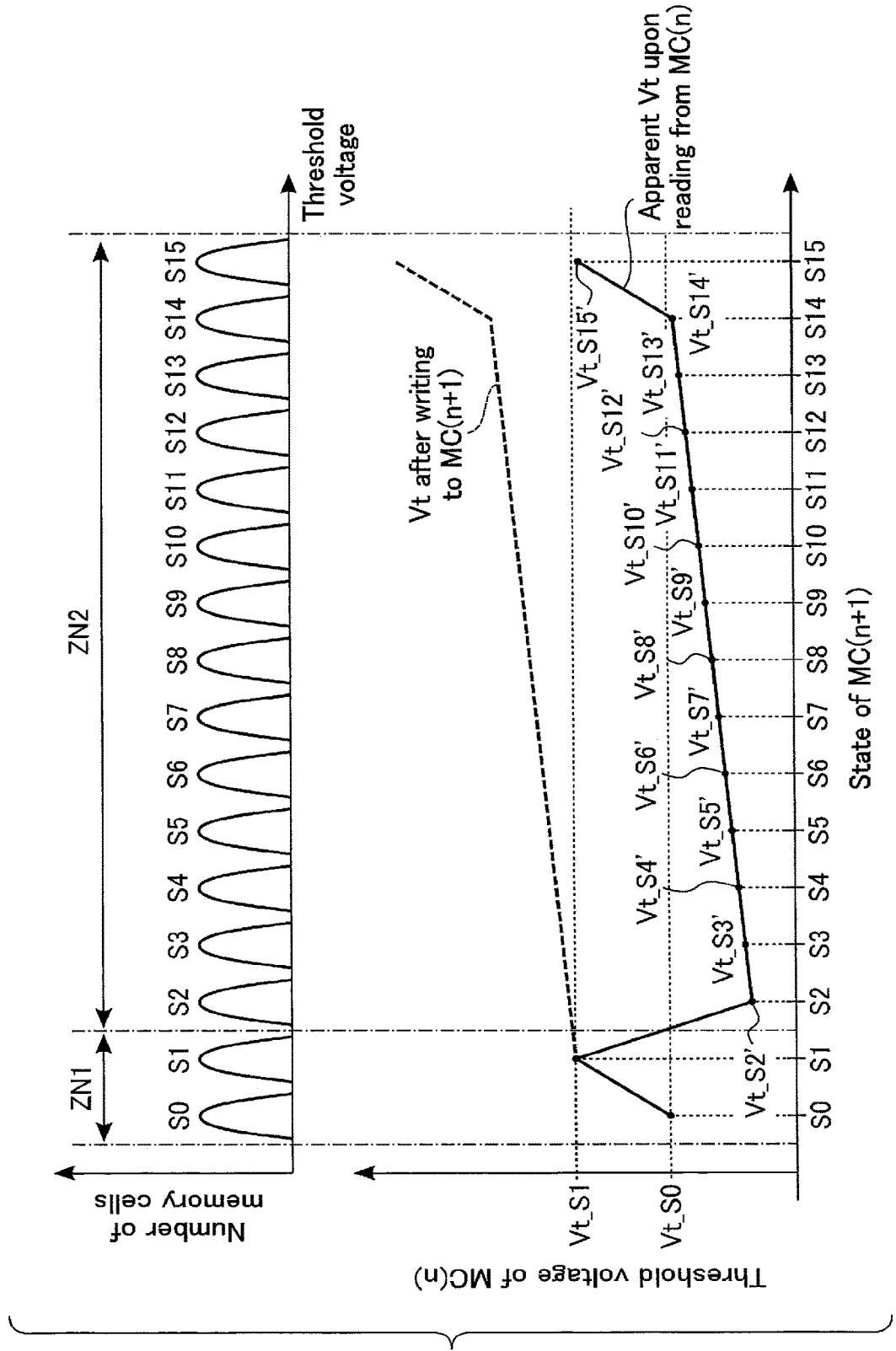
FIG. 29 shows a relationship between a zone and an apparent threshold voltage of a memory cell transistor during a DLA read operation in a semiconductor memory device according to a third example of the ninth embodiment.

Next, zone separation according to a third example will be described with reference to FIG. 29. FIG. 29 shows a relationship between a zone ZN and an apparent threshold voltage of a memory cell transistor MC(n) in a DLA read operation.

As shown in FIG. 29, in the present example, a memory cell transistor MC(n) whose neighboring memory cell transistor MC(n+1) belongs to the S0 state or the S1 state is included in a zone ZN1. A memory cell transistor MC(n) whose neighboring memory cell transistor MC(n+1) belongs to one of the S2 to S15 states is included in a zone ZN2.

Let us assume that apparent threshold voltages of memory cell transistors MC(n) in the zone ZN2 corresponding to memory cell transistors MC(n+1) that belong to the S2 and S3 states are Vt_S2' to Vt_S3', respectively. In this case, the threshold voltages Vt_S2 and Vt_S2' satisfy the relation of Vt_S2'<Vt_S2. The threshold voltages Vt_S3 and Vt_S3' satisfy the relation of Vt_S3'<Vt_S3. The threshold voltages Vt_S2' to Vt_S15' satisfy the relation of Vt_S2'<Vt_S3'<Vt_S4'< . . . <Vt_S15'. Also, in the present example, read conditions for the zone ZN2 are set in such a manner that the lowest threshold voltage Vt_S2' (reference point) in the zone ZN2 takes a value lower than the lowest threshold voltage Vt_S0 in the zone ZN1, and the highest threshold voltage Vt_S15' in the zone ZN2 takes a value lower than the highest threshold voltage Vt_S1 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S2 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S1 state.

9.4 Fourth Example

Figure 30:
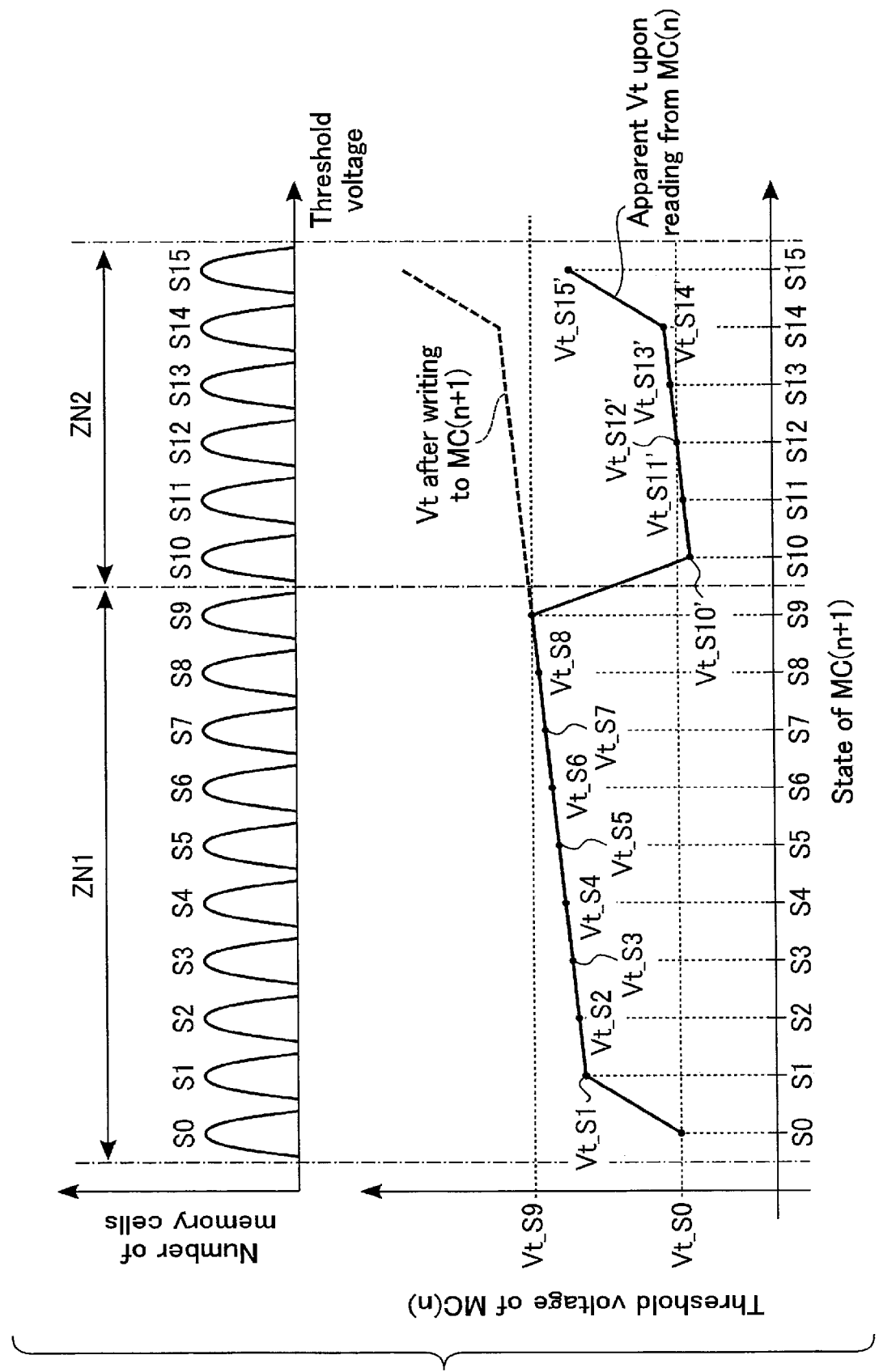
FIG. 30 shows a relationship between a zone and an apparent threshold voltage of a memory cell transistor during a DLA read operation in a semiconductor memory device according to a fourth example of the ninth embodiment.

Next, zone separation according to a fourth example will be described with reference to FIG. 30. FIG. 30 shows a relationship between a zone ZN and an apparent threshold voltage of a memory cell transistor MC(n) in a DLA read operation.

As shown in FIG. 30, in the present example, a memory cell transistor MC(n) whose neighboring memory cell transistor MC(n+1) belongs to one of the S0 to S9 states is included in a zone ZN1. A memory cell transistor MC(n) whose neighboring memory cell transistor MC(n+1) belongs to one of the S10 to S15 states is included in a zone ZN2.

In the present example, read conditions for the zone ZN2 are set in such a manner that the lowest threshold voltage Vt_S10' (reference point) in the zone ZN2 takes a value lower than the lowest threshold voltage Vt_S0 in the zone ZN1, and the highest threshold voltage Vt_S15' in the zone ZN2 takes a value lower than the highest threshold voltage Vt_S9 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S10 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S9 state.

9.5 Fifth Example

Figure 31:
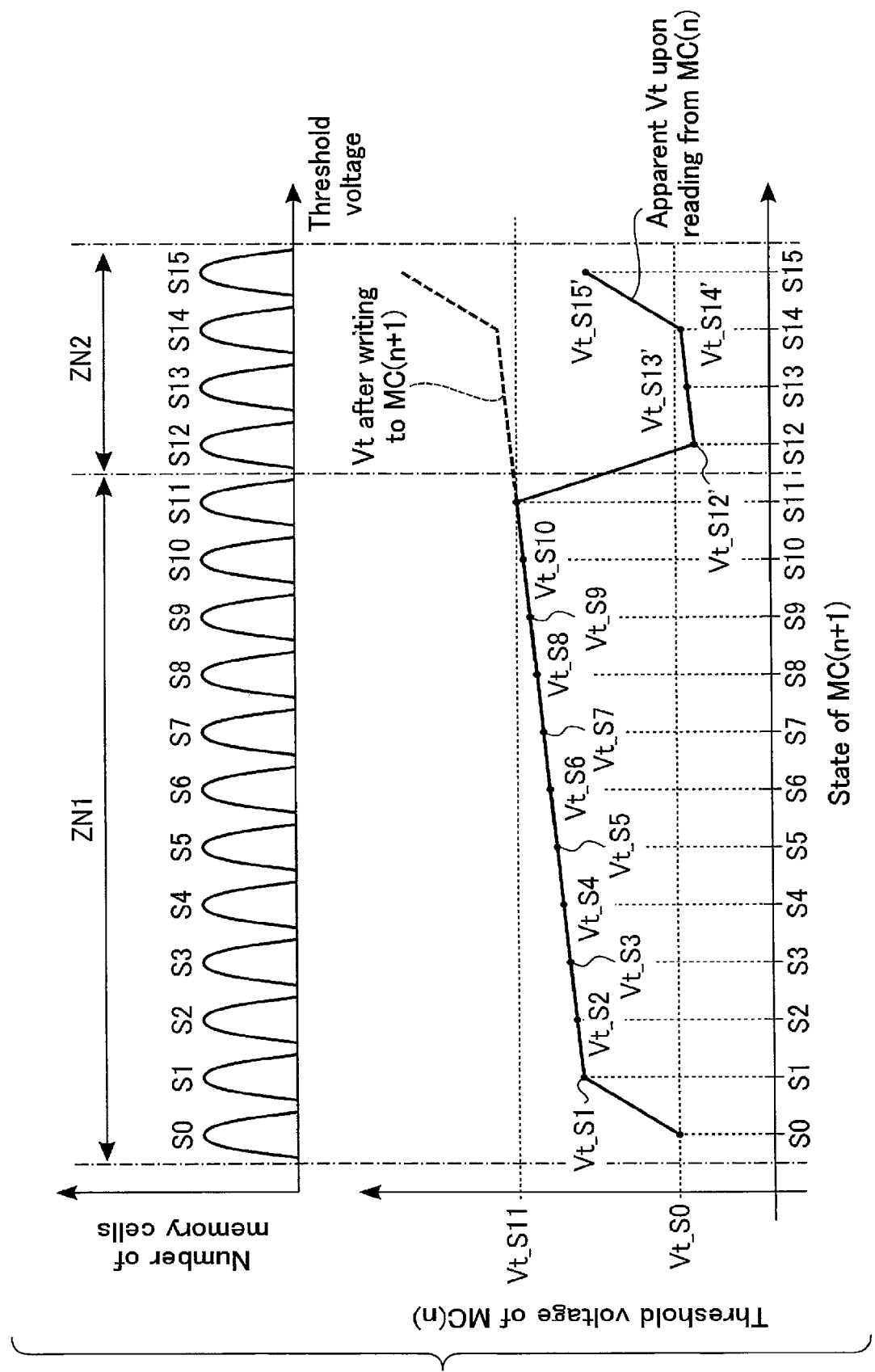
FIG. 31 shows a relationship between a zone and an apparent threshold voltage of a memory cell transistor during a DLA read operation in a semiconductor memory device according to a fifth example of the ninth embodiment.

Next, zone separation according to a fifth example will be described with reference to FIG. 31. FIG. 31 shows a relationship between a zone ZN and an apparent threshold voltage of a memory cell transistor MC(n) in a DLA read operation.

As shown in FIG. 31, in the present example, a memory cell transistor MC(n) whose neighboring memory cell transistor MC(n+1) belongs to one of the S0 to S11 states is included in a zone ZN1. A memory cell transistor MC(n) whose neighboring memory cell transistor MC(n+1) belongs to one of the S12 to S15 states is included in a zone ZN2.

In the present example, read conditions for the zone ZN2 are set in such a manner that the lowest threshold voltage Vt_S12' (reference point) in the zone ZN2 takes a value lower than the lowest threshold voltage Vt_S0 in the zone ZN1, and the highest threshold voltage Vt_S15' in the zone ZN2 takes a value lower than the highest threshold voltage Vt_S11 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S12 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S11 state.

9.6 Sixth Example

Figure 32:
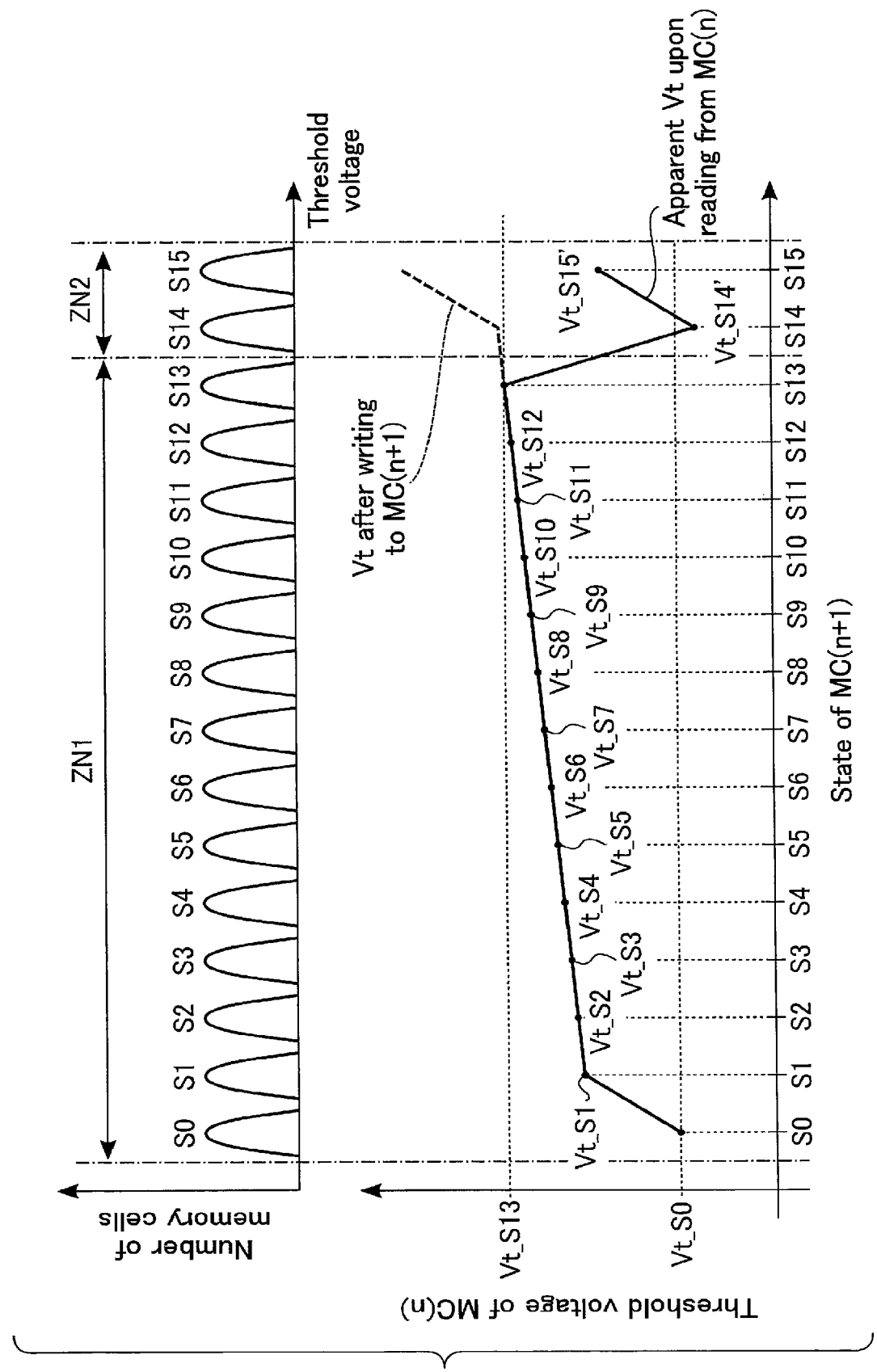
FIG. 32 shows a relationship between a zone and an apparent threshold voltage of a memory cell transistor during a DLA read operation in a semiconductor memory device according to a sixth example of the ninth embodiment.

Next, zone separation according to a sixth example will be described with reference to FIG. 32. FIG. 32 shows a relationship between a zone ZN and an apparent threshold voltage of a memory cell transistor MC(n) in a DLA read operation.

As shown in FIG. 32, in the present example, a memory cell transistor MC(n) whose neighboring memory cell transistor MC(n+1) belongs to one of the S0 to S13 states is included in a zone ZN1. A memory cell transistor MC(n) whose neighboring memory cell transistor MC(n+1) belongs to the S14 state or the S15 state is included in a zone ZN2.

In the present example, read conditions for the zone ZN2 are set in such a manner that the lowest threshold voltage Vt_S14' (reference point) in the zone ZN2 takes a value lower than the lowest threshold voltage Vt_S1 in the zone ZN1, and the highest threshold voltage Vt_S15' in the zone ZN2 takes a value lower than the highest threshold voltage Vt_S13 in the zone ZN1, taking into account fluctuations in threshold voltage due to a read disturb and data retention.

That is, the lower limit value of a read voltage of a memory cell transistor MC(n) whose neighboring memory cell transistor MC(n+1) belongs to the S14 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S13 state.

9.7 Effects of Present Embodiment

According to the configuration of the present embodiment, it is possible to obtain effects similar to those of the first to eighth embodiments.

Zone separation of QLC is not limited to those described in the eighth embodiment and the first to sixth examples of the ninth embodiment. For example, a memory cell transistor MC(n) whose neighboring memory cell transistor MC(n+1) belongs to the S0 state may be included in a zone ZN1. In this case, a memory cell transistor MC(n) whose neighboring memory cell transistor MC(n+1) belongs to one of the S1 to S15 states is included in a zone ZN2.

10. Tenth Embodiment

Next, a tenth embodiment will be described. In the tenth embodiment, three examples will be described with respect to the case where QLC is separated into four zones ZN. Hereinafter, the description will focus mainly on matters different from those of the first to ninth embodiments.

10.1 First Example

Figure 33:
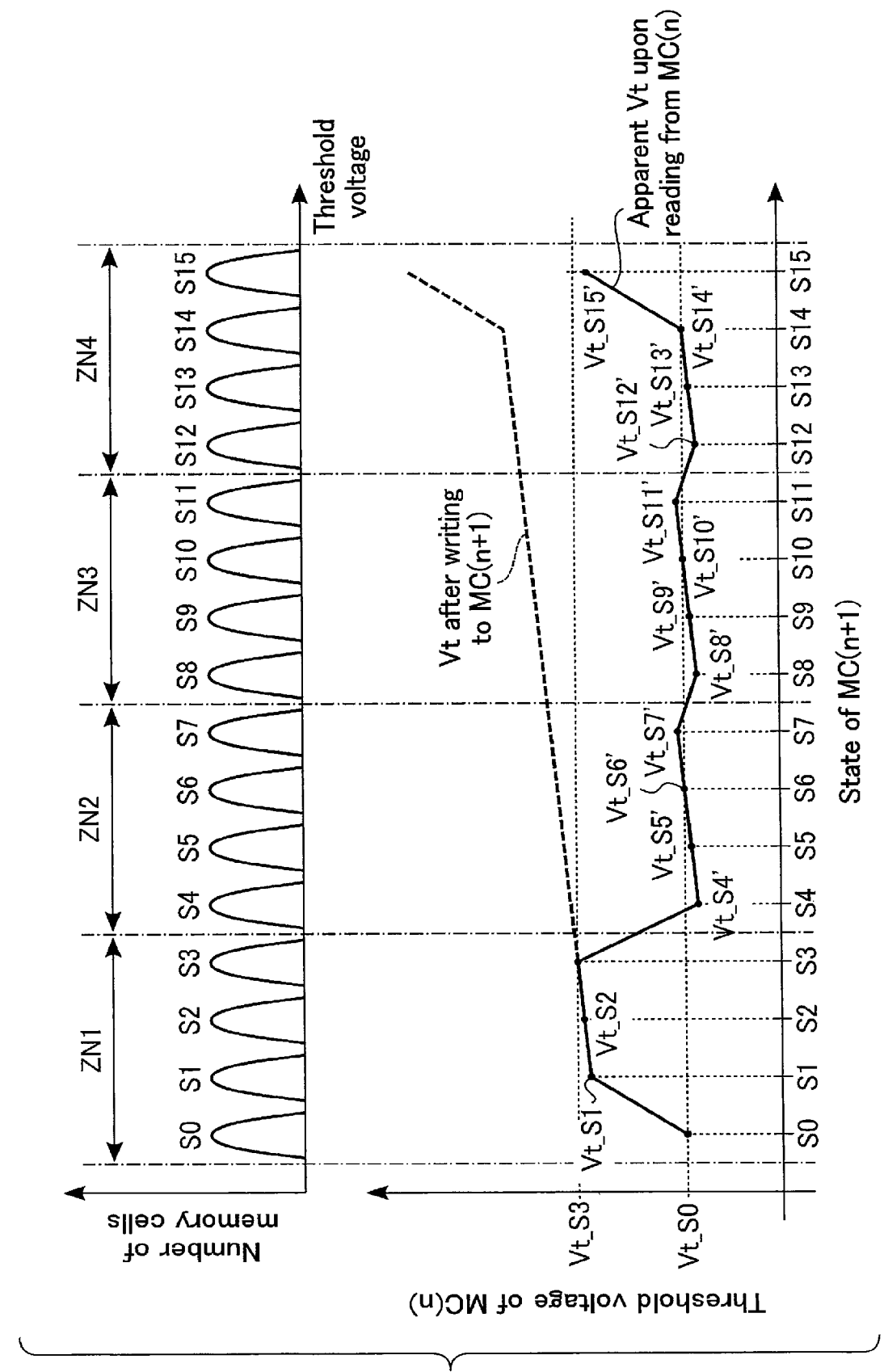
FIG. 33 shows a relationship between a zone and an apparent threshold voltage of a memory cell transistor during a DLA read operation in a semiconductor memory device according to a first example of the tenth embodiment.

Zone separation according to a first example will be described with reference to FIG. 33. FIG. 33 shows a relationship between a zone ZN and an apparent threshold voltage of a memory cell transistor MC(n) in a DLA read operation.

As shown in FIG. 33, in the present example, memory cell transistors MC(n) to be read targets are separated into four zones ZN according to the state of the neighboring memory cell transistors MC(n+1). More specifically, a memory cell transistor MC(n) whose neighboring memory cell transistor MC(n+1) belongs to one of the S0 to S3 states is included in a zone ZN1. A memory cell transistor MC(n) whose neighboring memory cell transistor MC(n+1) belongs to one of the S4 to S7 states is included in a zone ZN2. A memory cell transistor MC(n) whose neighboring memory cell transistor MC(n+1) belongs to one of the S8 to S11 states is included in a zone ZN3. A memory cell transistor MC(n) whose neighboring memory cell transistor MC(n+1) belongs to one of the S12 to S15 states is included in a zone ZN4.

In the zone ZN2, read conditions for the zone ZN2 are set in such a manner that the lowest threshold voltage Vt_S4' (reference point) becomes lower than the threshold voltage Vt_S0 in the zone ZN1. That is, the lower limit value of a read voltage of a memory cell transistor MC(n) whose neighboring memory cell transistor MC(n+1) belongs to the S4 state is lower than a lower limit value of a read voltage of a memory cell transistor MC(n) whose neighboring memory cell transistor MC(n+1) belongs to the S0 state.

Read conditions for the zone ZN3 are set in such a manner that the lowest threshold voltage Vt_S8' (reference point) in the zone ZN3 becomes lower than the threshold voltage Vt_S0 in the zone ZN1. That is, the lower limit value of a read voltage of a memory cell transistor MC(n) whose neighboring memory cell transistor MC(n+1) belongs to the S8 state is lower than a lower limit value of a read voltage of a memory cell transistor MC(n) whose neighboring memory cell transistor MC(n+1) belongs to the S0 state.

Read conditions for the zone ZN4 are set in such a manner that the lowest threshold voltage Vt_S12' (reference point) in the zone ZN4 becomes lower than the threshold voltage Vt_S0 in the zone ZN1, and that the threshold voltage Vt_S15' becomes lower than the threshold voltage Vt_S3 in the zone ZN1. That is, the lower limit value of a read voltage of a memory cell transistor MC(n) whose neighboring memory cell transistor MC(n+1) belongs to the S12 state is lower than a lower limit value of a read voltage of a memory cell transistor MC(n) whose neighboring memory cell transistor MC(n+1) belongs to the S0 state. Also, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S3 state.

10.2 Second Example

Figure 34:
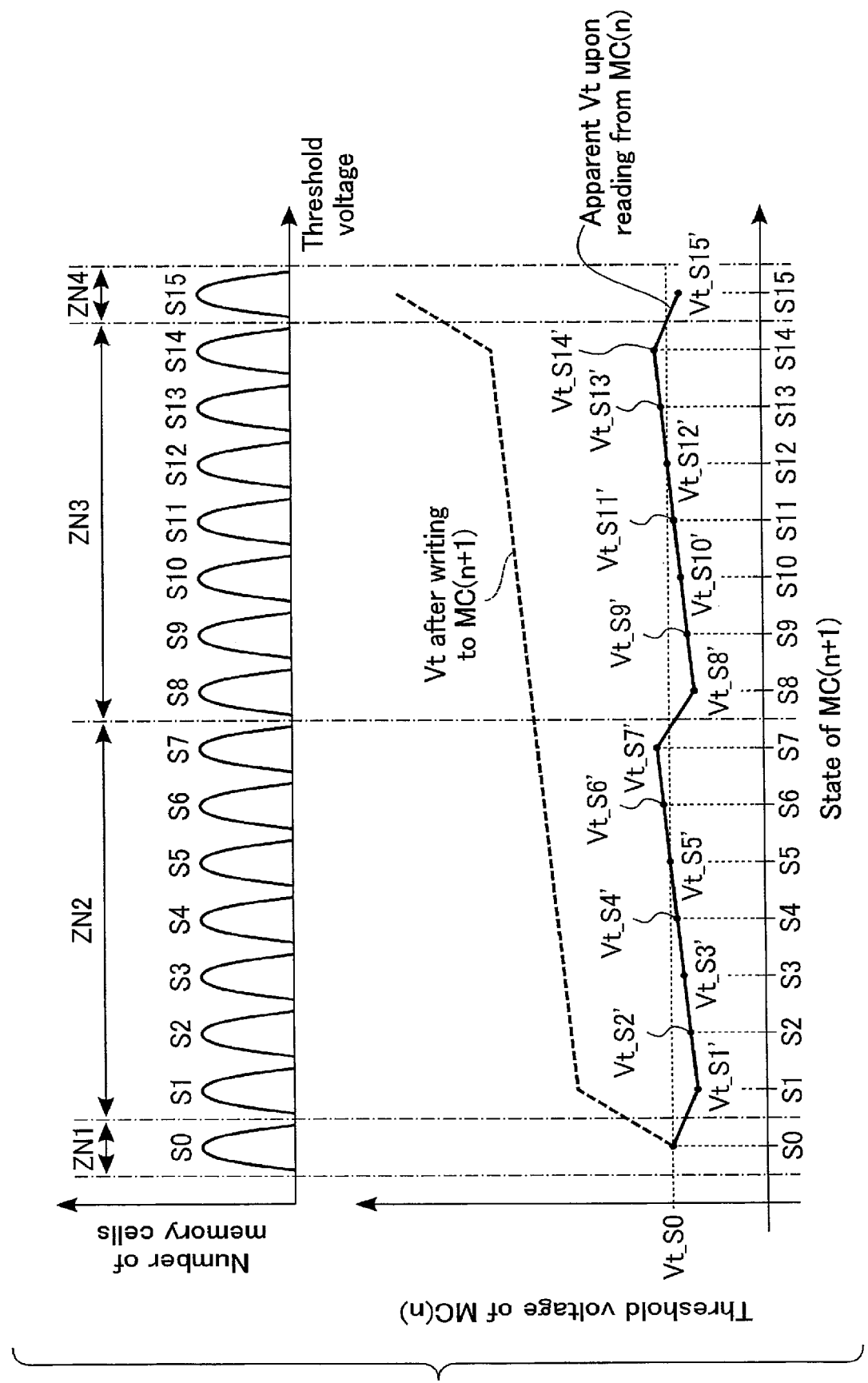
FIG. 34 shows a relationship between a zone and an apparent threshold voltage of a memory cell transistor during a DLA read operation in a semiconductor memory device according to a second example of the tenth embodiment.

Zone separation according to a second example will be described with reference to FIG. 34. FIG. 34 shows a relationship between a zone ZN and an apparent threshold voltage of a memory cell transistor MC(n) in a DLA read operation.

As shown in FIG. 34, in the present example, a memory cell transistor MC(n) whose neighboring memory cell transistor MC(n+1) belongs to the S0 state is included in a zone ZN1. A memory cell transistor MC(n) whose neighboring memory cell transistor MC(n+1) belongs to one of the S1 to S7 states is included in a zone ZN2. A memory cell transistor MC(n) whose neighboring memory cell transistor MC(n+1)

belongs to one of the S8 to S14 states is included in a zone ZN3. A memory cell transistor MC(n) whose neighboring memory cell transistor MC(n+1) belongs to the S15 state is included in a zone ZN4.

Let us assume that an apparent threshold voltage of a memory cell transistor MC(n) in the zone ZN2 corresponding to a memory cell transistor MC(n+1) that belongs to the S1 state is Vt_S1'. In this case, the threshold voltages Vt_S1 and Vt_S1' satisfy the relation of Vt_S1'<Vt_S1. The threshold voltages Vt_S1' to Vt_S15' satisfy the relation of Vt_S1'<Vt_S2'< . . . <Vt_S15'. Moreover, in the present example, read conditions for the zone ZN2 are set in such a manner that the lowest threshold voltage Vt_S1' (reference point) becomes lower than the threshold voltage Vt_S0 in the zone ZN1, and the highest threshold voltage Vt_S7' becomes higher than the threshold voltage Vt_S0.

That is, the lower limit value of a read voltage of a memory cell transistor MC(n) whose neighboring memory cell transistor MC(n+1) belongs to the S1 state is lower than a lower limit value of a read voltage of a memory cell transistor MC(n) whose neighboring memory cell transistor MC(n+1) belongs to the S0 state. The lower limit value of a read voltage of a memory cell transistor MC(n) whose neighboring memory cell transistor MC(n+1) belongs to the S7 state is higher than a lower limit value of a read voltage of a memory cell transistor MC(n) whose neighboring memory cell transistor MC(n+1) belongs to the S0 state.

Read conditions for the zone ZN3 are set in such a manner that, in the zone ZN3, the lowest threshold voltage Vt_S8' (reference point) becomes lower than the threshold voltage Vt_S0 in the zone ZN1, and the highest threshold voltage Vt_S14' becomes higher than the threshold voltage Vt_S0.

That is, the lower limit value of a read voltage of a memory cell transistor MC(n) whose neighboring memory cell transistor MC(n+1) belongs to the S8 state is lower than a lower limit value of a read voltage of a memory cell transistor MC(n) whose neighboring memory cell transistor MC(n+1) belongs to the S0 state. The lower limit value of a read voltage of a memory cell transistor MC(n) whose neighboring memory cell transistor MC(n+1) belongs to the S14 state is higher than a lower limit value of a read voltage of a memory cell transistor MC(n) whose neighboring memory cell transistor MC(n+1) belongs to the S0 state.

Read conditions for the zone ZN4 are set in such a manner that the threshold voltage Vt_S15' (reference point) in the zone ZN4 becomes higher than the threshold voltage Vt_S1' in the zone ZN2 or the threshold voltage Vt_S8' in the zone ZN3, and lower than the threshold voltage Vt_S7' in the zone ZN2 or the threshold voltage Vt_S14' in the zone ZN3.

That is, the lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S1 state or the S8 state and lower than a lower limit value of a read voltage of a memory cell transistor MC(n) whose neighboring memory cell transistor MC(n+1) belongs to the S7 state and or the S14 state.

10.3 Third Example

Figure 35:
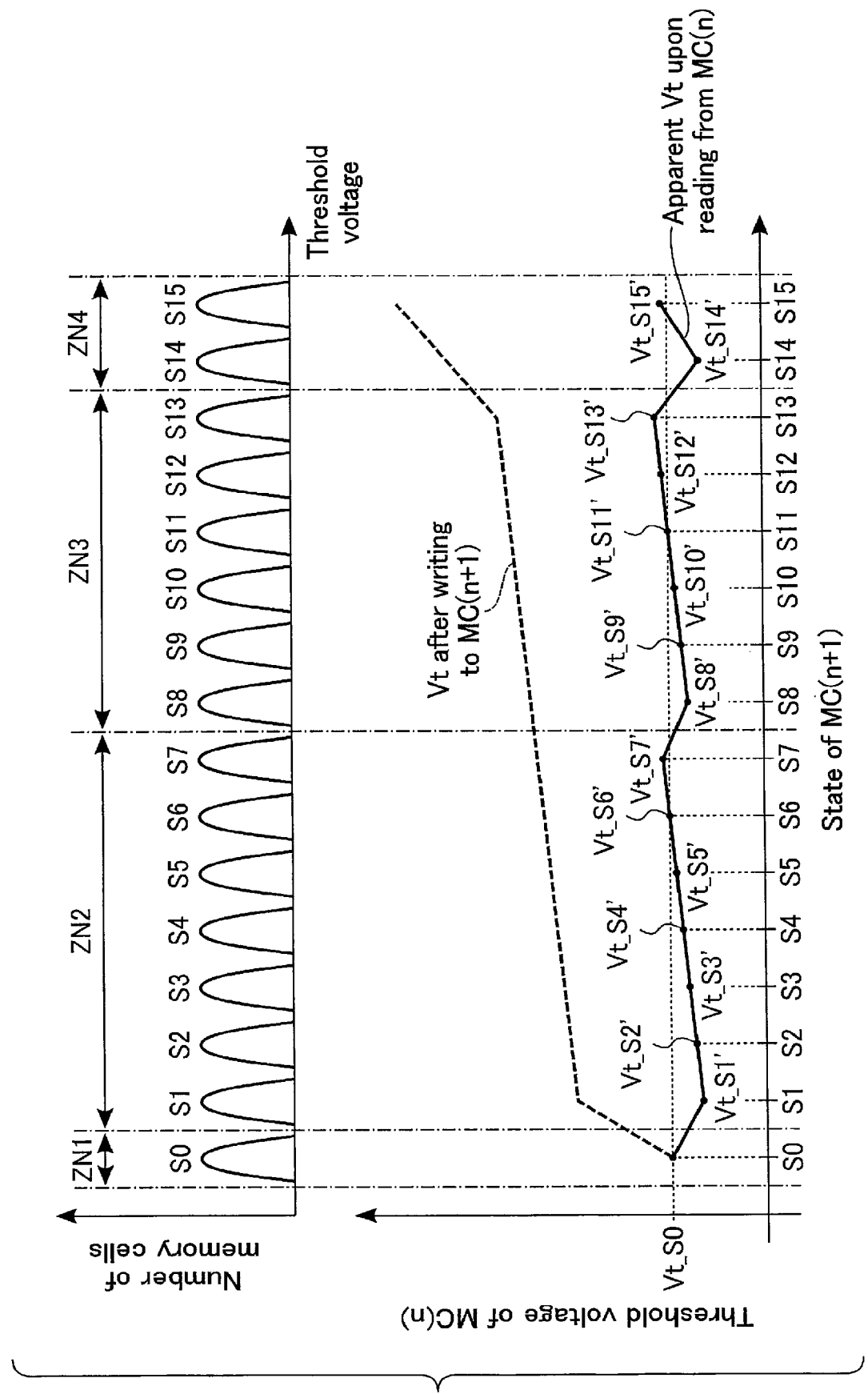
FIG. 35 shows a relationship between a zone and an apparent threshold voltage of a memory cell transistor during a DLA read operation in a semiconductor memory device according to a third example of the tenth embodiment.

Zone separation according to a third example will be described with reference to FIG. 35. FIG. 35 shows a relationship between a zone ZN and an apparent threshold voltage of a memory cell transistor MC(n) in a DLA read operation.

As shown in FIG. 35, in the present example, a memory cell transistor MC(n) whose neighboring memory cell transistor MC(n+1) belongs to the S0 state is included in a zone ZN1. A memory cell transistor MC(n) whose neighboring memory cell transistor MC(n+1) belongs to one of the S1 to S7 states is included in a zone ZN2. A memory cell transistor MC(n) whose neighboring memory cell transistor MC(n+1) belongs to one of the S8 to S13 states is included in a zone ZN3. A memory cell transistor MC(n) whose neighboring memory cell transistor MC(n+1) belongs to the S14 state is included in a zone ZN4. The present example is applicable to the case where, for example, a decrease in threshold voltage of the S14 state and the S15 state is greater than the other states due to data retention, and a DR margin is provided between the S13 state and the S14 state, and between the S14 state and the S15 state.

Read conditions for the zone ZN2 are set in such a manner that the lowest threshold voltage Vt_S1' (reference point) in the zone ZN2 becomes lower than the threshold voltage Vt_S0 in the zone ZN1, and the highest threshold voltage Vt_7' becomes higher than the threshold voltage Vt_S0.

That is, the lower limit value of a read voltage of a memory cell transistor MC(n) whose neighboring memory cell transistor MC(n+1) belongs to the S1 state is lower than a lower limit value of a read voltage of a memory cell transistor MC(n) whose neighboring memory cell transistor MC(n+1) belongs to the S0 state. The lower limit value of a read voltage of a memory cell transistor MC(n) whose neighboring memory cell transistor MC(n+1) belongs to the S7 state is higher than a lower limit value of a read voltage of a memory cell transistor MC(n) whose neighboring memory cell transistor MC(n+1) belongs to the S0 state.

Read conditions for the zone ZN3 are set in such a manner that the lowest threshold voltage Vt_S8' (reference point) in the zone ZN3 becomes lower than the threshold voltage Vt_S0 in the zone ZN1, and the highest threshold voltage Vt_S13' becomes higher than the threshold voltage Vt_S0.

That is, the lower limit value of a read voltage of a memory cell transistor MC(n) whose neighboring memory cell transistor MC(n+1) belongs to the S8 state is lower than a lower limit value of a read voltage of a memory cell transistor MC(n) whose neighboring memory cell transistor MC(n+1) belongs to the S0 state. The lower limit value of a read voltage of a memory cell transistor MC(n) whose neighboring memory cell transistor MC(n+1) belongs to the S13 state is higher than a lower limit value of a read voltage of a memory cell transistor MC(n) whose neighboring memory cell transistor MC(n+1) belongs to the S0 state.

Read conditions for the zone ZN4 are set in such a manner that the threshold voltage Vt_S14' (reference point) in the zone ZN4 becomes higher than the threshold voltage Vt_S1' in the zone ZN2 or the threshold voltage Vt_S8' in the zone ZN3, and that the threshold voltage Vt_S15' becomes lower than the threshold voltage Vt_S7' in the zone ZN2 or the threshold voltage Vt_S13' in the zone ZN3.

That is, the lower limit value of a read voltage of a memory cell transistor MC(n) whose neighboring memory cell transistor MC(n+1) belongs to the S14 state is higher than a lower limit value of a read voltage of a memory cell transistor MC(n) whose neighboring memory cell transistor MC(n+1) belongs to the S1 or S8 state. The lower limit value of a read voltage of a memory cell transistor MC(n) whose neighboring memory cell transistor MC(n+1) belongs to the S15 state is lower than a lower limit value of a read voltage of a memory cell transistor MC(n) whose neighboring memory cell transistor MC(n+1) belongs to the S7 or S13 state

10.4 Effects of Present Embodiment

According to the configuration of the present embodiment, it is possible to obtain effects similar to those of the first to ninth embodiments.

11. Modifications, Etc.

A semiconductor memory device according to above embodiments includes: a first memory cell (MC(n)) and a second memory cell (MC(n+1)) capable of storing data corresponding to one of a plurality of states, and coupled to each other so as to be adjacent to each other; a first word line (WL(n)) coupled to a gate of the first memory cell; a second word line (WL(n+1)) coupled to a gate of the second memory cell; and a bit line (BL) coupled to a drain of the second memory cell. The plurality of states include: a first state (C state); and a second state (D state) adjacent to the first state and corresponding to a higher threshold voltage distribution than that of the first state. In a read operation of the first memory cell, when a state of the second memory cell is the first state or one of the plurality of states corresponding to a lower threshold voltage distribution than that of the first state, data on the first memory cell is read in a first period during which a first voltage (VREAD_Z1) is applied to the second word line, and when the state of the second memory cell is the second state or one of the plurality of states corresponding to a higher threshold voltage distribution than the second state, data on the first memory cell is read in a second period during which a second voltage (VREAD_Z2) higher than the first voltage is applied to the second word line.

By applying the above-described embodiments, it is possible to provide a semiconductor memory device with improved reliability.

The embodiments are not limited to the aspects described above, and various modifications may be made.

The above-described embodiments may be combined wherever possible.

The term "couple" in the above-described embodiments includes, for example, indirect coupling with a transistor, a resistor, etc. interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell and a second memory cell capable of storing data corresponding to one of a plurality of states, and coupled to each other so as to be adjacent to each other;
a first word line coupled to a gate of the first memory cell;
a second word line coupled to a gate of the second memory cell; and
a bit line coupled to a drain of the second memory cell, wherein
the plurality of states include:
a first state; and
a second state adjacent to the first state and corresponding to a higher threshold voltage distribution than that of the first state, and
in a read operation of the first memory cell,
when a state of the second memory cell is the first state or one of the plurality of states corresponding to a lower threshold voltage distribution than that of the first state, data on the first memory cell is read in a first period during which a first voltage is applied to the second word line, and
when the state of the second memory cell is the second state or one of the plurality of states corresponding to a higher threshold voltage distribution than the second state, data on the first memory cell is read in a second period during which a second voltage higher than the first voltage is applied to the second word line.

2. The device according to claim 1, wherein
the plurality of states further include a third state corresponding to a lowest threshold voltage distribution, and
in the read operation of the first memory cell,
a first lower limit value of a read voltage when the state of the second memory cell is the third state is higher than a second lower limit value of the read voltage when the state of the second memory cell is the second state.

3. The device according to claim 1, wherein
the plurality of states further include a fourth state corresponding to a highest threshold voltage distribution, and
in the read operation of the first memory cell,
a third lower limit value of the read voltage when the state of the second memory cell is the first state is higher than a fourth lower limit value of the read voltage when the state of the second memory cell is the fourth state.

4. The device according to claim 1, further comprising:
a third memory cell capable of storing data corresponding to one of the plurality of states, and coupled between the second memory cell and the bit line BL so as to be adjacent to the second memory cell; and
a third word line coupled to a gate of the third memory cell, wherein
in the read operation of the first memory cell,
a third voltage lower than the first voltage is applied to the third word line in the first and second periods.

5. The device according to claim 4, further comprising:
a fourth memory cell capable of storing data corresponding to one of the plurality of states, and coupled to the first memory cell so as to be adjacent to the first memory cell; and
a fourth word line coupled to a gate of the fourth memory cell, wherein
in the read operation of the first memory cell,
the third voltage is applied to the fourth word line in the first and second periods.

6. The device according to claim 4, further comprising:
a fourth memory cell capable of storing data corresponding to one of the plurality of states, and coupled to the first memory cell so as to be adjacent to the first memory cell; and
a fourth word line that is coupled to a gate of the fourth memory cell, wherein
in the read operation of the first memory cell,
the first voltage is applied to the fourth word line in the first period, and
the second voltage is applied to the fourth word line in the second period.

7. The device according to claim 1, wherein
the read operation of the first memory cell includes a first read operation that confirms a state of the second memory cell, and a second read operation that reads data on the first memory cell based on a result of the first read operation.

8. The device according to claim 1, wherein
the first and second memory cells include a charge storage layer.

9. A semiconductor memory device comprising:
a first memory cell and a second memory cell capable of storing data corresponding to one of a plurality of states, and coupled to each other so as to be adjacent to each other;
a first word line coupled to a gate of the first memory cell;
a second word line coupled to a gate of the second memory cell; and
a bit line coupled to a drain of the second memory cell, wherein
the plurality of states include:
 a first state corresponding to a lowest threshold voltage distribution; and
 a second state adjacent to the first state and corresponding to a higher threshold voltage distribution than that of the first state;
 a third state corresponding to a higher threshold voltage distribution than that of the second state;
 a fourth state adjacent to the third state and corresponding to a higher threshold voltage distribution than that of the third state;
 a fifth state corresponding to a higher threshold voltage distribution than that of the fourth state; and
 a sixth state adjacent to the fifth state and corresponding to a highest threshold voltage distribution that is higher than that of the fifth state, and
in a read operation of the first memory cell,
 when a state of the second memory cell is the first state, data on the first memory cell is read in a first period during which a first voltage is applied to the second word line, and
 when the state of the second memory cell is equal to or higher than the second state and equal to or lower than the third state, data on the first memory cell is read in a second period during which a second voltage higher than the first voltage is applied to the second word line, and
 when the state of the second memory cell is equal to or higher than the fourth state and equal to or lower than the fifth state, data on the first memory cell is read in a third period during which a third voltage higher than the second voltage is applied to the second word line, and
 when the state of the second memory cell is the sixth state, data on the first memory cell is read in a fourth period during which a fourth voltage higher than the third voltage is applied to the second word line.

10. The device according to claim 9, wherein
in the read operation of the first memory cell,
 a first lower limit value of a read voltage when the state of the second memory cell is the first state is higher than a second lower limit value of the read voltage when the state of the second memory cell is the second state, and lower than the third lower limit value of the read voltage when the state of the second memory cell is the third state.

11. The device according to claim 9, wherein
in the read operation of the first memory cell,
 a first lower limit value of a read voltage when the state of the second memory cell is the first state is higher than a fourth lower limit value of the read voltage when the state of the second memory cell is the fourth state, and lower than a fifth lower limit value of the read voltage when the state of the second memory cell is the fifth state.

12. The device according to claim 9, further comprising:
a third memory cell capable of storing data corresponding to one of the plurality of states, and coupled between the second memory cell and the bit line BL so as to be adjacent to the second memory cell; and
a third word line coupled to a gate of the third memory cell, wherein
in the read operation of the first memory cell,
 a fifth voltage lower than the first voltage is applied to the third word line in the first to fourth periods.

13. A semiconductor memory device comprising:
a first memory cell and a second memory cell capable of storing data corresponding to one of a plurality of states, and coupled to each other so as to be adjacent to each other;
a first word line coupled to a gate of the first memory cell;
a second word line coupled to a gate of the second memory cell; and
a bit line coupled to a drain of the second memory cell, wherein
the plurality of states include:
 a first state; and
 a second state adjacent to the first state and corresponding to a higher threshold voltage distribution than that of the first state, and
in a read operation of the first memory cell,
 when a state of the second memory cell is the first state or one of the plurality of states corresponding to a lower threshold voltage distribution than that of the first state, a first voltage is applied to the bit line when data on the first memory cell is read, and
 when the state of the second memory cell is the second state or one of the plurality of states corresponding to a higher threshold voltage distribution than that of the second state, a second voltage higher than the first voltage is applied to the bit line when data on the first memory cell is read.

14. The device according to claim 13, wherein
the plurality of states further include a third state corresponding to a lowest threshold voltage distribution, and
in the read operation of the first memory cell,
 a first lower limit value of a read voltage when the state of the second memory cell is the third state is higher than a second lower limit value of the read voltage when the state of the second memory cell is the second state.

15. The device according to claim 13, wherein
the plurality of states further include a fourth state corresponding to a highest threshold voltage distribution, and
in the read operation of the first memory cell,
 a third lower limit value of the read voltage when the state of the second memory cell is the first state is higher than a fourth lower limit value of the read voltage when the state of the second memory cell is the fourth state.

16. The device according to claim 13, further comprising:
a third memory cell capable of storing data corresponding to one of the plurality of states, and coupled between the second memory cell and the bit line BL so as to be adjacent to the second memory cell; and a third word line coupled to a gate of the third memory cell, wherein in the read operation of the first memory cell, a third voltage is applied to the second word line, and a fourth voltage lower than the third voltage is applied to the third word line.

17. A semiconductor memory device comprising:

a first memory cell and a second memory cell capable of storing data corresponding to one of a plurality of states, and coupled to each other so as to be adjacent to each other;

a first word line coupled to a gate of the first memory cell;

a second word line coupled to a gate of the second memory cell; and a bit line coupled to a drain of the second memory cell, wherein the plurality of states include:

a first state corresponding to a lowest threshold voltage distribution;

a second state adjacent to the first state and corresponding to a higher threshold voltage distribution than that of the first state;

a third state corresponding to a higher threshold voltage distribution than that of the second state;

a fourth state adjacent to the third state and corresponding to a higher threshold voltage distribution than that of the third state;

a fifth state corresponding to a higher threshold voltage distribution than that of the fourth state; and a sixth state adjacent to the fifth state and corresponding to a highest threshold voltage distribution that is higher than that of the fifth state, and in a read operation of the first memory cell, when a state of the second memory cell is the first state, a first voltage is applied to the bit line, and when the state of the second memory cell is equal to or higher than the second state and equal to or lower than the third state, a second voltage higher than the first voltage is applied to the bit line, when the state of the second memory cell is equal to or higher than the fourth state and equal to or lower than the fifth state, a third voltage higher than the second voltage is applied to the bit line, and when the state of the second memory cell is the sixth state, a fourth voltage higher than the third voltage is applied to the bit line.

18. The device according to claim 17, wherein in the read operation of the first memory cell, a first lower limit value of a read voltage when the state of the second memory cell is the first state is higher than a second lower limit value of the read voltage when the state of the second memory cell is the second state, and lower than a third lower limit value of the read voltage when the state of the second memory cell is the third state.

19. The device according to claim 17, wherein in the read operation of the first memory cell, a first lower limit value of a read voltage when the state of the second memory cell is the first state is higher than a fourth lower limit value of the read voltage when the state of the second memory cell is the fourth state, and lower than a fifth lower limit value of the read voltage when the state of the second memory cell is the fifth state.

20. The device according to claim 17, further comprising:

a third memory cell capable of storing data corresponding to one of the plurality of states, and coupled between the second memory cell and the bit line BL so as to be adjacent to the second memory cell; and a third word line coupled to a gate of the third memory cell, wherein in the read operation of the first memory cell, a fifth voltage is applied to the second word line, and a sixth voltage lower than the fifth voltage is applied to the third word line.

* * * * *